(12) United States Patent
Hong et al.

(10) Patent No.: US 7,675,062 B2
(45) Date of Patent: *Mar. 9, 2010

(54) THIN FILM TRANSISTOR ARRAY PANEL FOR LIQUID CRYSTAL DISPLAY

(75) Inventors: Mun-Pyo Hong, Seongnam (KR); Wan-Shick Hong, Seoul (KR); Sang-Il Kim, Suwon (KR); Soo-Guy Rho, Suwon (KR); Jin-Kyu Kang, Suwon (KR); Snag-Gab Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 103 days.

This patent is subject to a terminal disclaimer.

(21) Appl. No.: 11/455,367

(22) Filed: Jun. 19, 2006

(65) Prior Publication Data

US 2006/0231846 A1    Oct. 19, 2006

Related U.S. Application Data

(60) Continuation of application No. 10/660,779, filed on Sep. 12, 2003, now Pat. No. 7,220,991, which is a division of application No. 09/676,813, filed on Oct. 2, 2000, now Pat. No. 6,674,495.

(30) Foreign Application Priority Data

Sep. 30, 1999   (KR)  .................................. 99-042108
Dec. 27, 1999   (KR)  .................................. 99-062915
Sep. 4, 2000    (KR)  ..................... 10-2000-0052182
Sep. 4, 2000    (KR)  ..................... 10-2000-0052184

(51) Int. Cl.
   *H01L 29/04*      (2006.01)
   *H01L 31/036*     (2006.01)
   *H01L 31/0376*    (2006.01)
   *H01L 31/20*      (2006.01)

(52) U.S. Cl. ............................. 257/59; 257/89; 349/43; 349/106

(58) Field of Classification Search ................... 257/59, 257/89; 349/43, 106
See application file for complete search history.

(56) References Cited

U.S. PATENT DOCUMENTS 4,807,973 A  *  2/1989  Kawasaki ................... 349/192

(Continued)

FOREIGN PATENT DOCUMENTS

CN          1209883          3/1999

(Continued)

*Primary Examiner*—Howard Weiss
(74) *Attorney, Agent, or Firm*—F. Chau & Associates, LLC.

(57) ABSTRACT

A black matrix having an opening at pixels of a matrix array in a display area, a common wire including common pads and common signal lines, and gate pads in a peripheral area, and an alignment key in outer area to align interlayer thin films are formed on an insulating substrate. Red, blue and green color filters the edge of which overlap the black matrix are formed at the pixels on the insulating substrate, and an organic insulating layer covering the black matrix and the color filters and having a contact hole exposing the gate pad is formed thereon. A gate wire including a gate line connected to the gate pad through the contact hole and a gate electrode connected to the gate line is formed on the organic insulating layer, and a gate insulating layer covering the gate wire is formed on the organic insulating layer. A semiconductor pattern and ohmic contact layers are sequentially formed on the gate insulating layer of the gate electrode. A data wire including a source electrode and a drain electrode that are made of a same layer on the ohmic contact layers and separated from each other, and a data line connected to the source electrode and defining the pixels of a matrix array by crossing the gate line is formed on the gate insulating layer. A passivation layer covering the data wire and having contact holes exposing the gate pad and the data pad is formed, and a pixel wire including a pixel electrode, a redundant gate pad, a redundant data pad that are respectively connected to the drain electrode, the gate pad and the data pad through the contact holes.

8 Claims, 78 Drawing Sheets

U.S. PATENT DOCUMENTS

| | | | |
|---|---|---|---|
| 5,202,572 A | 4/1993 | Kobayashi | |
| 5,354,700 A | 10/1994 | Huang et al. | |
| 5,414,547 A * | 5/1995 | Matsuo et al. | 349/44 |
| 5,731,856 A * | 3/1998 | Kim et al. | 349/43 |
| 5,818,550 A | 10/1998 | Kadota et al. | |
| 5,847,781 A | 12/1998 | Ono et al. | |
| 5,852,488 A | 12/1998 | Takemura | |
| 5,883,682 A | 3/1999 | Kim et al. | |
| 5,923,390 A | 7/1999 | Jung Mok et al. | |
| 5,926,235 A | 7/1999 | Han et al. | |
| 5,926,242 A | 7/1999 | Kataoka et al. | |
| 5,977,563 A | 11/1999 | Kubo et al. | |
| 5,978,058 A | 11/1999 | Sung | |
| 5,986,725 A | 11/1999 | Kim et al. | |
| 5,995,174 A | 11/1999 | Ukita | |
| 6,057,896 A | 5/2000 | Rho et al. | |
| 6,166,785 A | 12/2000 | Ha | |
| 6,466,281 B1 * | 10/2002 | Huang et al. | 349/44 |
| 6,532,050 B1 | 3/2003 | Kim et al. | |
| 6,548,828 B2 | 4/2003 | Nakanishi et al. | |
| 7,190,421 B2 * | 3/2007 | Hong et al. | 349/44 |
| 7,193,668 B2 * | 3/2007 | Kim | 349/106 |
| 2001/0035919 A1 | 11/2001 | Zhang | |

FOREIGN PATENT DOCUMENTS

| | | | |
|---|---|---|---|
| JP | 02-010333 | | 1/1990 |
| JP | 02028624 | | 1/1990 |
| JP | 06-077483 | | 3/1994 |
| JP | 06-273745 | * | 9/1994 |
| JP | 08-006005 | | 12/1996 |
| JP | 10-288796 | | 10/1998 |
| KR | 101996 001873 | | 6/1996 |
| KR | 10-1999-017654 | | 3/1999 |
| KR | 10-1999-0049196 | | 7/1999 |
| KR | 1019990084316 A | | 12/1999 |
| KR | 1020000024850 | | 5/2000 |
| KR | 100264888 | | 6/2000 |

* cited by examiner

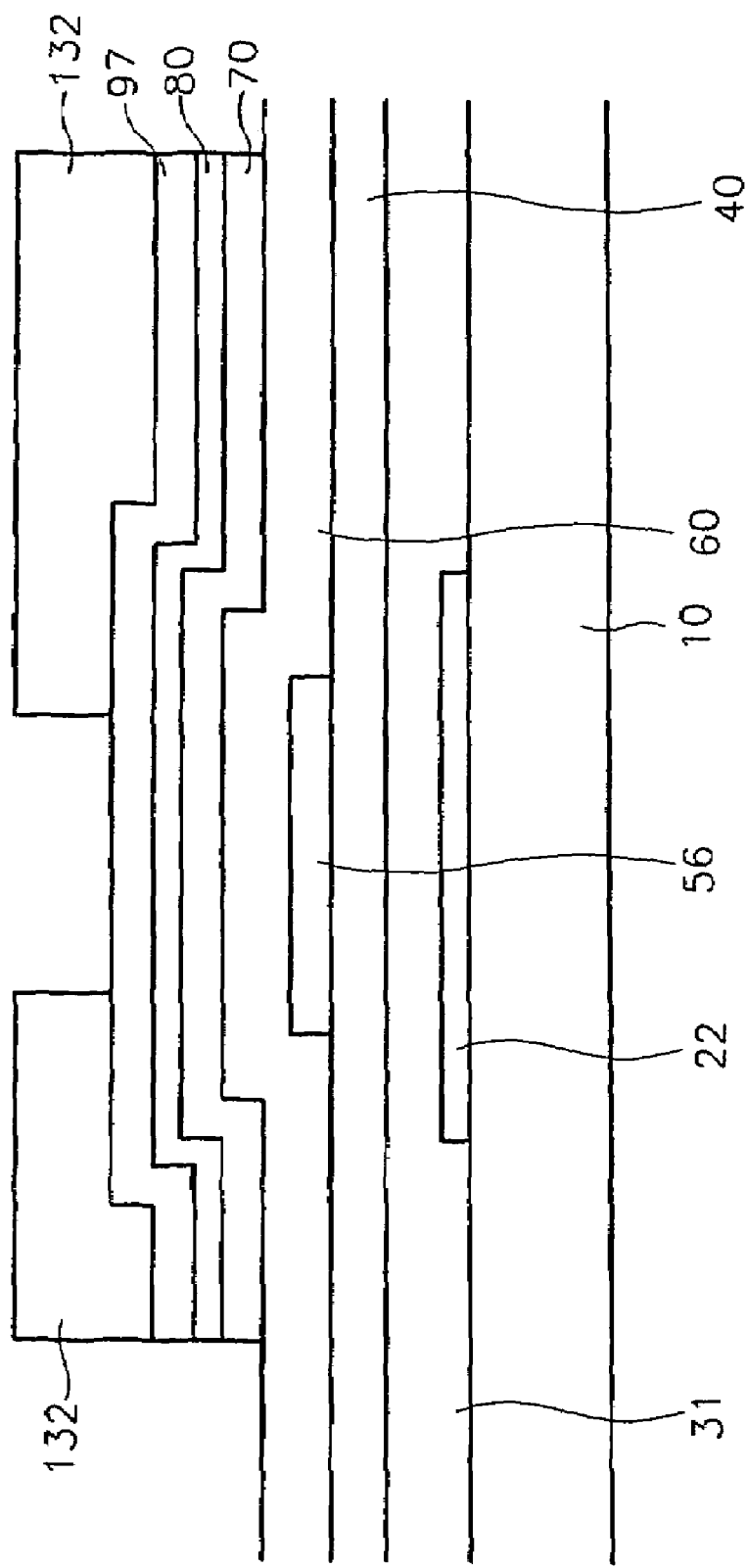

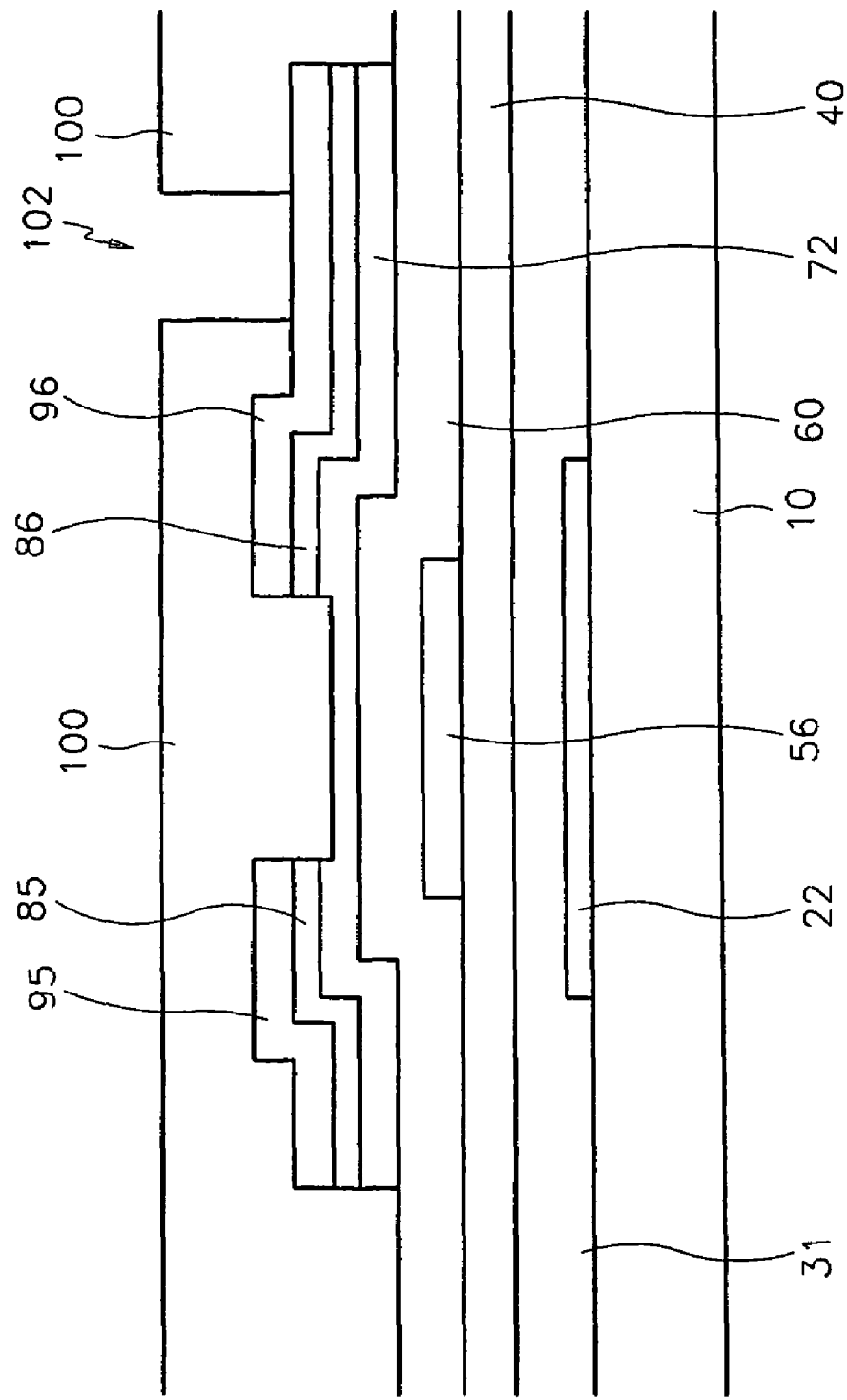

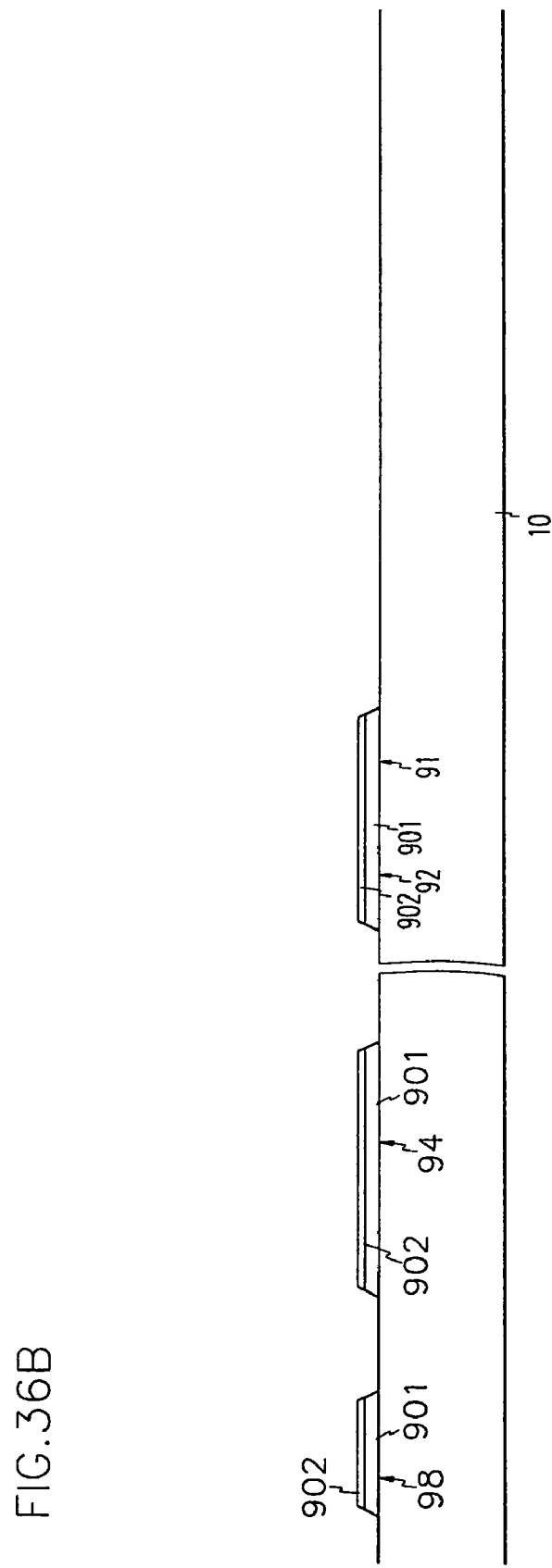

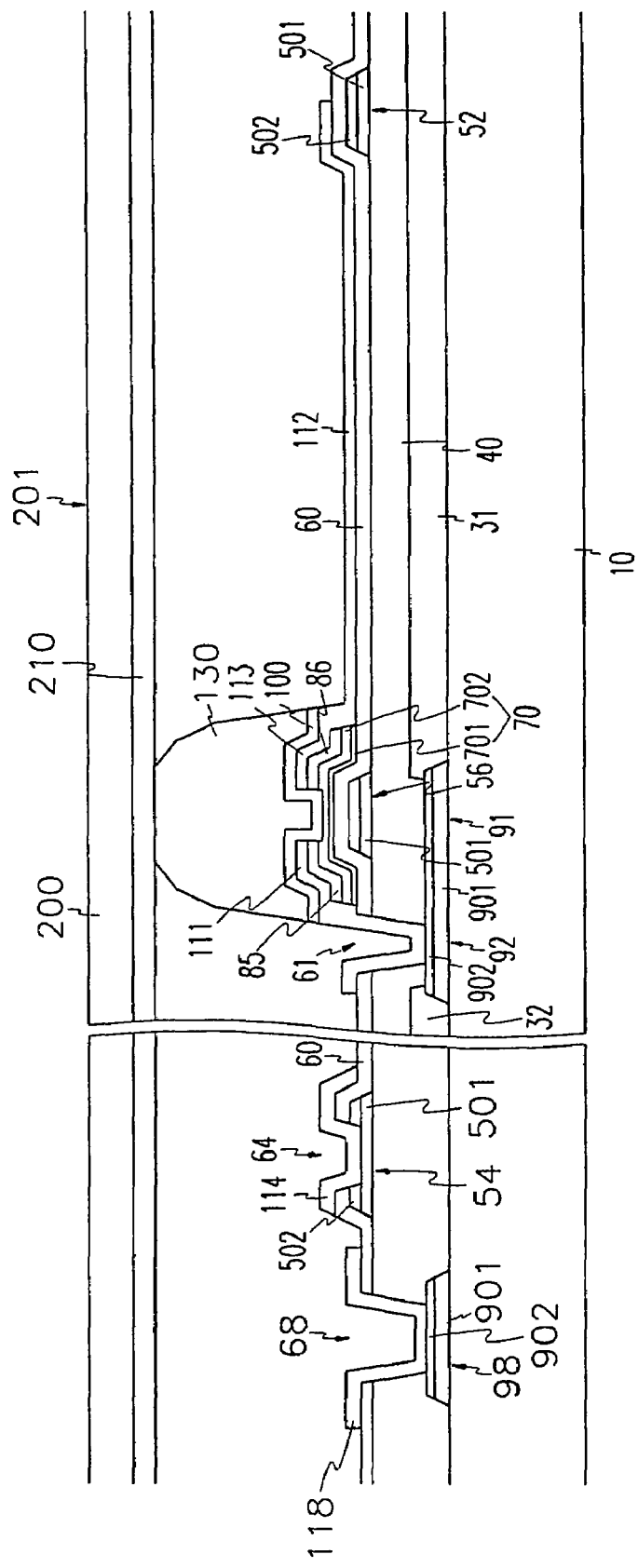

THIN FILM TRANSISTOR ARRAY PANEL FOR LIQUID CRYSTAL DISPLAY

CROSS-REFERENCE TO RELATED APPLICATIONS

This application is a Continuation of U.S. patent application Ser. No. 10/660,779 filed Sep. 12, 2003, now U.S. Pat. No. 7,220,991, which is a Divisional of U.S. patent application Ser. No. 09/676,813 filed on Oct. 2, 2000, now U.S. Pat. No. 6,674,495, which claims priority to Korean Application No. 99-42180 filed on Sep. 30, 1999, Korean Patent Application No. 99-62915 filed on Dec. 27, 1999, Korean Patent Application No. 2000-52182 filed on Sep. 4, 2000, and Korean Patent Application No. 2000-52184, filed on Sep. 4, 2000, the entireties of which are incorporated herein by reference.

BACKGROUND OF THE INVENTION (a) Field of the Invention

The present invention relates to thin film transistor array panels for a liquid crystal display and the methods for manufacturing the same.

(b) Description of the Related Art

A liquid crystal display (LCD) is one of the most popular flat panel displays (FPDs). The liquid crystal display has two panels having electrodes for generating electric fields and a liquid crystal layer interposed therebetween.

The transmittance of incident light is controlled by realigning the liquid crystal molecules of the LCD, as the intensity of the electric field applied to the liquid crystal layer changes.

In the most widely used liquid crystal display, the field-generating electrodes are provided at both panels, with one of the panels having switching elements such as thin film transistors and pixel electrodes, and the other panel having color filters and black matrix.

In general, a thin film transistor array panel is manufactured by a photolithography process using photoresist pattern as an etch mask. However, the misalignment of interlayes in fabricating a multi-layered structure negatively affects display characteristics of the LCD. To solve this problem, it is desirable that an alignment key of an opaque material is formed of the same layer as the lowest layer of the thin film patterns.

On the other hand, it is important to increase an aperture ratio of the thin film transistor panels of LCD to improve a brightness of LCD. However, the LCD has several obstacles in reducing the aperture ratio of the thin film transistor. Firstly, a certain distance between the pixel electrode and the data line must be maintained in order to avoid the parasitic capacitance generated therebetween by coupling effects. Secondly, a black matrix must be wide enough to cover a possible misalignment of the two panels. To solve these problems, several methods have been suggested. One suggests an insulating layer interposed between the pixel electrode and the data line and made of organic material having a low dielectric constant. The other suggests color filters formed on the same panel having thin film transistors.

However, the latter case is economically unsound. Because the color filters are formed after more expensive processes of forming thin film transistor, the failure in the color filter formation process wastes a lot of resources and increases the manufacturing costs. On the other hand, the former method cannot generate enough storage capacitance between the gate line and the pixel electrode.

SUMMARY OF THE INVENTION

It is therefore an object of the present invention to provide a thin film transistor array panel for a liquid crystal display and methods for manufacturing the same, minimizing misalignment problems between two panels of an LCD and increasing its aperture.

It is another object of the present invention to provide a thin film transistor array panel for a liquid crystal display and methods for manufacturing the same with yield improvements.

It is another object of the present invention to simplify manufacturing methods of a thin film transistor array panel for a liquid crystal display.

It is therefore an object of the present invention to provide a thin film transistor array panel for a liquid crystal display and methods for manufacturing the same minimizing parasitic capacitance and having enough storage capacitance.

These and other objects are provided, according to the present invention, by forming a thin film transistor after forming color filters, forming black matrix having an opening portion at pixel under the color filters, and forming an alignment key for inter-layer alignment when forming the color filters and the black matrix.

Here pads, which transmit a signal from an external circuit to a signal wire, or a common wire to apply a common voltage are formed when forming the black matrix.

These and other objects are provided, according to the present invention, by using a data line as the light-block layer blocking the light incident to the thin film transistor by forming the data line under the color filters, and together forming a semiconductor pattern and contact hole by using a photoresist pattern having different thickness depending on the positions of an etch mask to simplify manufacturing methods of thin film transistor array panels for liquid crystal displays.

In a thin film transistor array panel for a liquid crystal display according to the present invention, a black matrix having an opening at pixels of matrix array is formed on the display area of an insulating substrate including a display area, a peripheral area at the circumference of the display area, and outer area except for the display area, and the peripheral area. Red, blue and green color filters are formed at the pixels on the insulating substrate, and an insulating layer covering the black matrix and the color filters is formed. A gate wire including a gate line and a gate electrode connected to the gate line is formed on the insulating layer, and a gate insulating layer covering the gate wire is formed on the insulating layer. A semiconductor pattern and ohmic contact layers are sequentially formed on the gate insulating layer, and a data wire including a source electrode and a drain electrode which are made of a same layer on the ohmic contact layers and separated from each other, and a data line connected to the source electrode and defining the pixels with matrix array by crossing the gate line. A passivation layer covering the data wire and having a first contact hole exposing the drain electrode is formed, and a pixel wire including a pixel electrode connected to the drain electrode through the first contact hole.

An alignment key may be formed with the same layer as the black matrix or the color filters of the outer area.

A common wire including common signal line transmitting common signal to common electrode opposing the pixel electrode and common pads transmitting the common signal to the common signal line from external circuits and connected to the common signal line may be formed with the same layer as the black matrix.

The gate wire further includes a gate pad, which is connected to and receives a signal from an external circuit, and the data wire further includes a data pad, which is connected to and receives a signal from an external circuit. The gate pad or the data pad may be formed with the same layer as the black matrix, the gate wire, or the data wire on the peripheral area.

It is desirable that the edge portions of the red, green and blue color filters overlap the portion of the black matrix, and the insulating layer is made of organic insulator material.

In another thin film transistor array panel for a liquid crystal display comprising, according to the present invention, a data wire including a data line is formed on an insulating substrate, and red, blue and green color filters are formed at the pixels on the insulating substrate. A gate wire including a gate line defining the pixel by crossing the data line and a gate electrode connected to the gate line is formed on the insulating layer covering the data wire and the color filters. A semiconductor pattern and ohmic contact layers sequentially formed on a gate insulating layer covering the gate wire and having a first contact hole exposing the data line along with the insulating layer, and a pixel wire including a source electrode connected to the data line through the first contact hole and a drain electrode, which are made of a same layer on the semiconductor pattern and separated from each other, and a pixel electrode connected to the drain electrode is formed on the gate insulating layer of pixels.

The edges of the red, green and blue color filters overlap the edges of the data line, and the insulating layer may be made of organic insulating material having low dielectric consent less than 3.0 and being able to be coated with the thickness of more than 1. The ohmic contact layers may be formed of doped microcrystallized amorphous silicon, silicide of metal or doped microcrystallized amorphous silicon.

The data wire may have a light blocking layer to block the light leakage between pixels. A passivation layer covering at least the semiconductor pattern between the source electrode and the drain electrode may be formed, and a colored organic layer may be formed on the passivation layer. It is desirable that the colored organic layer is made of photosensitive organic insulating material including black resin, and used as a spacer between two panels.

In a method for manufacturing a thin film transistor array panel for a liquid crystal display, a data wire including a data line is formed on an insulating substrate, and red, blue and green color filters are formed at the pixels. Next, a gate wire including a gate line and a gate electrode is formed on an insulating layer covering the data wire and the color filters, and a gate insulating layer covering the gate wire is formed on the insulating layer. Semiconductor pattern ohmic contact layers are formed on and at the same time patterning the insulating layer and the gate insulating layer to form a first contact hole exposing the data line. Then, a pixel wire including a source electrode and a drain electrode on the ohmic contact layers, which are made of a same layer as the semiconductor pattern and separated from each other, and a pixel electrode connected to the drain electrode is formed on the pixels.

It is desirable that the first contact hole, the ohmic contact layer and the semiconductor layer are patterned through photolithography process using one mask.

It is desirable that the black matrix, the gate wire, or the data wire have single-layered structure be made of aluminum, aluminum alloy, copper or copper alloy, or multi-layered structure including a conductive material of chromium, molybdenum molybdenum alloy, chromium nitride or molybdenum nitride.

Also, a redundant gate pad and a redundant data pad respectively connected to the gate pad and data pad may be formed with the same layer as the pixel electrode.

BRIEF DESCRIPTION OF THE DRAWINGS

The accompanying drawings, which are incorporated in and constitute a part of the specification, illustrate an embodiment of the invention, and, together with the description, serve to explain the principle of the invention.

FIGS. 19A, 20A and 21A, and 19B, 20B and 21B are cross-sectional views respectively taken along lines XVIIIB-XVIIIB' and XVIIIC-XVIIIC' of FIG. 18A, and in a manufacturing step following FIGS. 18B to 18C.

FIGS. 22B and 22C are cross-sectional views respectively taken along lines XXIIB-XXIIB' and XXIIC-XXIIC' of FIG. 22A.

FIG. 36B is a cross-sectional view taken along the line XXXVIB-XXXVIB' of FIG. 36A.

FIG. 47 is cross-sectional view taken along the line XXXXVII-XXXXVII' of FIG. 46.

DETAILED DESCRIPTION OF THE PREFERRED EMBODIMENTS

Figure 1:
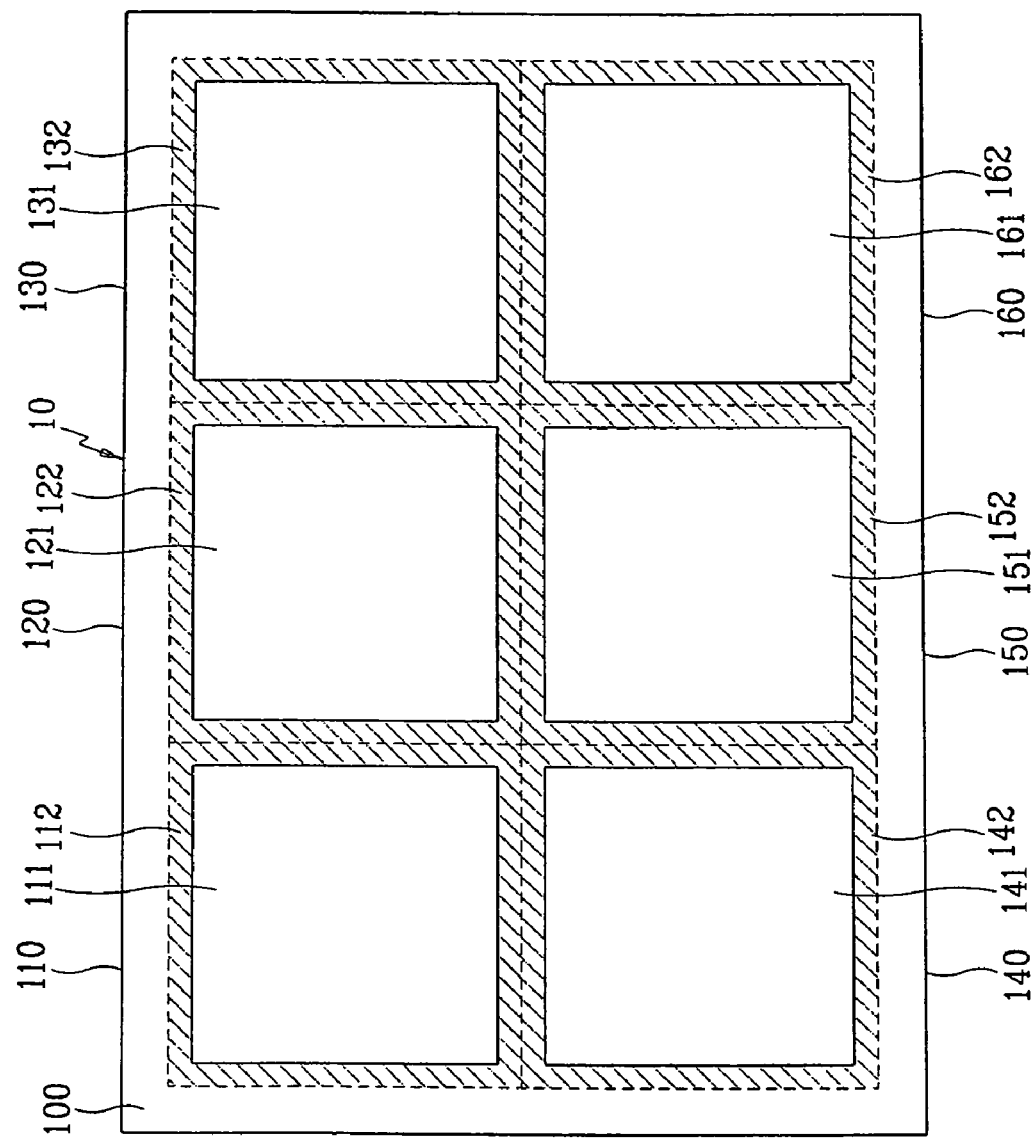
FIG. 1 is a plan view of a substrate partitioned to manufacture a TFT array panel for an LCD according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. In the drawings, the thickness of layers and regions are exaggerated for clarity. Like numerals refer to like elements throughout. It will be understood that when an element such as a layer, region, or substrate is referred to as being "on" another element, it can be directly on the other element or intervening elements may also be present. In contrast, when an element is referred to as being "directly on" another element, there are no intervening elements present.

Firstly, the method for manufacturing a thin film transistor panel according to the present invention, forms color filters before thin film transistors. A black matrix having an opening portion at pixel under the color filters is formed. Also, an alignment key is formed for inter-layer alignment when forming the color filters, or the black matrix.

Now, a structure of a TFT array panel according to an embodiment of the present invention will be described with reference to the FIGS. 1 to 4.

As shown in FIG. 1, a pluralities of panel areas are formed on an insulating plate 1. For example, as shown in FIG. 1, six panel areas 110, 120, 130, 140, 150 and 160 are formed on a glass plate 10. When the panels are TFT array panels, the panel areas 110, 120, 130, 140, 150 and 160 include display areas 111, 121, 131, 141, 151 and 161 having a plurality of pixels and peripheral areas 112, 122, 132, 142, 152 and 162 respectively. TFTs, wires and pixel electrodes are repeatedly arranged in matrix in the display areas 111, 121, 131 141, 151 and 161. Pads that are to be connected to external circuits, and common wires including a common pad, which transmit common signals applied to common electrode opposing to the pixel electrodes from external circuit, and a common signal line for minimizing common signal delay, are provided in the peripheral areas 112, 122, 132, 142, 152 and 162.

By the way, a thin film transistor array panel for an LCD is manufactured through several photolithography processes using an etch mask to form thin film patterns having a multi-layered structure. At this time, it is desirable that thin film patterns having a multi-layered structure be correctly aligned. To align thin film patterns correctly, it is desirable that an alignment key made of an opaque material is formed in the outer area 100 of the plate 10.

Figure 2:
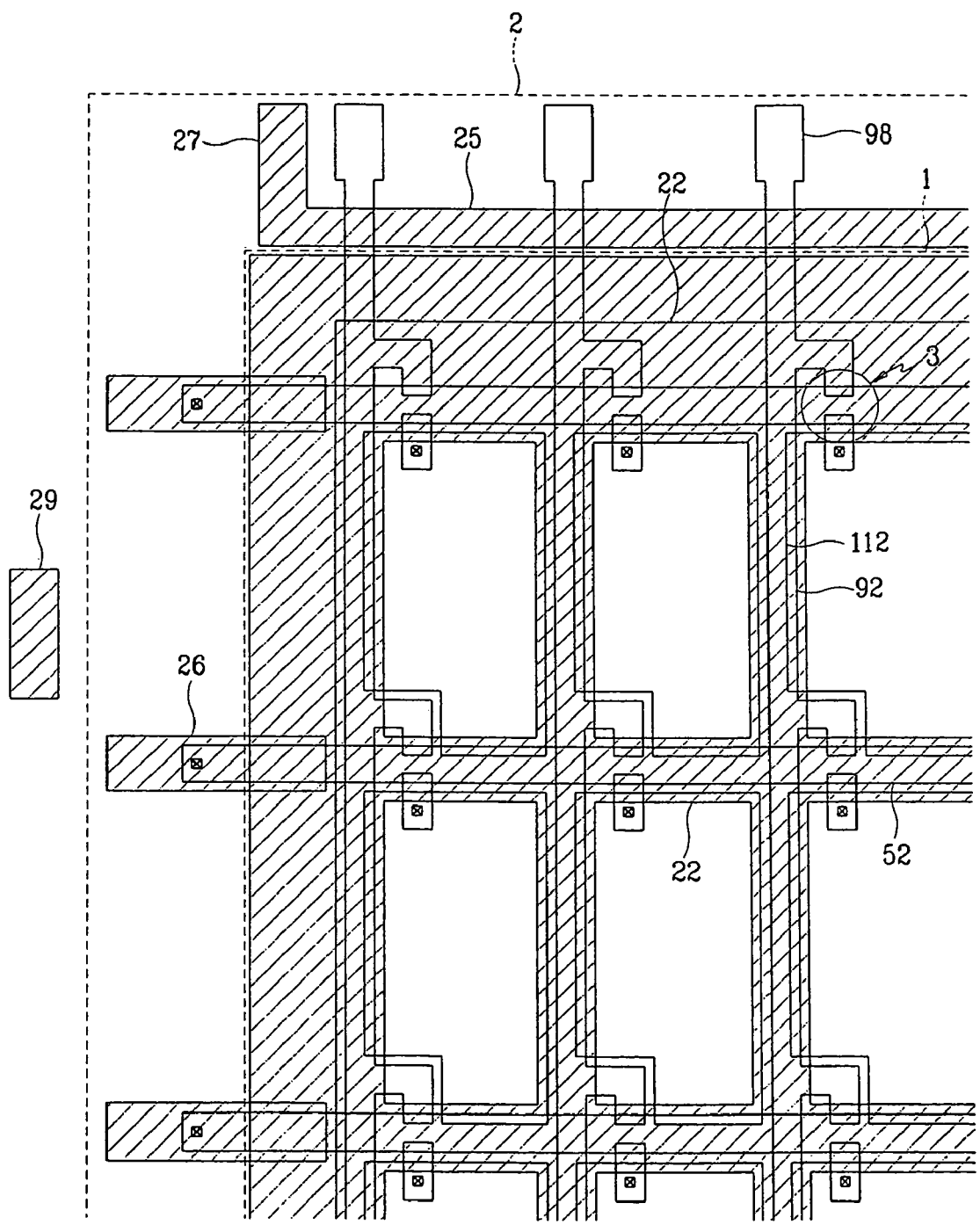
FIG. 2 is a layout view of a TFT array panel for an LCD according to an embodiment of the present invention, including wires and elements.

FIG. 2 is a layout view of a TFT array panel area shown in FIG. 1 according to an embodiment of the present invention.

As shown in FIG. 2, a plurality of TFTs 3, a plurality of pixel electrodes 82 electrically connected thereto, a plurality of wires including gate lines 52 and data lines 92, and a black matrix 22 having opening on the portion corresponding to a plurality of pixels defined by the gate lines 52 and the data lines 92 are formed in the display area surrounded by an imaginary line 1. At this time, it is desirable that the edge of the black matrix 22 is wide enough by an imaginary line 1 to block the light leakage at the edge of the display area, as shown in FIG. 2. Gate pads 26 and data pads 98 respectively connected to the gate lines 52 and the data lines 92, and are formed in the peripheral area. Also, a common signal line 25 is formed on the upper circumference outside the display area, and a common pad 27 which is connected to the common signal line 25 and transmits common signal to the common signal line 25 from external circuits is formed in the peripheral area. On the other hand, an alignment key 29 is formed in the outer area outside the peripheral area that is surrounded by an imaginary line 2.

Here, it is preferable that the alignment keys 29 are located at four corners of the outer area 100, and the common signal line 25 is formed at the edge circumference of the peripheral areas 112, 122, 132, 142, 152 and 162 except for one side, where the gate pad 26 is formed to surround the display areas 111, 121, 131, 141, 151 and 161.

Figure 3:
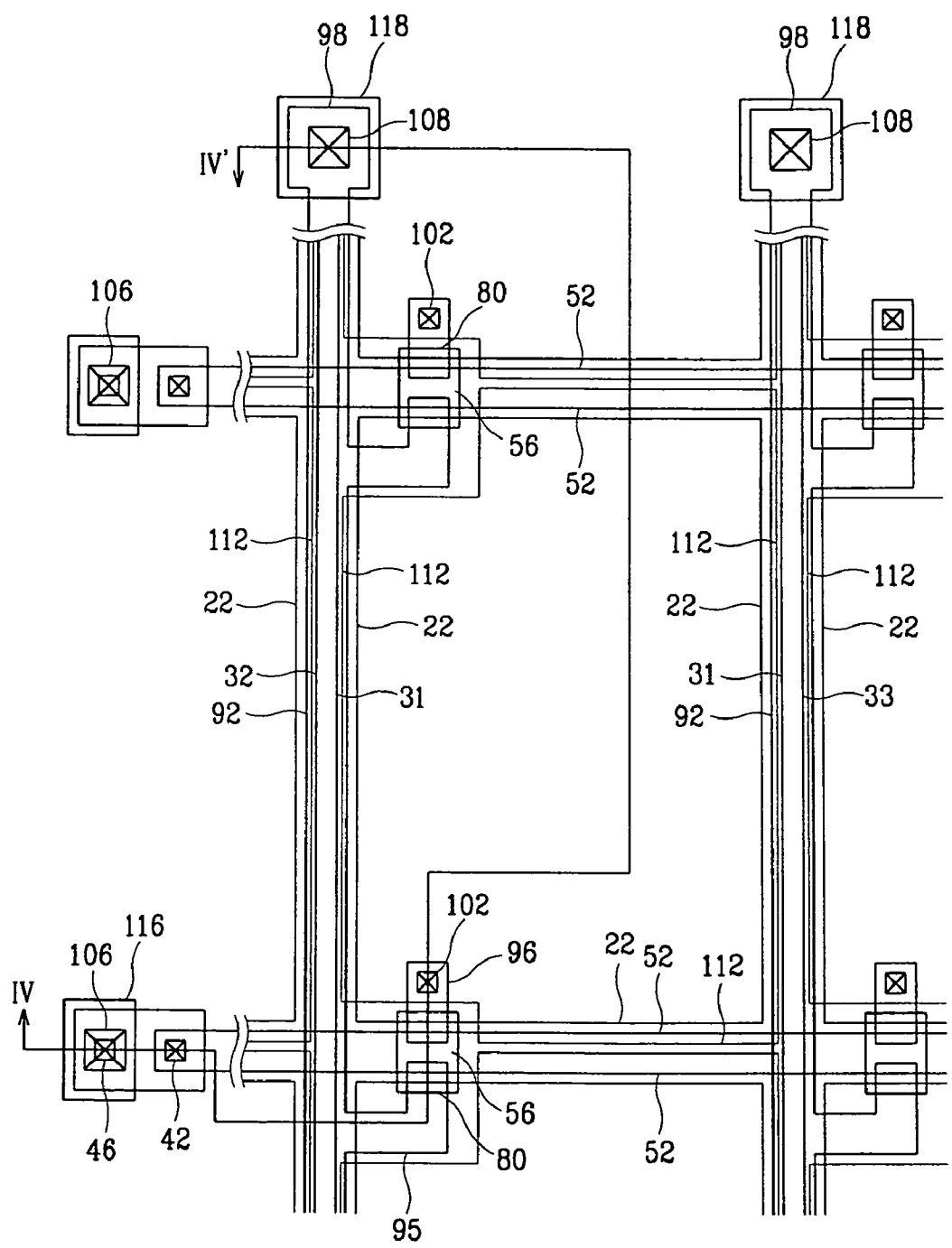
FIG. 3 is a layout view of a TFT array panel for an LCD according to the first embodiment of the present invention, and an enlarged view of a portion mainly including a pixel and pads of FIG. 2.
Figure 4:
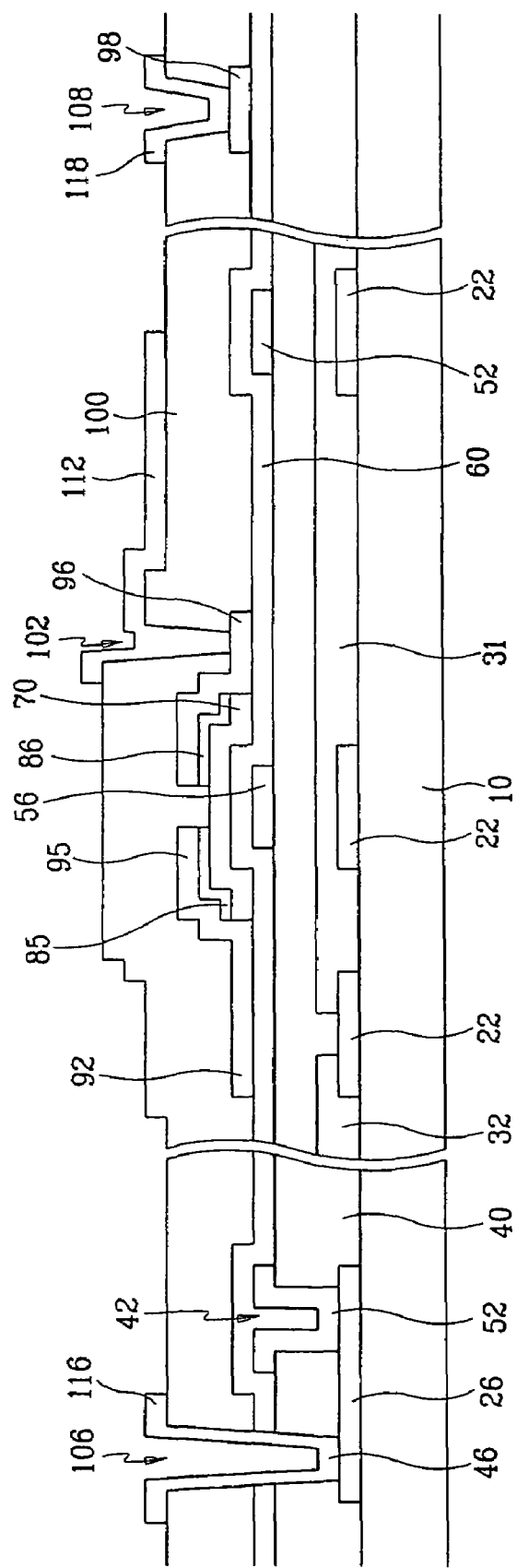
FIG. 4 is a cross-sectional view taken along the line IV-IV' of FIG. 3.

FIGS. 3 and 4 are an enlarged view of a TFT array panel shown in FIG. 2 according to an embodiment of the present invention. FIG. 3 is a layout view, and FIG. 4 is a cross-sectional view taken along the lines IV-IV' in FIG. 3.

A black matrix 22 having a single-layered structure or a multi-layered structure of conductive material such as aluminum-based material, copper-based material, molybdenum-based material, chromium nitride or molybdenum nitride is formed on a lower insulating substrate 10. The black matrix 22 has net-shaped openings at the portion corresponding to pixels with a matrix array, and blocks light leakage between the neighboring pixels. The black matrix 22 may have variation structure to block the light incident into a semiconductor layer 70 of thin film transistor, which will be formed. Also, a common signal line 25 is formed of the same layer as the black matrix 22, and a common pad 27 that is connected to the common signal line 25 and transmits a common signal to the common signal line 25 from external circuits is formed, referring to FIG. 2. In addition, an alignment key 29 (referring to FIG. 2) and a gate pad 26 are formed with the same layer as the black matrix 22. The alignment key 29 aligns the inter-layers during the manufacturing process. The gate pad 26 transmits scanning signals from external circuits to a gate wire of 52 and 54, which will be formed later. Of course, a data pad transmitting image signal to a data line 92 from external circuits may be formed with the same layer as the black matrix 22, but is not shown in this embodiment.

Here, because the common wire of 25 and 27 is formed in the circumference of the peripheral area, it blocks the light leakage at the circumference outside the display area 111, 121, 131, 141, 151 and 161, and it is desirable that it is made of conductive material such as aluminum-based material, copper-based material and silver-based material to prevent common signal delays. Also, the common wire 25 and 27 may include conductive material having good contact properties with indium tin oxide or indium zinc oxide of a pixel wire 112, 116, 118, which will be formed later.

Color filters 31, 32 and 33 of red, green and blue, the edges of which overlap the black matrix 22, are formed in the pixels on the lower insulating substrate 10. Here, the color filters 31, 32 and 33 may overlap each other on the black matrix 22. It is desirable that color filters 31, 32 and 33 are made of material that can go through the process without losing its color channel in the range of manufacturing a thin film transistor at the temperature over 350.degree. C.

An organic insulating layer 40 is then formed to cover the black matrix 22, the common wire of 25 and 27, the gate pad 26, and color filters 31, 32 and 33. The organic insulating layer 40 is made of material having a good heat-resistivity in the range of over 300.degree. C. and low dielectric constant below 3.0, such as bisbenzocyclobutene (BCB) and perfluorocyclobutene (PFCB). The organic insulating layer 40 has contact holes 42 and 46.

A gate wire of metal or conductive material such as aluminum (Al) and aluminum alloy, molybdenum (Mo) or molybdenum-tungsten (MoW) alloy, chromium (Cr), tantalum (Ta), and copper or copper alloy is formed on the organic insulating layer 40. The gate wire includes a plurality of gate lines (scanning signal lines) 52 extending in the horizontal direction and connected to the gate pad 26 through contact hole 42, and a plurality of gate electrodes 56 of TFTs that are portions of the gate lines 52. The gate lines 52 provide storage capacitance along with a pixel electrode 112 that will be described later. A storage wire may be provided if the storage capacitance between the pixel electrode 112 and the gate line 52 is not enough.

The gate wire 52, and 56 may have a single-layered structure having a low resistivity such as aluminum-based material, copper-based material or silver-based material as well as a multiple-layered structure. Here, because the gate pad 26 transmitting signal from external circuit is formed of a layer different from the gate wire 52 and 56, the gate wire 52, and 56 may have a single-layered structure without considering a good contactability with other materials.

A gate insulating layer pattern 60 of silicon-nitride (SiNx) is formed on the organic insulating layer 40 and covers the gate wire 52 and 56.

A semiconductor layer 70 made of semiconductor such as hydrogenated amorphous silicon is formed in an island shape on the gate insulating layer 60 of the gate electrode 56.

An ohmic contact layer 85 and 86, which are divided with respect to the gate electrode 56, are formed on the semiconductor layer 70. The ohmic contact layer 85 and 86 may have doped microcrystallized amorphous silicon, silicide of metal or doped microcrystallized amorphous silicon.

A data wire of conductive material having a low resistivity such as aluminum-based material, copper-based material and silver-based material is formed on the ohmic contact layers 85 and 86, and the gate insulating layer 60. The data wire has a plurality of data lines 92 extending in a vertical direction, a plurality of data pads 98 that are connected to one end of the data lines 92 and transmit image signals from an external circuit to the data lines 9, and a plurality of source electrodes 95 of TFTs, which are connected to the data lines 92 on the portion 85 of the ohmic contact layer. The data wire also has a plurality of drain electrodes 96 formed on the portion 86 of the ohmic contact layer.

The data wire parts 92, 95, 96, and 98 may have a single-layered structure made of conductive material having a low resistivity such as the gate wire 52 and 56, as well as a multiple-layered structure. When the data wire has a multiple-layered structure, it is preferable that one layer is made of a material having a low resistivity and another is made of a material having good contacting properties with other materials. In case of forming the data pad 98 of same layer as the gate pad 26, the data wire of 92, 95, 96 and 98 may have a single-layered structure without considering contracting properties with other materials.

A passivation layer 100 of an insulating material such as SiNx and organic insulator of acrylic-based material is formed on the data wire parts 92, 95, 96, and 98 and the semiconductor layer 70 that is not covered by the data wire parts 62, 65, 66, and 68.

The passivation layer 100 has contact holes 102 and 108 respectively exposing the drain electrode 96 and the data pad 98, and also has (along with the gate insulating layer 60) another contact hole 106 exposing the gate pad 26.

A pixel electrode 112, which receives an image signal and generates an electric field with a common electrode of an upper panel, is formed on the passivation layer 100 of the pixel. The pixel electrode 112 is connected to the drain electrode 96 both physically and electrically through the contact hole 102, and receives the image signal from the drain electrode 96. Even though the aperture ratio is increased when the pixel electrode 112 overlaps the gate lines 52 or the adjacent the data lines 92, these lines 52 and 92 are not required to overlap the pixel electrode 112. A redundant gate pad 116 and a redundant data pad 118, respectively connected to the gate pad 26 and to the data pad 98 through the contact holes 106 and 108, are formed on the passivation layer 100. Here, the pixel electrode 112, and the gate pad 116 and the data pad 118 are made of transparent conductive material such as indium tin oxide (ITO) and indium zinc oxide (IZO). These redundant pads 116 and 118 are optional as they protect the pads 26 and 98 and supplement the adhesiveness between an external circuit and the pads 26 and 98.

In this embodiment, transparent material is taken as an example of ITO or IZO, but an opaque-conductive material may be used in a reflective type LCD.

In the thin film transistor for an LCD according to the present invention, because the gate insulating layer 60 and the passivation layer 100 having low dielectric constant are between the data line 92 and the pixel electrode 112, the coupling capacitance may be minimized therebetween. Accordingly, the characteristics of the liquid crystal display is improved, as well as aperture ratio is increased, because it is not necessary to grant the interval between the data line 92 and the pixel electrode 112.

A manufacturing method of a thin film transistor array panel according to a first embodiment of the present invention will now be described with reference to the FIGS. 5A to 11B and FIGS. 1 to 4.

Figure 5A:
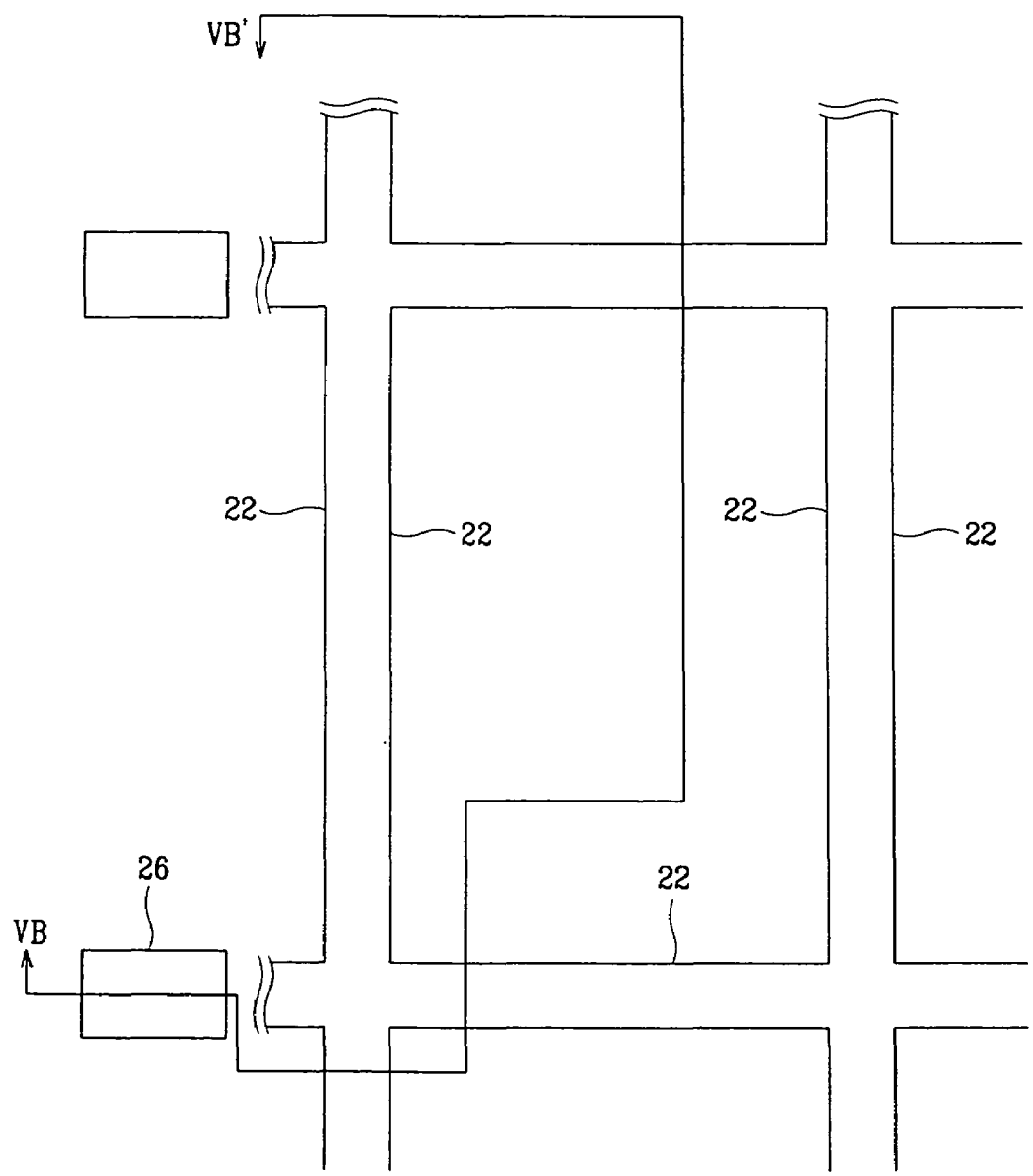
FIG. 5A is a layout view of a TFT array panel in the first manufacturing step according to one example of the present invention.
Figure 5B:
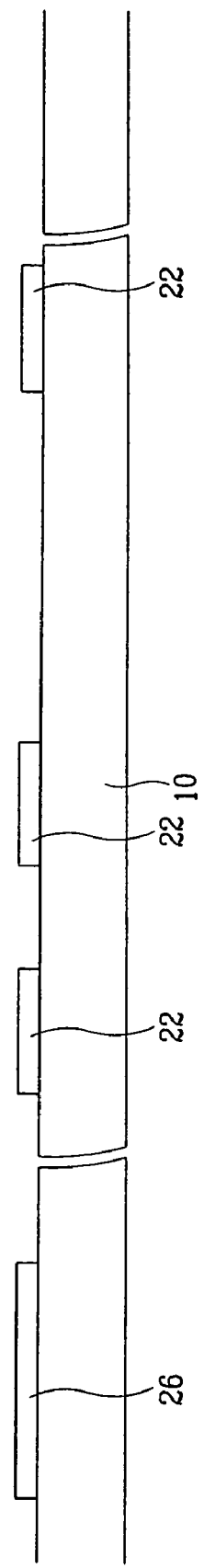
FIG. 5B is a cross-sectional view taken along the line VB-VB' of FIG. 5A.
Figure 5C:
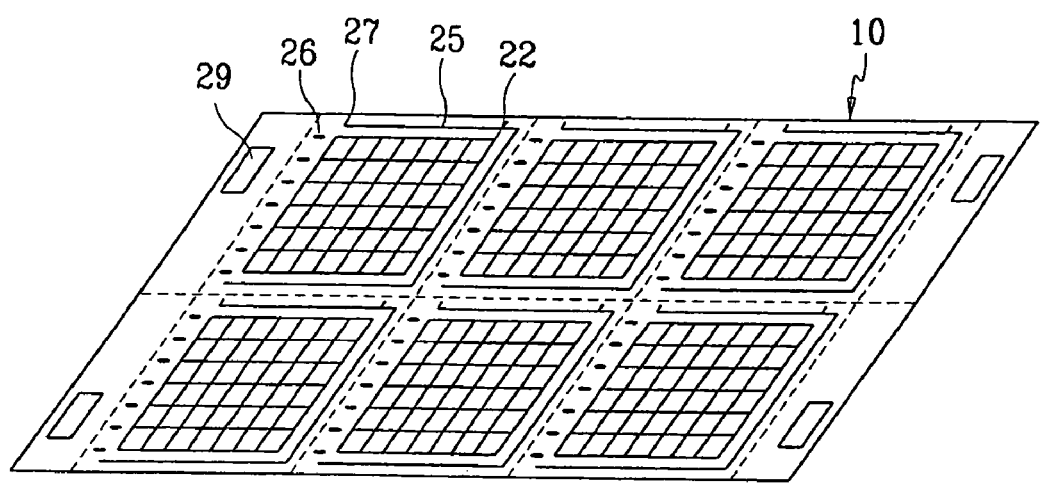
FIG. 5C is a plan view of a substrate partitioned to manufacture a TFT array panel according to the example, and showing display areas and peripheral areas.

At first, as shown in FIGS. 5A and 5B, a conductive layer is deposited and patterned by dry or wet etching through a photolithography process to form a black matrix 22 on a transparent insulating substrate 10.

Here, a common wire including a common signal line 25 and a common pad 27, and a gate pad 26 may formed at the edge circumference of the peripheral areas 112, 122, 132, 142, 152 and 162 (referring to FIG. 1) of the substrate 10, and an alignment key 29 is formed at the outer area 100 (referring to FIG. 1).

If the alignment key 29 is formed when forming the black matrix 22, a plurality of thin films including a gate wire 52, 56 and a data wire 92, 95 and 96, which will be formed later, may be correctly aligned.

Here, the conductive material may include a material having a low resistivity such as aluminum-based material, copper-based material, and silver-based material, another material having good contact properties such as chromium, molybdenum and titanium, or another material having a low reflective ratio such as chromium nitride and molybdenum nitride.

Of course, a data pad may be also formed at this time, and many kinds of alignment keys to align color filters, which will be formed later and cut away from the substrate 10 after completing the thin film transistor array panel, and to align a sealing material enclosing liquid crystal material injected between two panels of the liquid crystal display.

Next, red, green and blue resins having photosensitive properties are sequentially deposited and patterned by a photolithography process using a mask to form red, green and blue color filters 31, 32 and 33. At this time, it is desirable that the resins have heat-resistance properties, so that the color characteristics are maintained in the range of over 350.degree. C. To form color filters 31, 32 and 33, three masks are usually used, but one mask may be used by shifting the mask for each color filter to reduce manufacturing costs. Also, a laser transcription, screen-printing, or offset printing may be used without using a mask to reduce manufacturing costs. At this time, as shown in drawings, it is desirable that the edges of color filters 31, 32 and 33 overlap the black matrix 22.

Figure 6A:
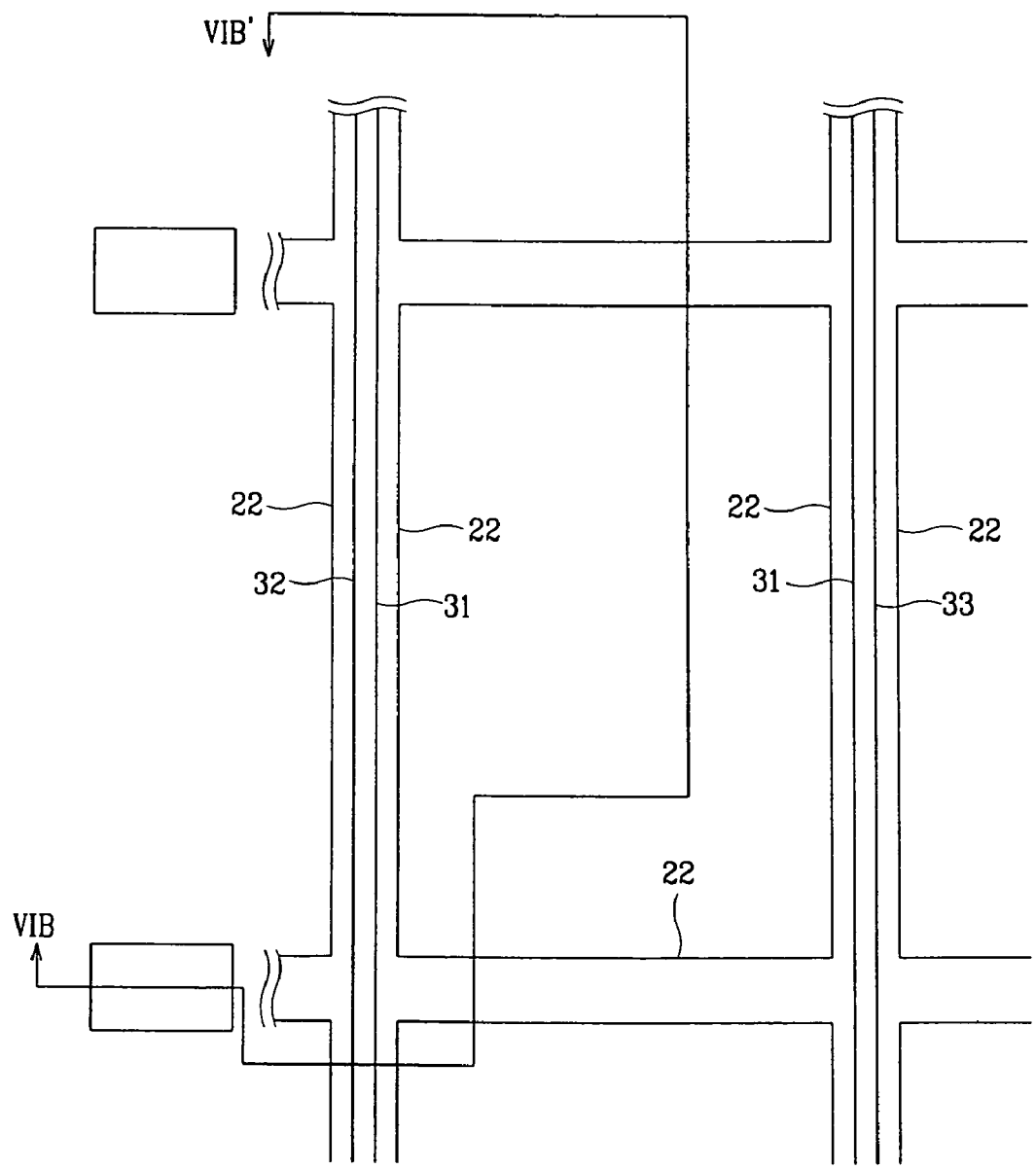
FIG. 6A is a layout view of a TFT array panel in a manufacturing step following FIG. 5A.
Figure 6B:
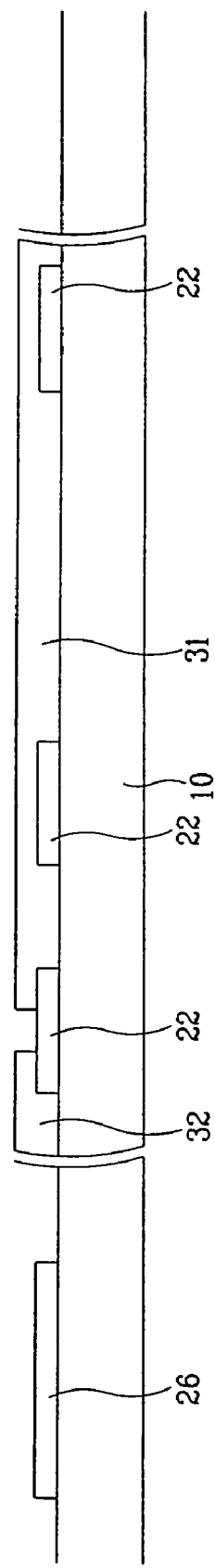
FIG. 6B is a cross-sectional view taken along the line VIB-VIB' of FIG. 6A.
Figure 6C:
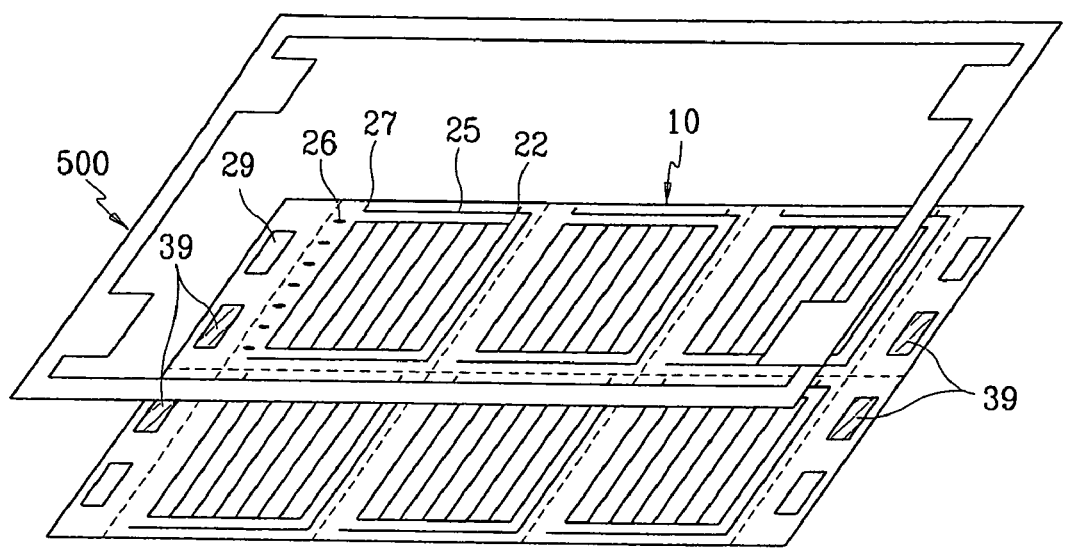
FIG. 6C is a plan view of a substrate partitioned to manufacture a TFT array panel according to the example, showing display areas and peripheral areas, and following FIG. 5C.

At this time, as shown in FIG. 6C, a shadow mask 500 is used to prevent the photosensitive material from covering the alignment key 29 when forming the color filters 31, 32 and 33.

On the other hand, if the alignment key 29 is not formed when forming the black matrix 22, a plurality of alignment keys 39 made of photosensitive material for color filters may be formed, as shown in FIG. 6C.

Figure 7A:
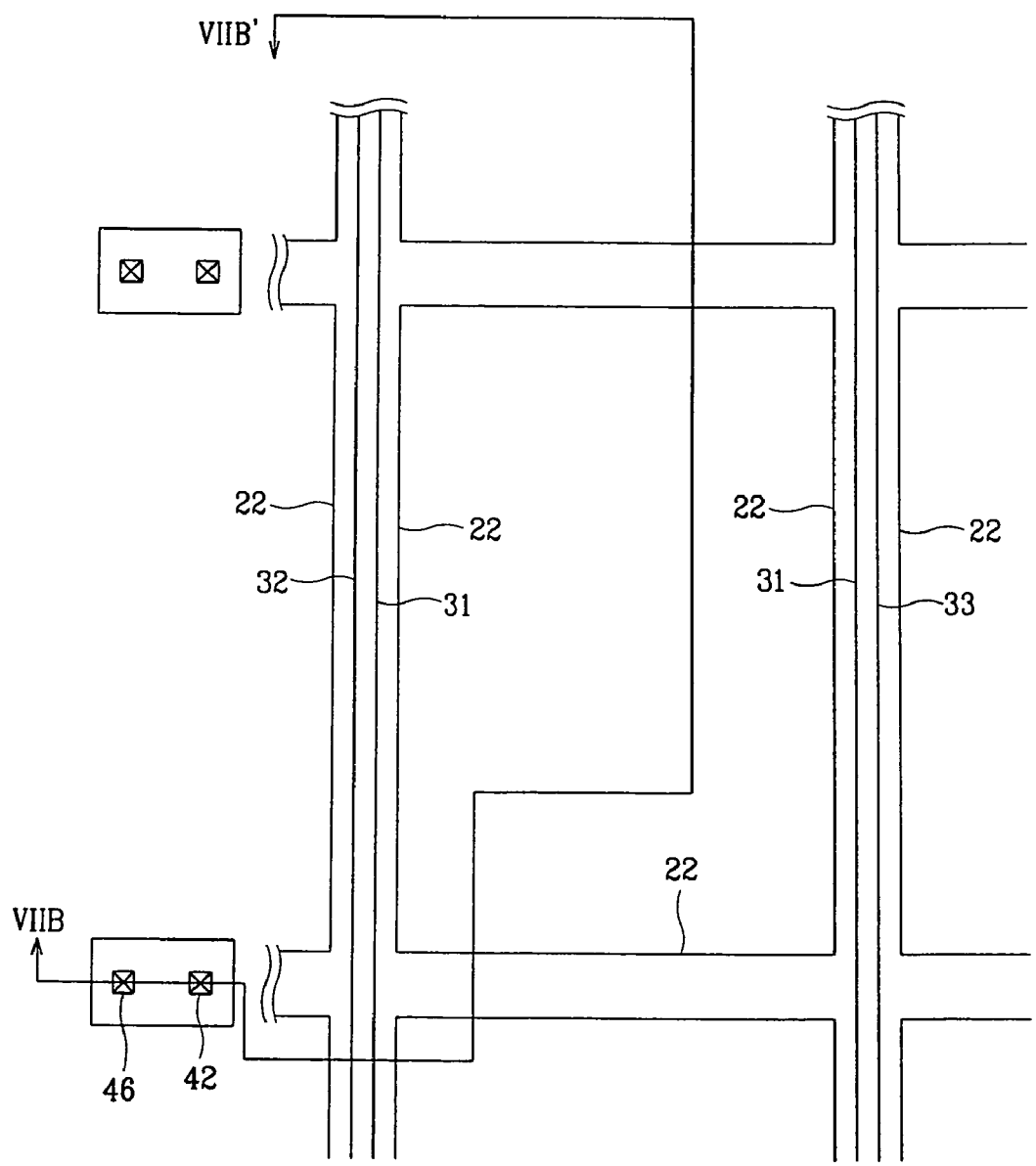
FIG. 7A is a layout view of a TFT array panel in a manufacturing step following FIG. 6A.
Figure 7B:
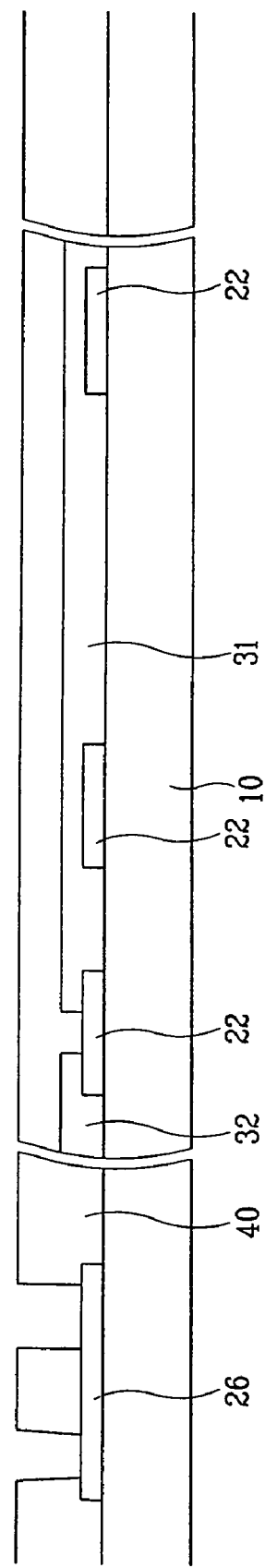
FIG. 7B is a cross-sectional view taken along the line VIIB-VIIB' of FIG. 7A.

Next, as shown in FIGS. 7A and 7B, an organic insulating layer 40 made of an organic material having heat-resistivity over 350.degree. C. and good plananization properties such as bisbenzocyclobutene (BCB) and perfluorocyclobutene (PFCB) is deposited on the substrate 10 and patterned to form contact holes 42 and 46 exposing the gate pad 26 by dry etching through photolithography process. At this time, contact holes exposing the common wire of 25 and 27 may be formed, they may be formed through only a photolithography process without a dry etching step if the organic insulating layer 40 is made of photosensitive material. Of course, if the gate pad and the common wire of 25 and 27 are not formed under the organic insulating layer 40, it is not necessary that the organic insulating layer 40 be patterned, and when the data pad is formed on the same layer as black matrix 22, a contact hole exposing the data pad needs to be formed.

Figure 8A:
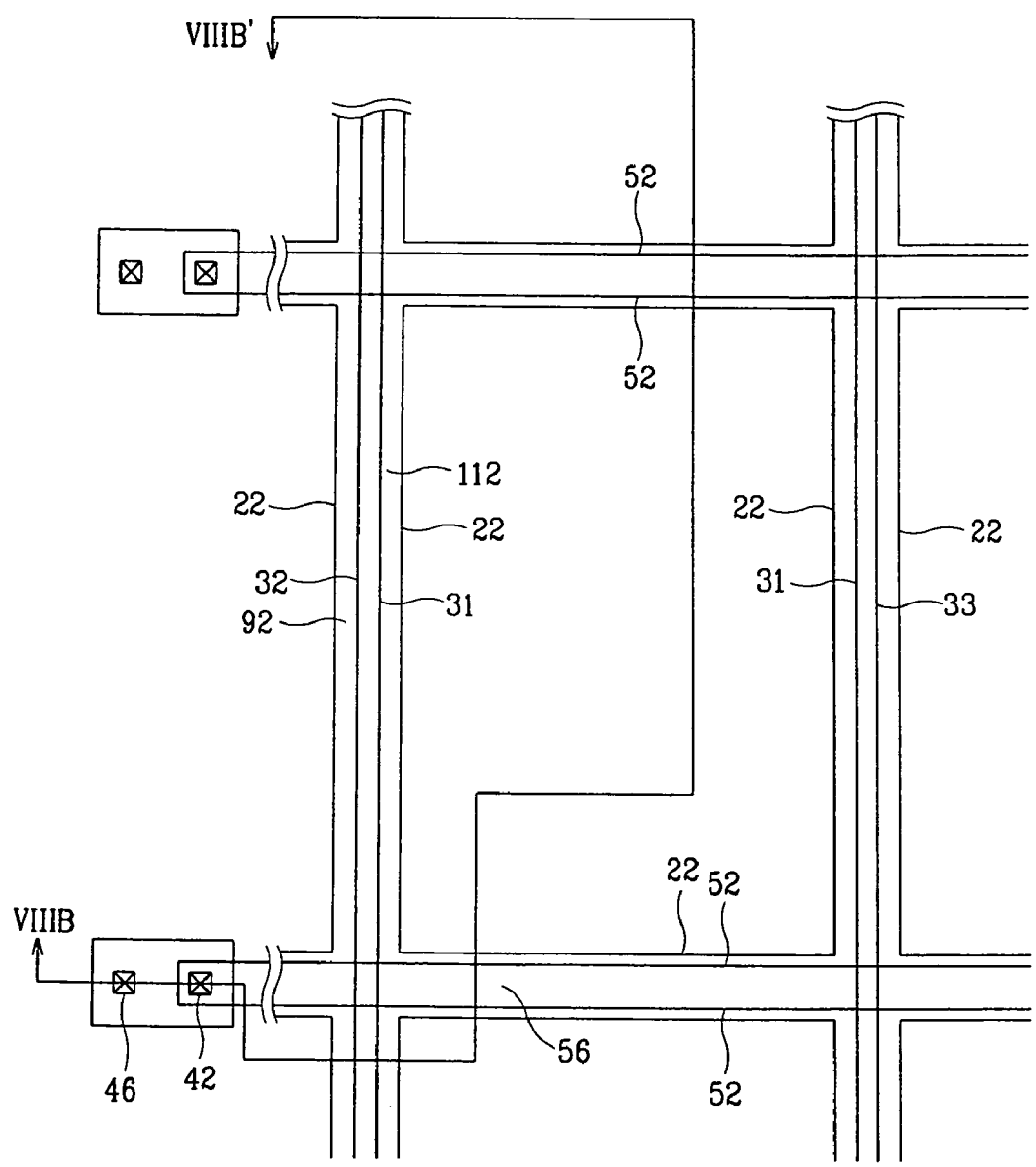
FIG. 8A is a layout view of a TFT array panel in a manufacturing step following FIG. 7A.
Figure 8B:
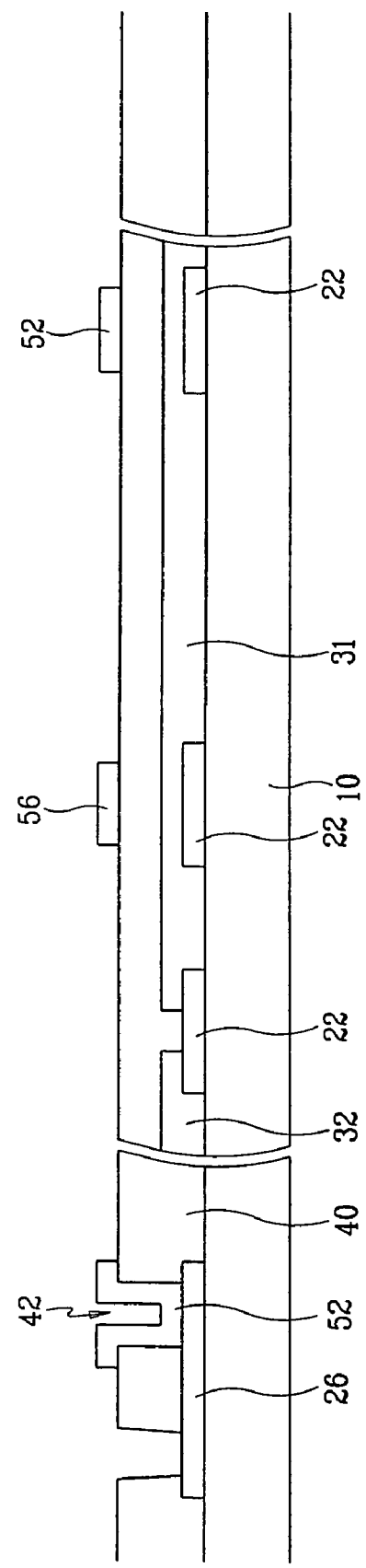
FIG. 8B is a cross-sectional view taken along the line VIIIB-VIIIB' of FIG. 8A.

Next, as shown in FIGS. 8A and 8B, a layer of conductive material having a low resistivity such as aluminum or aluminum alloy, copper or copper alloy, and silver-based material is deposited on a substrate 10 by such methods as sputtering, and patterned to form a gate wire including a gate line 52 connected to the gate pad 26 through contact hole 42, and a gate electrode 56 by wet or dry etching through a photolithography process. At this time, the conductive material for the gate wire 52 and 56 must not be deposited on the portion where the alignment key 29 or 39 are formed to use the alignment key 29 or 39 for correctly aligning a mask used in photolithography process, when forming the gate wire of 52 and 56. To achieve this object, the shadow mask 500 as shown in FIG. 6C is used to hide the alignment key 29 or 39 before depositing the conductive material for the gate wire of 52 and 56. Then, the mask for forming the gate wire 52 and 56 may be correctly aligned by using the alignment key 29 or 39. At this time, as shown FIGS. 8A and 8B, it is desirable that the gate wire 52 and 56 is located in the horizontal portion of the black matrix 22.

On the other hand, if the shadow mask 500 is not used, the conductive material for the gate wire is deposited and patterned to expose the alignment key 29 or 39 in the outer area 100 (referring to FIG. 1), and then the gate wire 52 and 56 may be formed by patterning the conductive material for the gate wire by aligning the mask through the alignment key 29 or 39. Also, the organic insulating layer 40 is patterned to expose the alignment key 29 or 39 in the outer area 100 (referring to FIG. 1), and then the step due to the alignment key 29 or 39 are formed after depositing the conductive material for the gate wire. Next, the position data of the steps may be obtained through laser, and the gate wire 52 and 56 may be formed by aligning the mask through the position data of the steps. Also, the conductive material for the gate wire is deposited, then the position data is obtained by irradiating laser under the substrate 10, and the gate wire 52 and 56 may be formed by aligning the mask according to the position data of the alignment key 29 or 39.

Here, as above described, though a pixel wire 112, 116 and 118 is made of indium tin oxide, because the gate pad 26 is formed of the layer different from the gate wire of 52 and 56, the gate wire of 52 and 56 may have a single-layered structure made of conductive material having a low resistivity such as aluminum and aluminum alloy. Accordingly, the manufacturing process may be more simplified than when the gate wire of 52 and 56 has multi-layered structure, because diverse etching conditions do not have to be considered. Of course, when forming a gate pad with of same layer as the gate wire of 52 and 56, it is desirable that the gate wire of 52 and 56 has a double-layered structure including one conductive layer having a low resistivity and the other conductive layer having good contact characteristics.

Figure 9A:
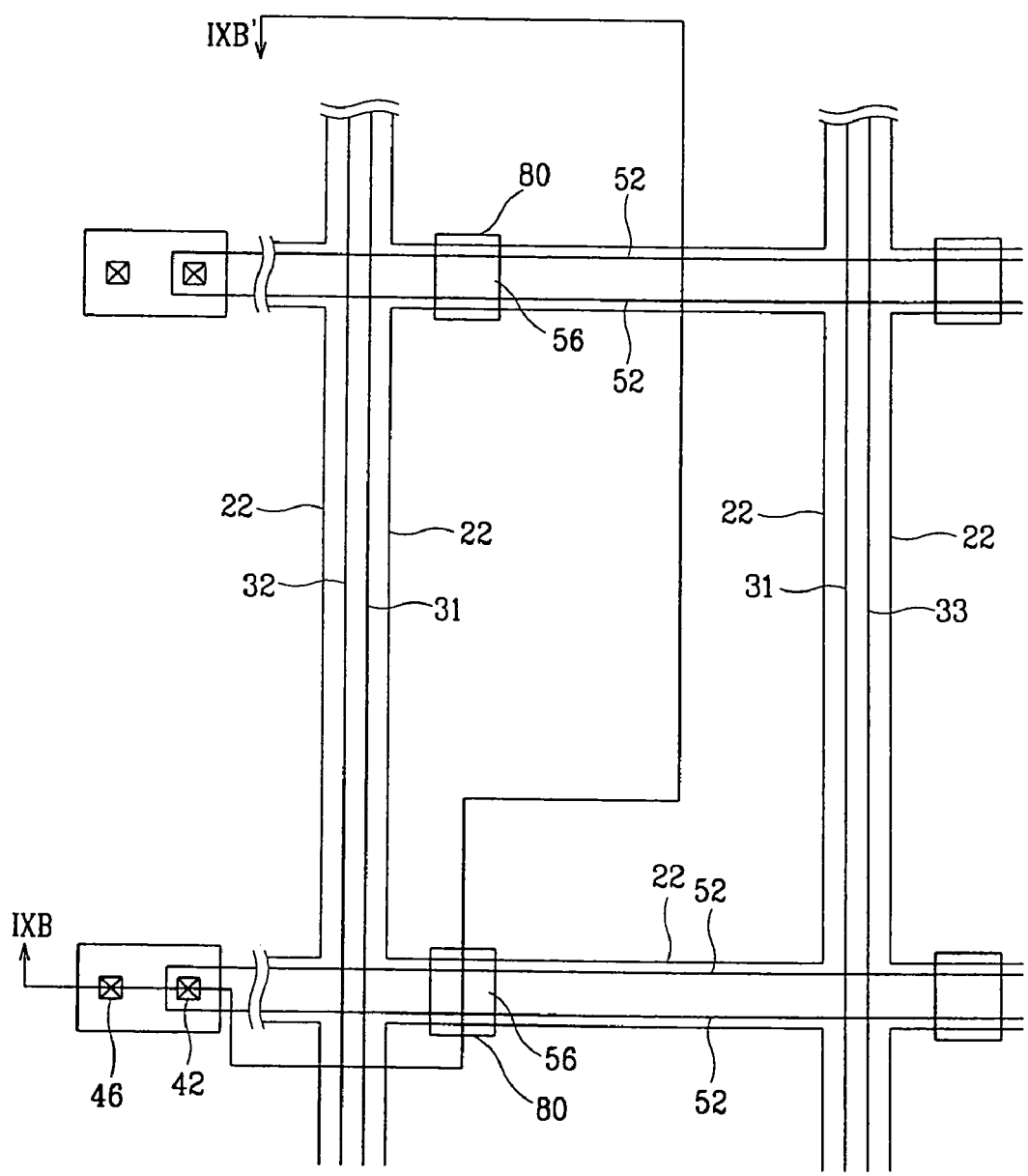
FIG. 9A is a layout view of a TFT array panel in a manufacturing step following FIG. 8A.
Figure 9B:
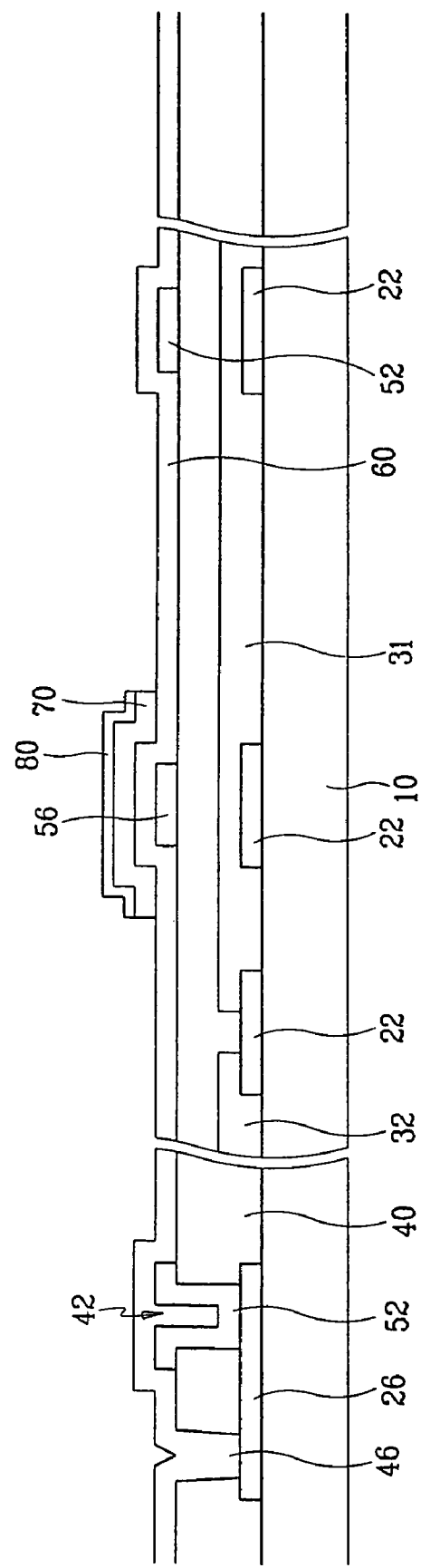
FIG. 9B is a cross-sectional view taken along the line IXB-IXB' of FIG. 9A.

Next, as shown in FIGS. 9A and 9B, a gate insulating layer 60, a amorphous silicon semiconductor layer 70, and a doped amorphous silicon ohmic contact layer 80 are sequentially layered. Then, the semiconductor layer 70 and ohmic contact layer 80, which are both island shaped, are formed on top of the gate electrode 56 and the opposing gate insulating layer 60 using a mask patterning process.

Figure 10A:
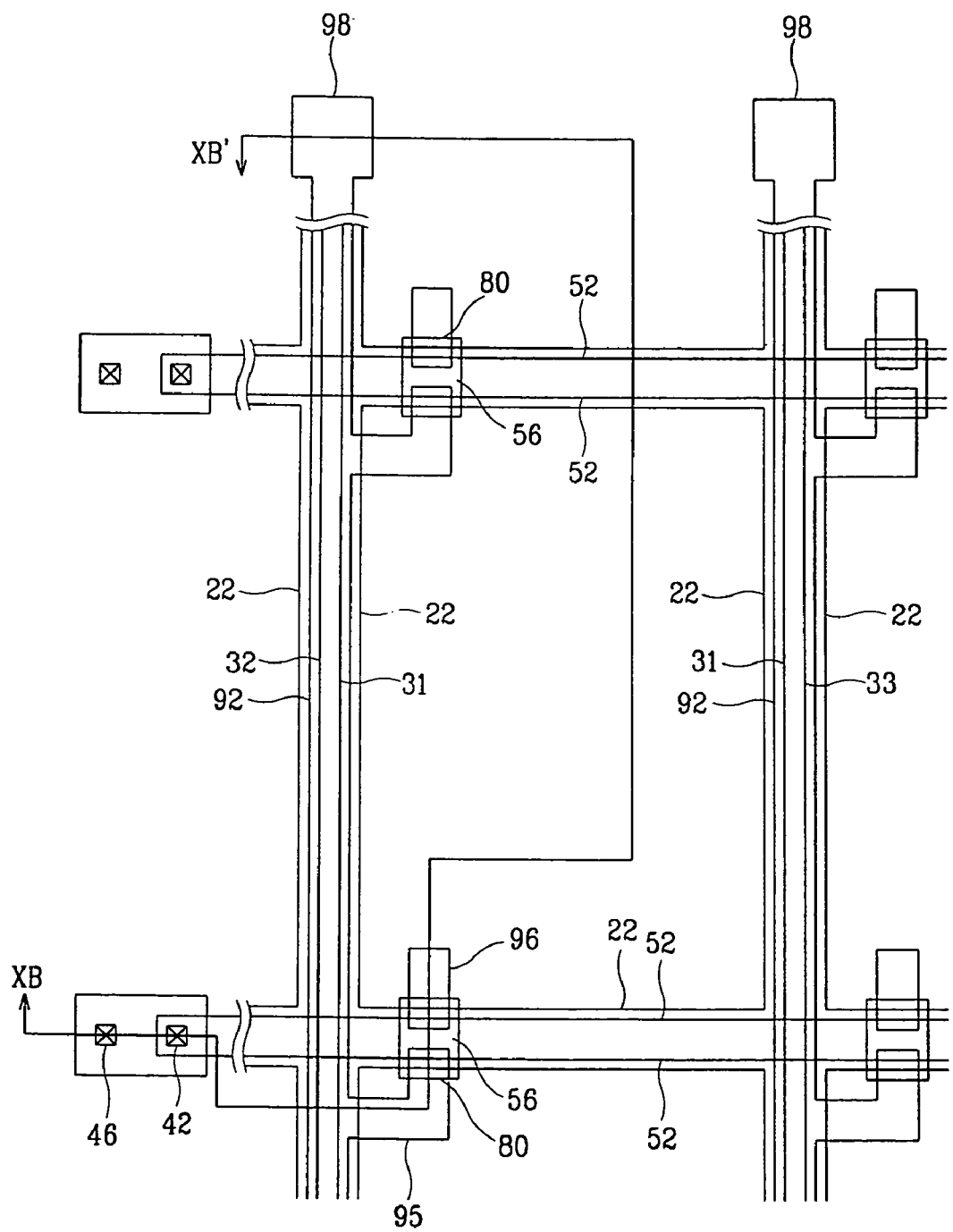
FIG. 10A is a layout view of a TFT array panel in a manufacturing step following the FIG. 9A.
Figure 10B:
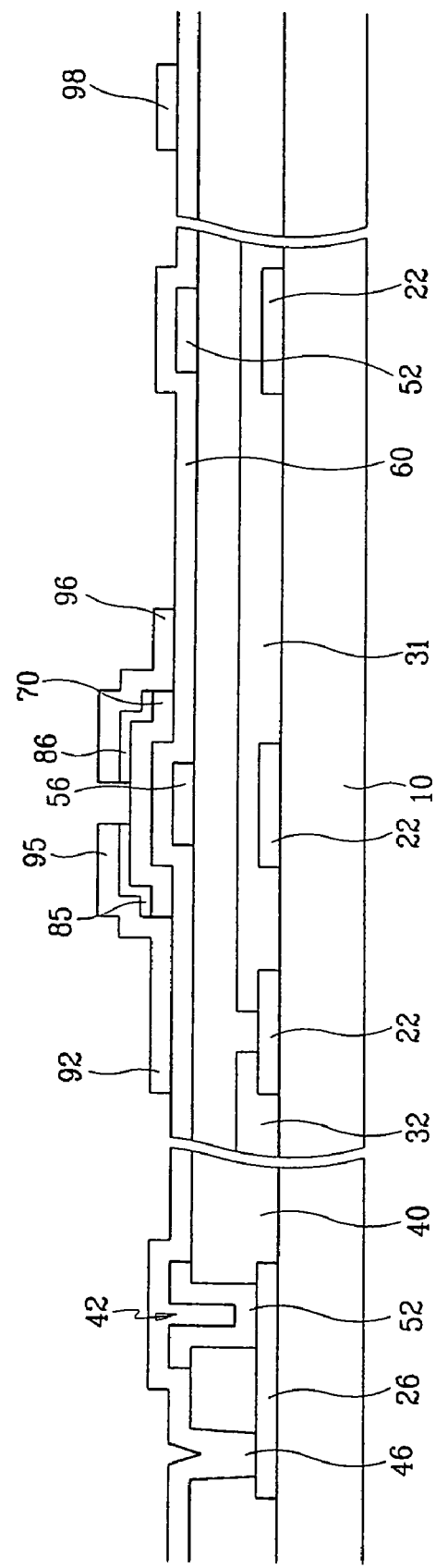
FIG. 10B is a cross-sectional view taken along the line XB-XB' of FIG. 10A.

Then, as shown in FIGS. 10A and 10B, a conductor layer such as chromium, molybdenum, molybdenum alloy, titanium or tantalum is deposited by such methods as sputtering and patterned through a photolithography process using a mask to form a data wire including a data line 92 intersecting the gate line 52, a source electrode 95 connected to the data line 92 and extended over the gate electrode 56, a drain electrode 96 separated from the source electrode 95 and opposite the source electrode 95 with respect to the gate electrode 56, and a data pad 98 connected to the end of the data line 92.

Then, the ohmic contact layer 80 is etched by using the data wires 92, 95, 96, and 98 as a mask and a plasma dry etch to divide the ohmic contact layer 80 with the center of the gate electrode 56, and to expose the central portion of the amorphous silicon layer 70 between the ohmic contact layers 85 and 86. Oxygen plasma may be used to stabilize the surface of the amorphous silicon layer 70.

Figure 11A:
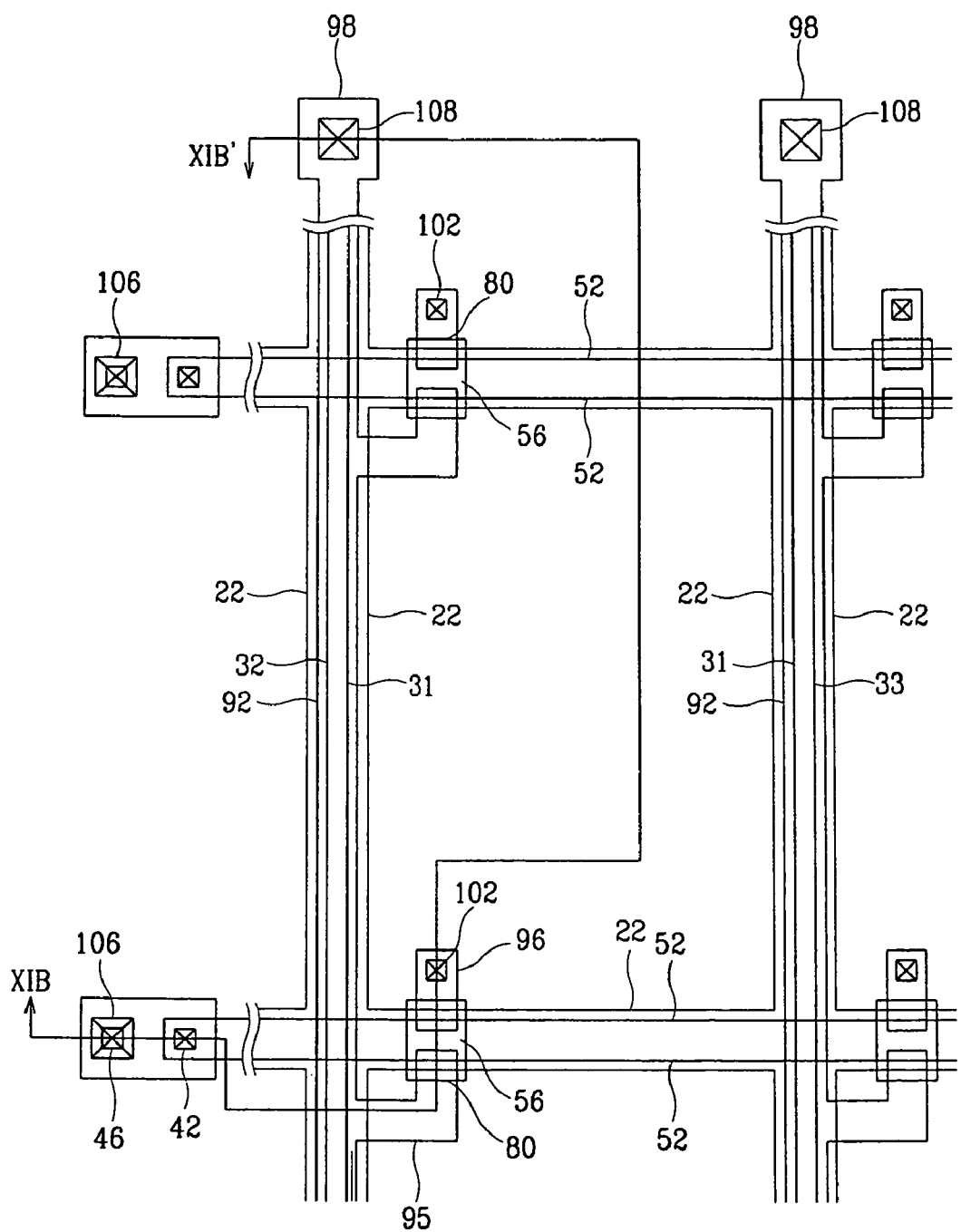
FIG. 11A is a layout view of a TFT array panel in a manufacturing step following FIG. 10A.
Figure 11B:
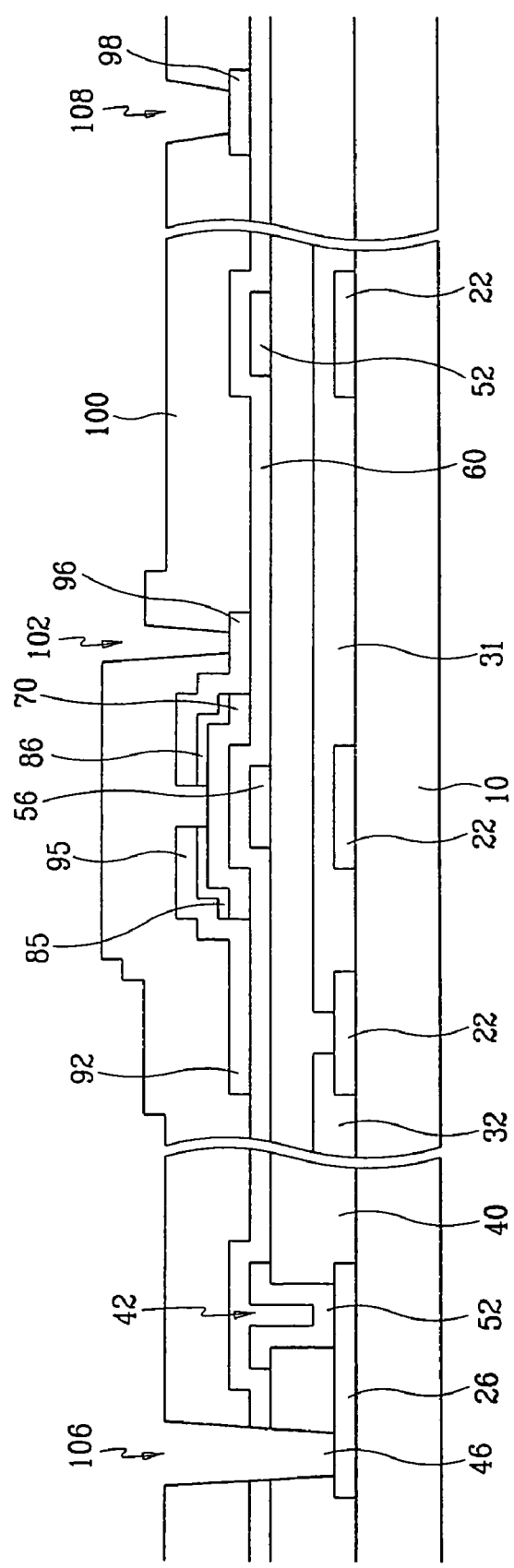
FIG. 11B is a cross-sectional view taken along the line XIB-XIB' of FIG. 11A.

After forming data wire parts 92, 95, 96, and 98 by the above steps, a passivation layer 100 is formed by depositing an inorganic insulator such as silicon-nitride (SiNx), as shown in FIGS. 11A and 11B. It is then patterned to have contact holes 106, 102, and 108 respectively exposing the gate pad 26, the drain electrode 96, and the data pad 98 formed by etching the passivation layer 100 and the gate insulating layer 60. At this time, the contact holes exposing the common wire 25 and 27 may be formed.

Next, as shown in FIGS. 3 to 4, an ITO layer is deposited and etched by photolithography using a mask to form a pixel electrode 112, a redundant gate pad 116 and a redundant data pad 118 connected to the drain electrode 96, the gate pad 26 and the data pad 98 through the contact holes 102, 106 and 108, respectively.

On the other hand, a common electrode made of ITO, IZO or silver alloy is formed on an upper insulating substrate (not shown) opposing the lower substrate 10.

In the manufacturing method according to the embodiment of the present invention, by forming the alignment key 29 or 39 when forming the black matrix 22 or the color filters 31, 32, 33, the thin films including the gate wire and data wire, which will be formed later, may be correctly aligned. Furthermore, by forming the color filters 31, 32 and 33, and the black matrix 22 along with the thin film transistor on the lower substrate 10, an increased aperture ratio can be obtained, because it is not necessary to consider the alignment between the lower substrate.

Furthermore, by forming the color filters 31, 32, 33 of low cost before forming the thin film transistor of high cost, quality problems generated during the manufacturing process of the color filters do not affect the final process yield, which accordingly may minimize manufacturing costs. Also, because the color filters and the thin film transistor are formed through different manufacturing process systems, the process efficiency may be maximized. That is to say, after completing the substrate having color filters covered by the organic insulating layer 40 through an outside order, and the thin film transistor array panel may be manufactured through photolithography process using five masks in an additional manufacturing process system.

Furthermore, by forming the wire 52 and 92 of aluminum, aluminum alloy, silver or silver alloy, the characteristics of display device may be improved in large scale LCDs.

Furthermore, by only forming the common electrode on the upper substrate, the thickness of the upper substrate may be minimized, and because there is no restriction for material of the upper substrate, manufacturing cost may be minimized. The thin film transistor array panel according to the present invention is easily adapted to an LCD of patterned vertical alignment type (PVA) having a common electrode with a plurality of opening portions.

In the first example, the thin film transistor array panel is manufactured by a photolithography process using five photomasks after forming the organic insulating layer 40. However, a thin film transistor array panel may be manufactured by a photolithography process using four photomasks. This will be described with reference to FIGS. 12 to 14. Here, a gate pad is formed of the same layer as a gate wire.

Figure 12:
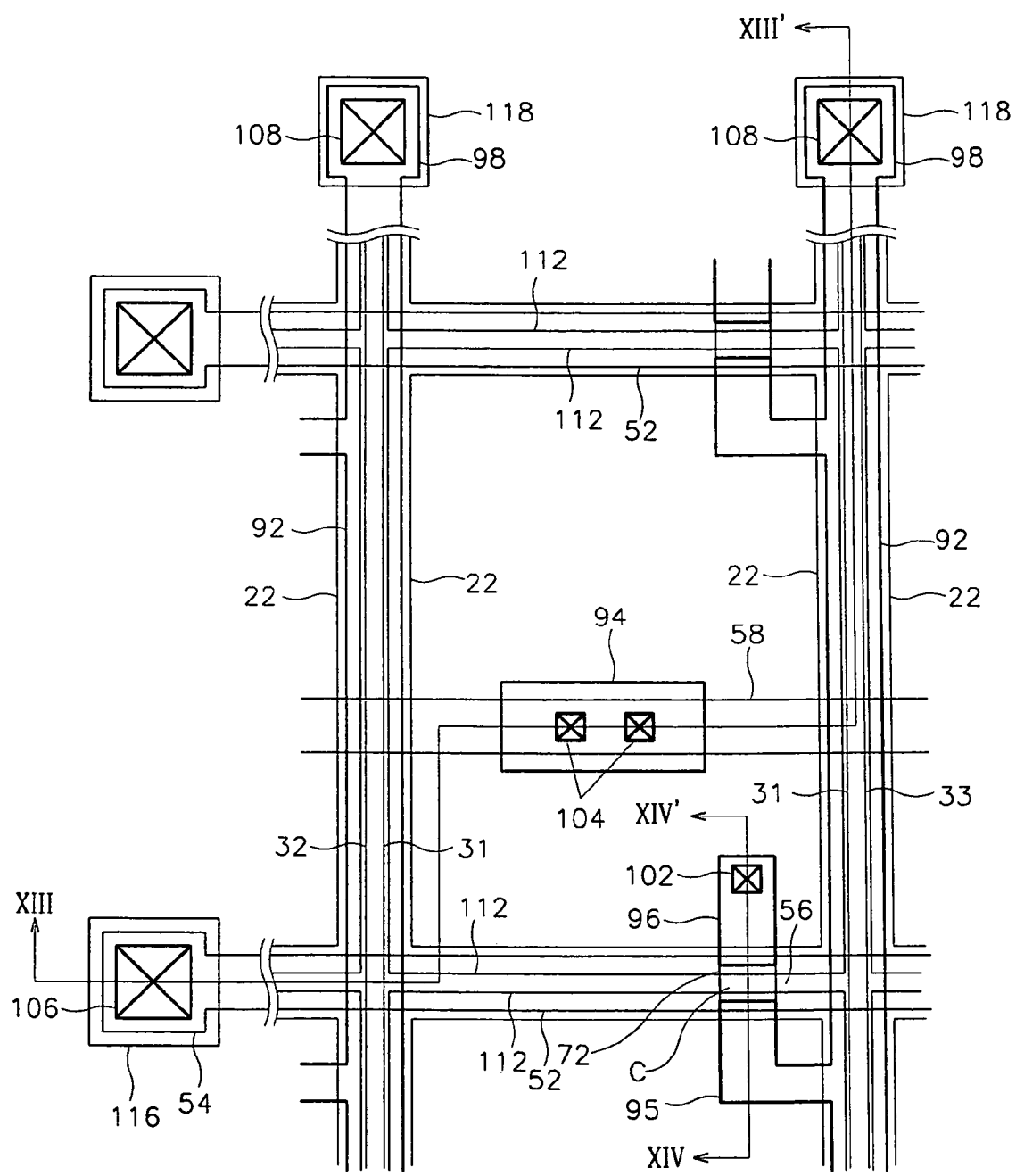
FIG. 12 is a layout view of a TFT array panel for an LCD according to another example of the present invention.
Figure 13:
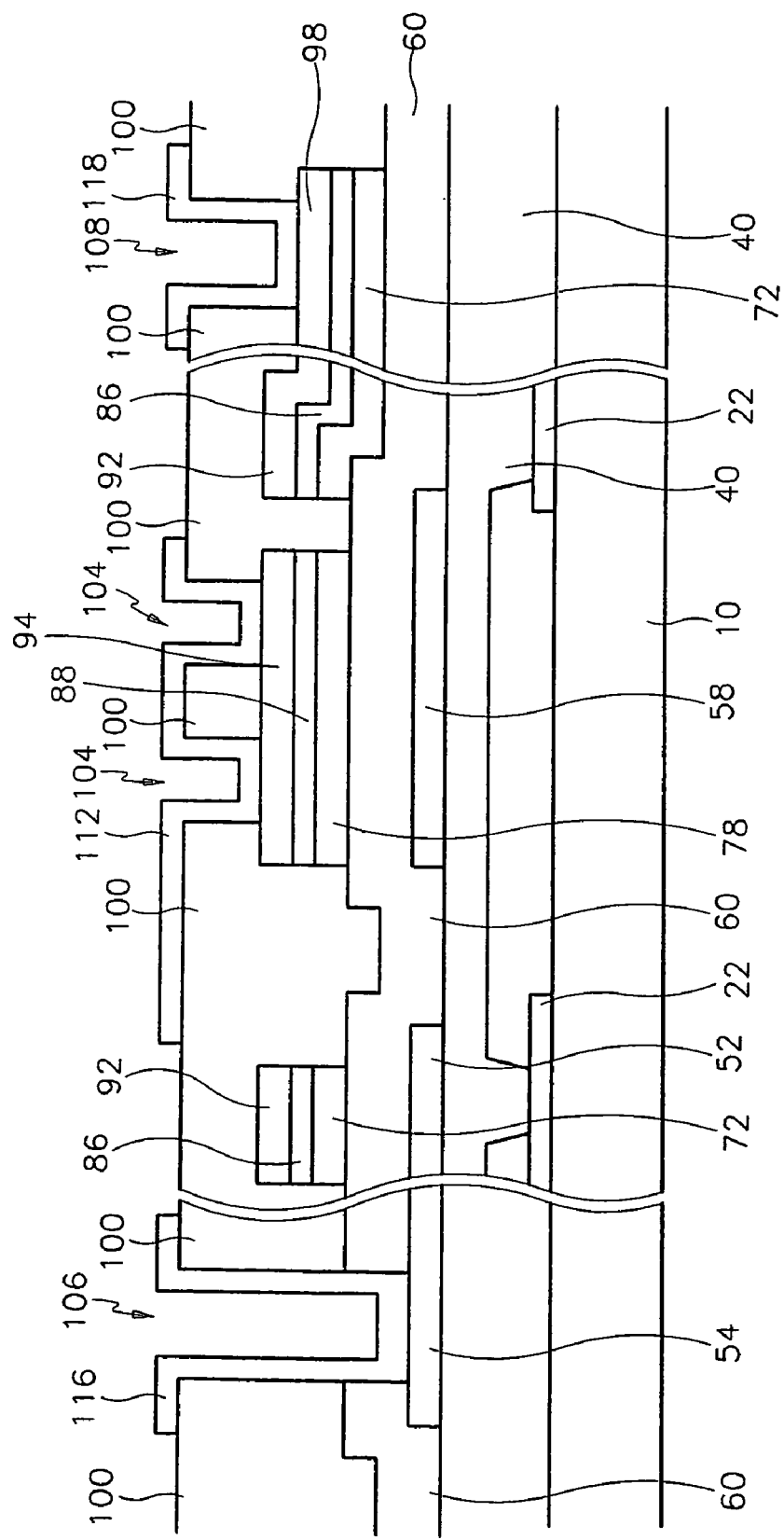
FIGS. 13 and 14 are cross-sectional views respectively taken along lines XIII-XIII' and XIV-XIV' of FIG. 12.
Figure 14:
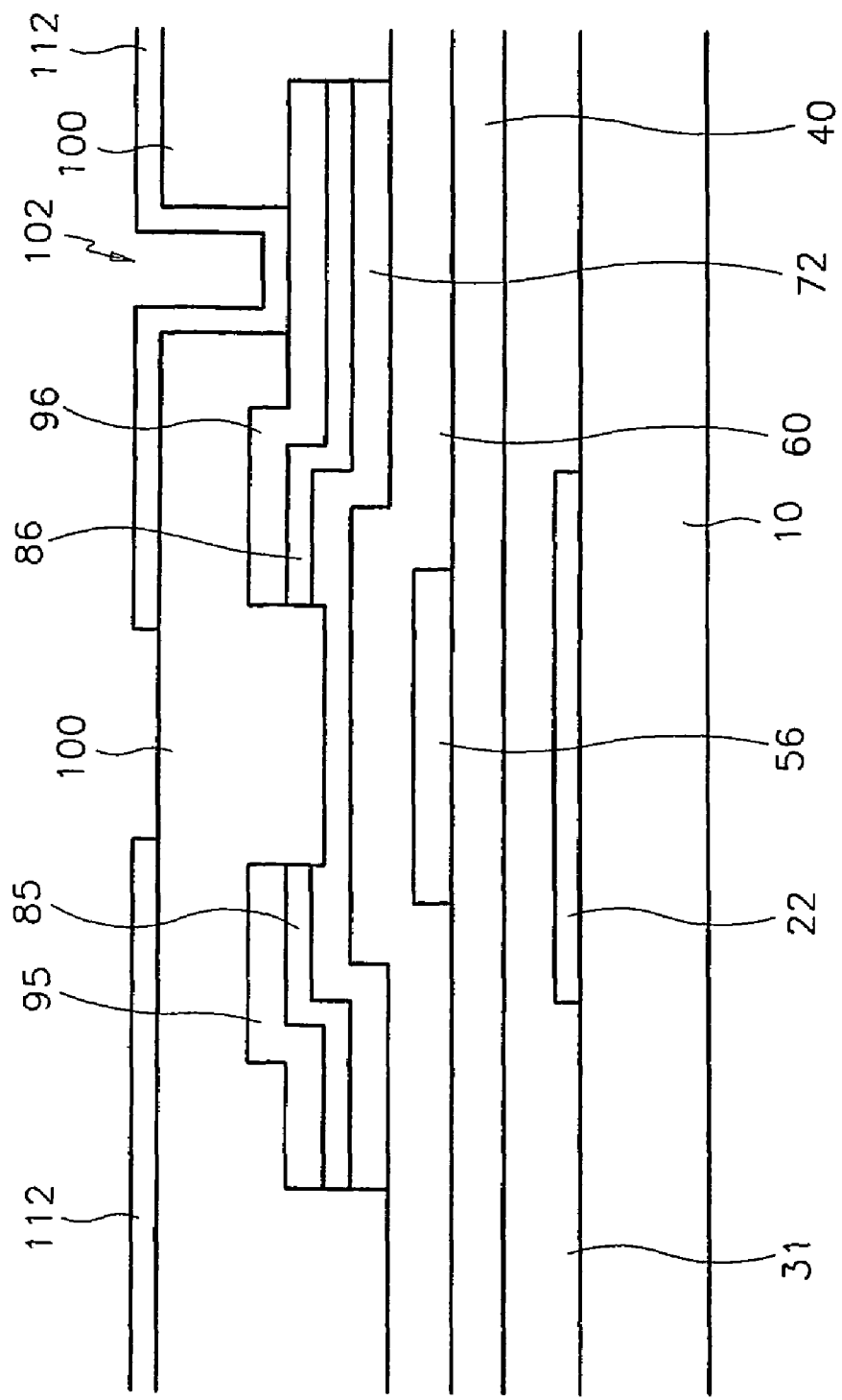
Figure 15A:
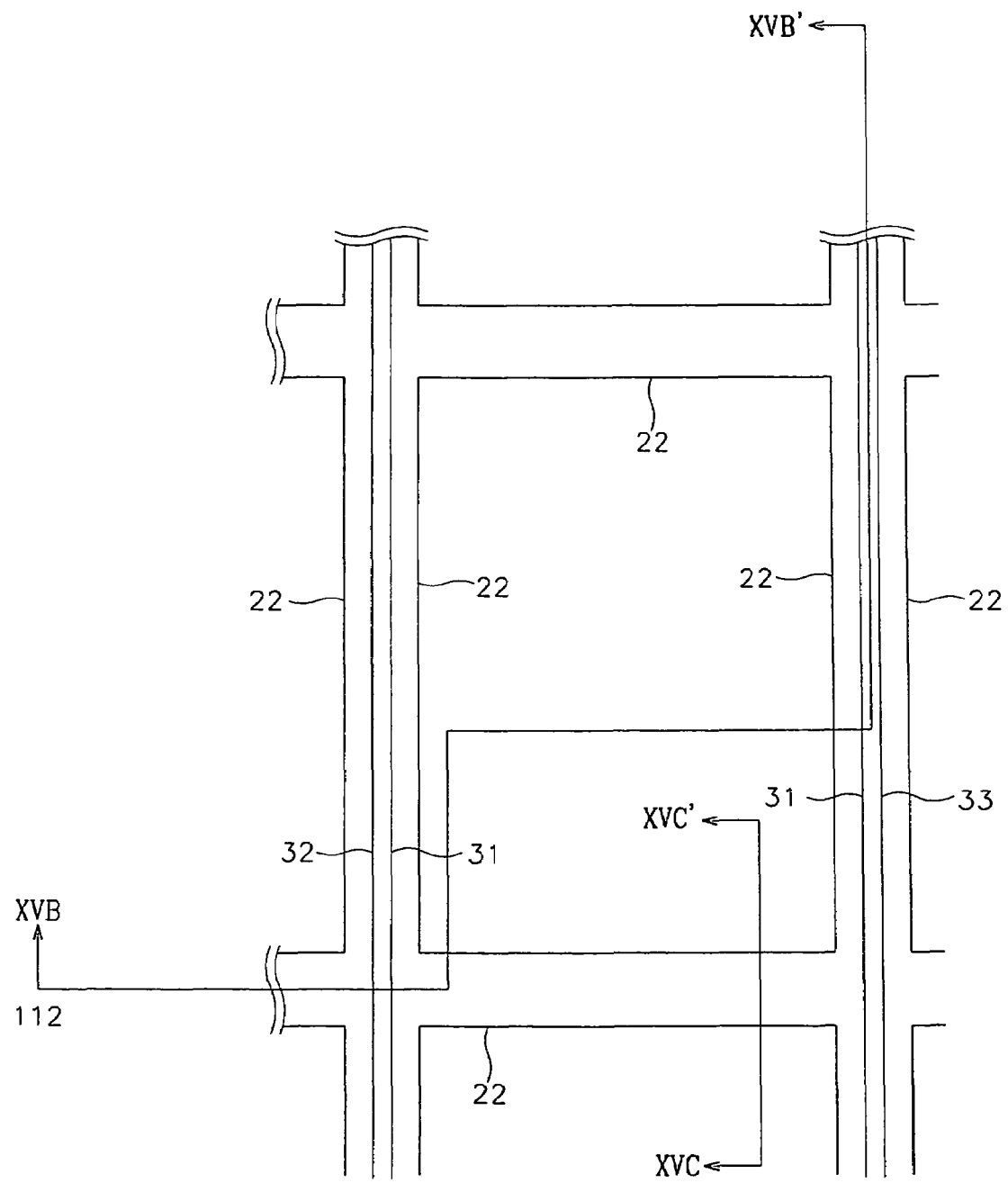
FIG. 15A is a layout view of a TFT array panel in the first manufacturing step according to another example of the present invention.
Figure 15B:
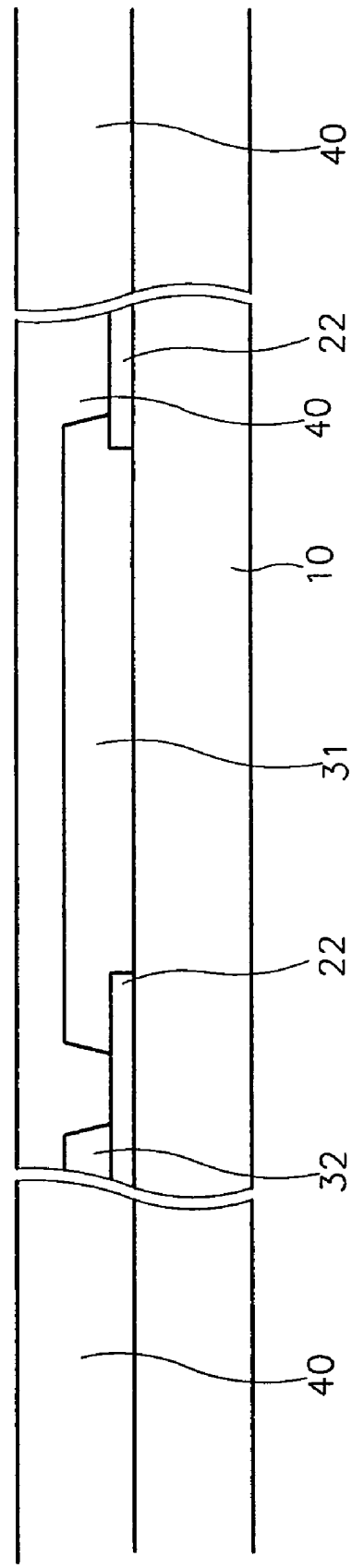
FIGS. 15B and 15C are cross-sectional views respectively taken along lines XVB-XVB' and XVC-XVC' of FIG. 15A.
Figure 15C:
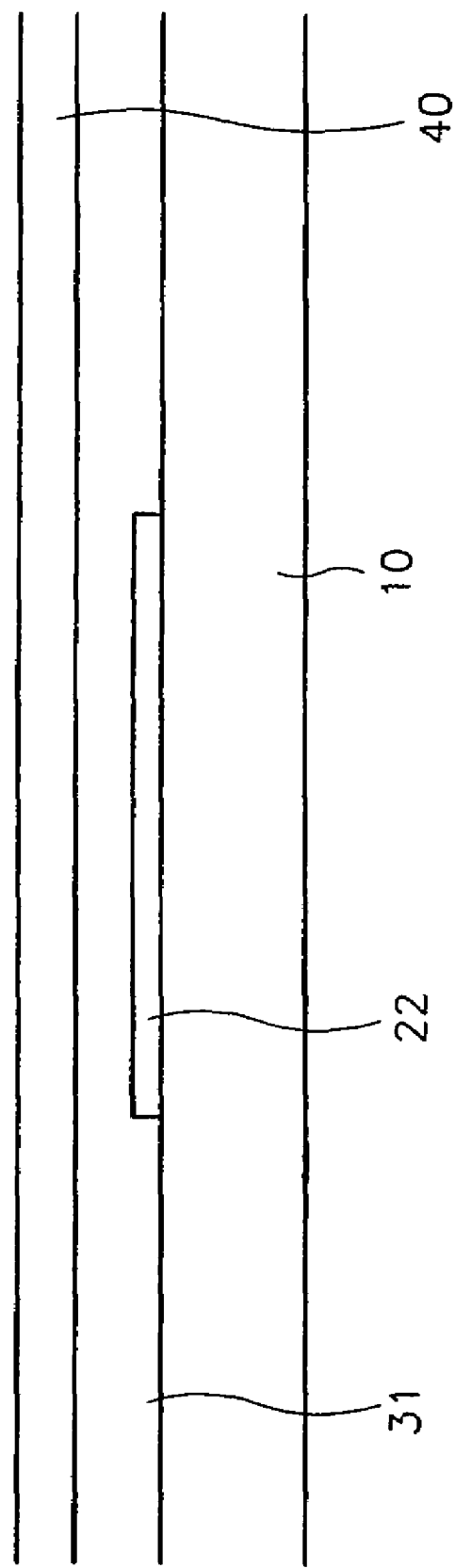

FIG. 12 is a layout view of a thin film transistor array panel for a liquid crystal display according to a second example of the present invention, and FIGS. 13 and 14 are the cross-sectional views taken along lines XIII-XIII' and XIV-XIV' of FIG. 12.

Firstly, a black matrix 22 and color filters 31, 32 and 33 are formed, and an organic insulating layer 40 covering them is formed on a lower insulating substrate 10, like the first example.

Gate wires including a gate line 52, a gate pad 54 and a gate electrode 56, like the first example, are formed on an organic insulating layer 40. Also, the gate wires include a storage electrode 58 which is formed parallel with the gate line 52 and receives a voltage such as a common voltage applied to a common electrode (not shown) on an upper panel of the liquid crystal display. The storage electrode 58 provides storage capacitance along with a conductor pattern 94 connected to a pixel electrode 112 that will be described later. The liquid crystal capacitor includes the pixel electrode 112 and the common electrode. The storage electrode 58 may not be necessary if the storage capacitance between the pixel electrode 112 and the gate line 52 is sufficient.

Gate insulating layers 60 of silicon-nitride (SiNx) are formed on the organic insulating layer 40, and covers the gate wire parts 52, 54, 56, and 58.

Semiconductor patterns 72 and 78 (made of semiconductor such as hydrogenated amorphous silicon) are formed on the gate insulating layer 60. Ohmic contact layer patterns 85, 86, and 88 (made of such materials as doped amorphous silicon heavily doped with impurities like phosphorus) are formed on the semiconductor patterns 72 and 78.

A data wire made of conductive materials such as Mo or Mo alloy, Cr, Ti and Ta is formed on the ohmic contact layer patterns 85, 86, and 88. The data wire has a data line part including a data line 92 extending in the vertical direction on FIG. 12, a data pad 98 connected to an end of data line 92 and transmitting image signals from an external circuit to the data line 92 and a source electrode 95 of a thin film transistor that is connected to the data line 92. The data wire also includes a drain electrode 96 of the thin film transistor on the other side of the gate electrode 56 or the channel part C of a thin film transistor and is separated from the data line parts 92, 94, 95, and conductor pattern 94 used for storage capacitance located on the storage electrode 58. When the storage electrode 58 is not provided, neither is the conductor pattern 94.

The data wire parts 92, 94, 95, 96, and 98 may have a multiple-layered structure. Of course, when the data wire has a double-layered structure, it is preferable that one layer is made of a material such as aluminum or aluminum alloy and another layer is made of a material such as Mo or Mo alloy, Cr, Ti and Ta.

The ohmic contact layer patterns 85, 86, and 88 reduce the contact resistance between the semiconductor patterns 72 and 78 and the corresponding data wire parts 92, 94, 95, 96, and 98, and have the same layout as the data wire parts 92, 94, 95, 96, and 98. In other words, a first ohmic contact layer portion 85 under the data line part has the same shape as the data line parts 92, 98, and 95, a second ohmic contact layer portion 86 under the drain electrode part has the same shape as the drain electrode 96, and a third ohmic contact layer portion 88 under the conductor pattern 94 has the same shape as the conductor pattern 94 for the storage capacitor.

The semiconductor patterns 72 and 78 except for the channel part C of the thin film transistor have the same layout as the corresponding data wire parts 92, 94, 95, 96, and 98 and the corresponding ohmic contact layer patterns 85, 86, and 88. Or, more concretely, the semiconductor portion 78, the conductor pattern 94, and the third ohmic contact layer portion 88 all have the same shape, but the semiconductor portion 72 has a shape different from the data wire and the ohmic contact layer pattern. In other words, the data line parts 92, 98, and 95, especially the source electrode 95 and the drain electrode 96, are separated from each other by the channel part C of the thin film transistor and the portions 85 and 86 of the ohmic contact layer pattern thereunder are also separated from each other, but the semiconductor portion 72 is not divided into two pieces so that it traverses the channel of a thin film transistor.

A passivation layer 100 made of nitride silicon is formed on the data wire parts 92, 94, 95, 96, and 98.

The passivation layer 100 has contact holes 102, 106, 108, and 104 respectively exposing the drain electrode 96, the gate pad 54, the data pad 98, and the conductor pattern 94 provided for storage capacitance.

Pixel electrodes 112 that receive an image signal and generate an electric field with a common electrode of an upper panel are formed on the passivation layer. The pixel electrode 112 is made of a transparent conductive material such as IZO and ITO. The pixel electrode 112 is connected to the drain electrode 96 both physically and electrically through the contact hole 102, and receives the image signal from the drain electrode. Even though the aperture ratio is increased when the pixel electrode 112 overlaps the gate lines 52 or the adjacent the data lines 92, these lines are not required to overlap the pixel electrode. The pixel electrode 112 is connected to the conductor pattern 94 for storage capacitance through the contact hole 104 and transmits an image signal to the conductor pattern 94.

A redundant gate pad 116 and a redundant data pad 118 respectively connected to the gate pad 54 and the data pad 98 through the contact holes 106 and 108 are formed on the gate pad 54 and the data pad 98. These redundant pads 116 and 118 are optional as they protect the pads 54 and 98 and supplement the adhesiveness between an external circuit and the pads 54 and 98.

A method for manufacturing a thin film transistor array panel according to an embodiment of the present invention will now be described with reference to the FIGS. 15A to 22C and FIGS. 12 to 14.

At first, a black matrix 22, color filters 31, 32 and 33, and an organic insulating layer 40 are sequentially formed on an insulating substrate 10, like the first embodiment. At this time, an alignment key 29 or 39 (referring to FIG. 5C or 6C) is formed, like the first example.

Figure 16A:
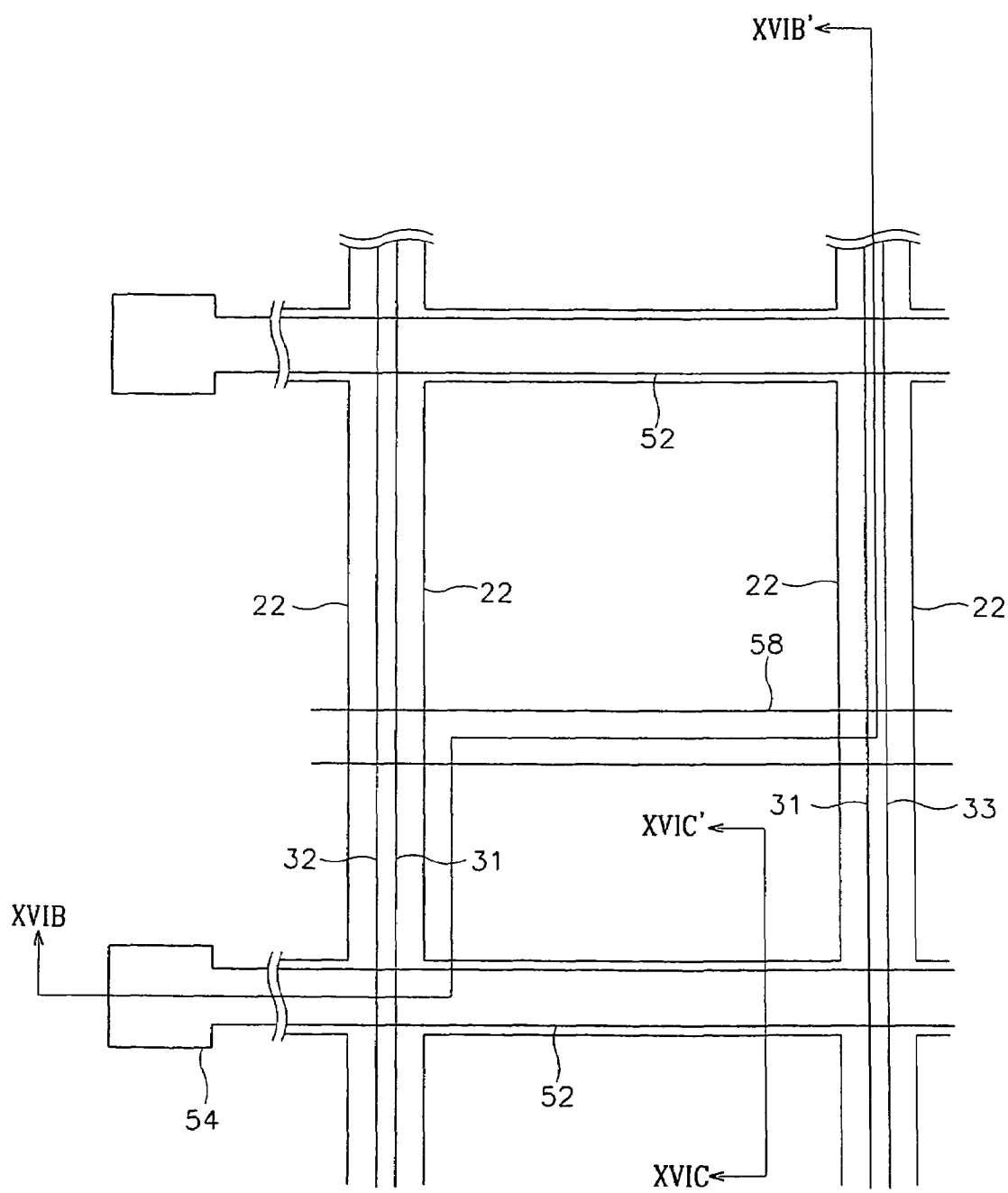
FIG. 16A is a layout view of a TFT array panel in a manufacturing step following FIGS. 15A to 15C.
Figure 16B:
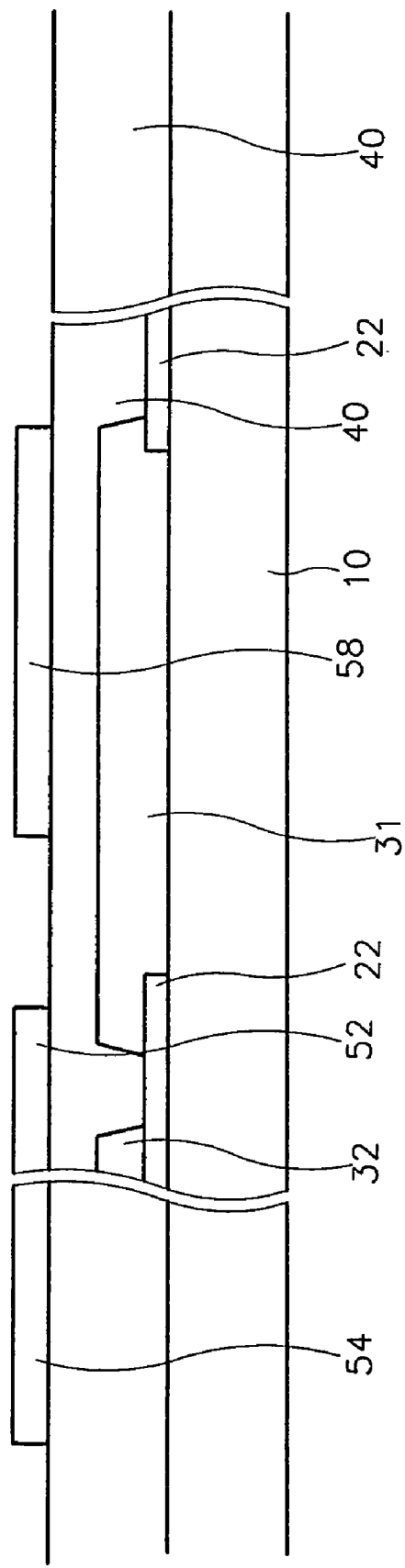
FIGS. 16B and 16C are cross-sectional views respectively taken along the lines XVIB-XVIB' and XVIC-XVIC' of FIG. 16A.
Figure 16C:
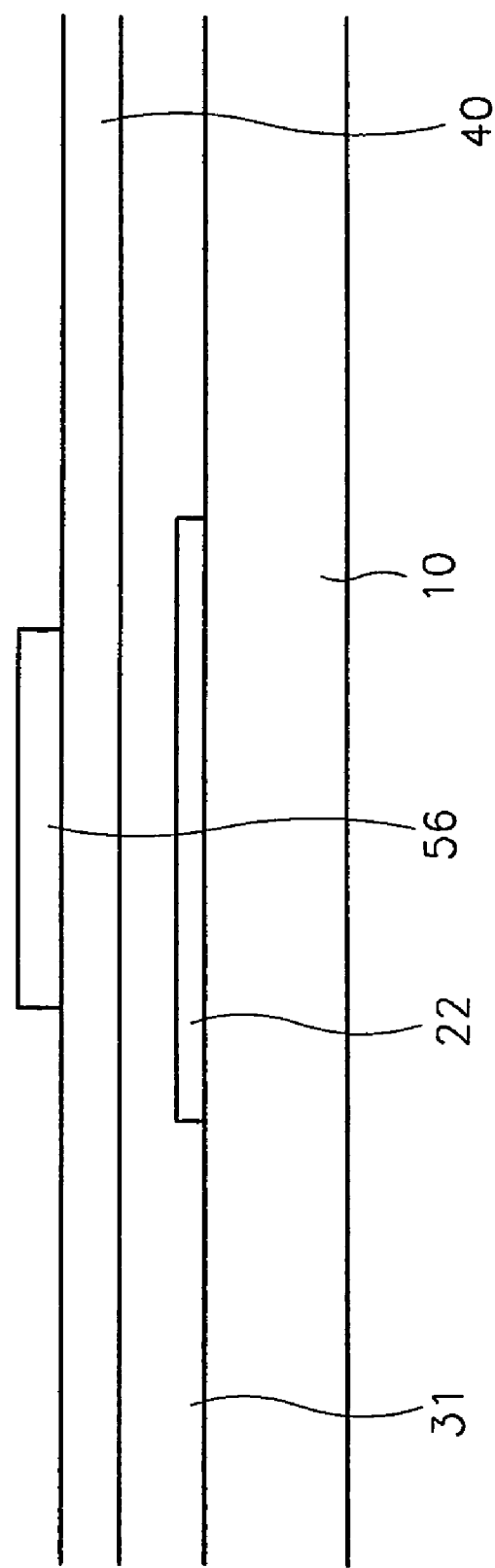

Next, as shown in FIGS. 16A to 16C, a conductive layer having a low resistivity such as aluminum or aluminum alloy is deposited and patterned to form gate wire parts including a gate line 52, a gate electrode 56, a gate pad 54, and a storage electrode 58 by dry or wet etching through a photolithography process using the first mask. Also, at this time, various methods may be used to expose the alignment keys, or the position data of the alignment key may be obtained, to align the first mask for forming a gate line 52, a gate electrode 56, a gate pad 54, and a storage electrode 58.

Figure 17A:
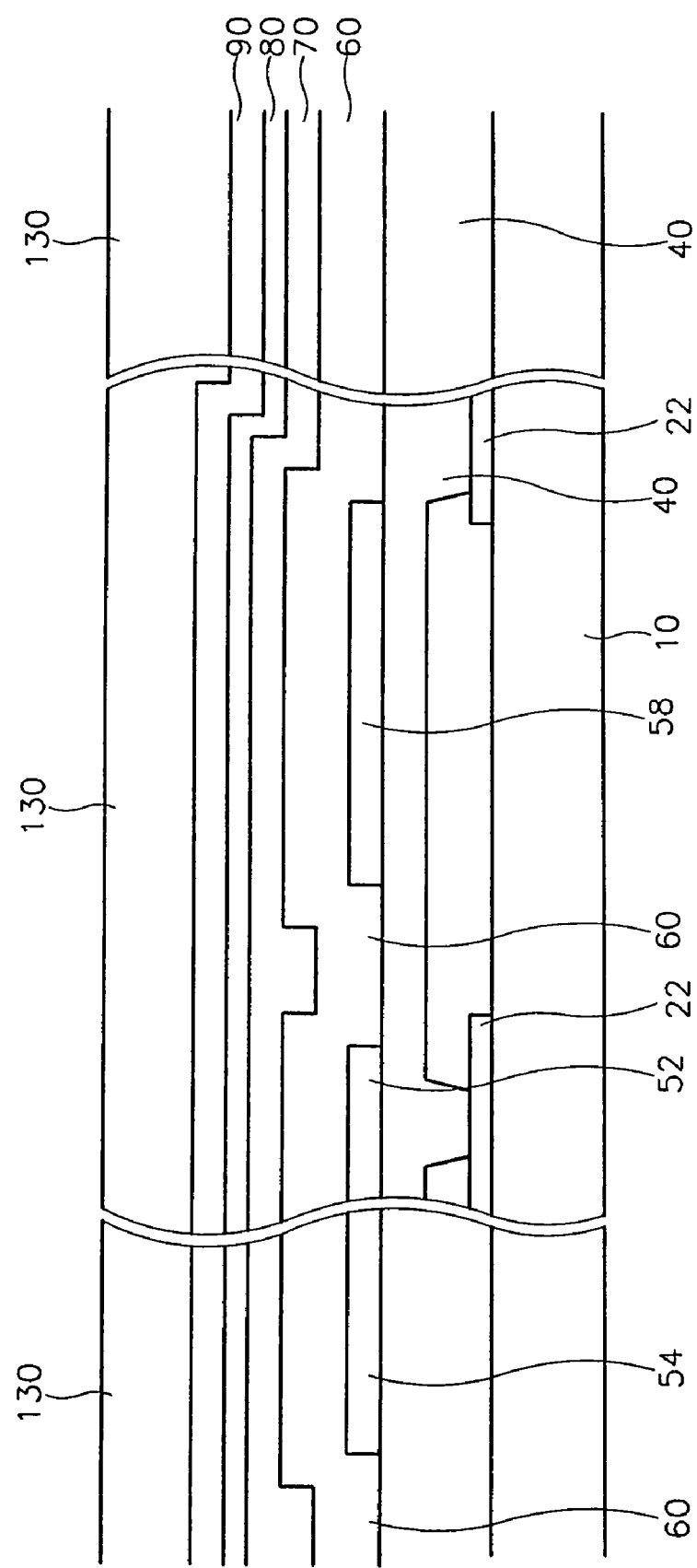
FIGS. 17A and 17B are cross-sectional views respectively taken along lines XVIB-XIVB' and XVIC-XVIC' of FIG. 16A in the manufacturing step following FIGS. 16B and 16C.
Figure 17B:
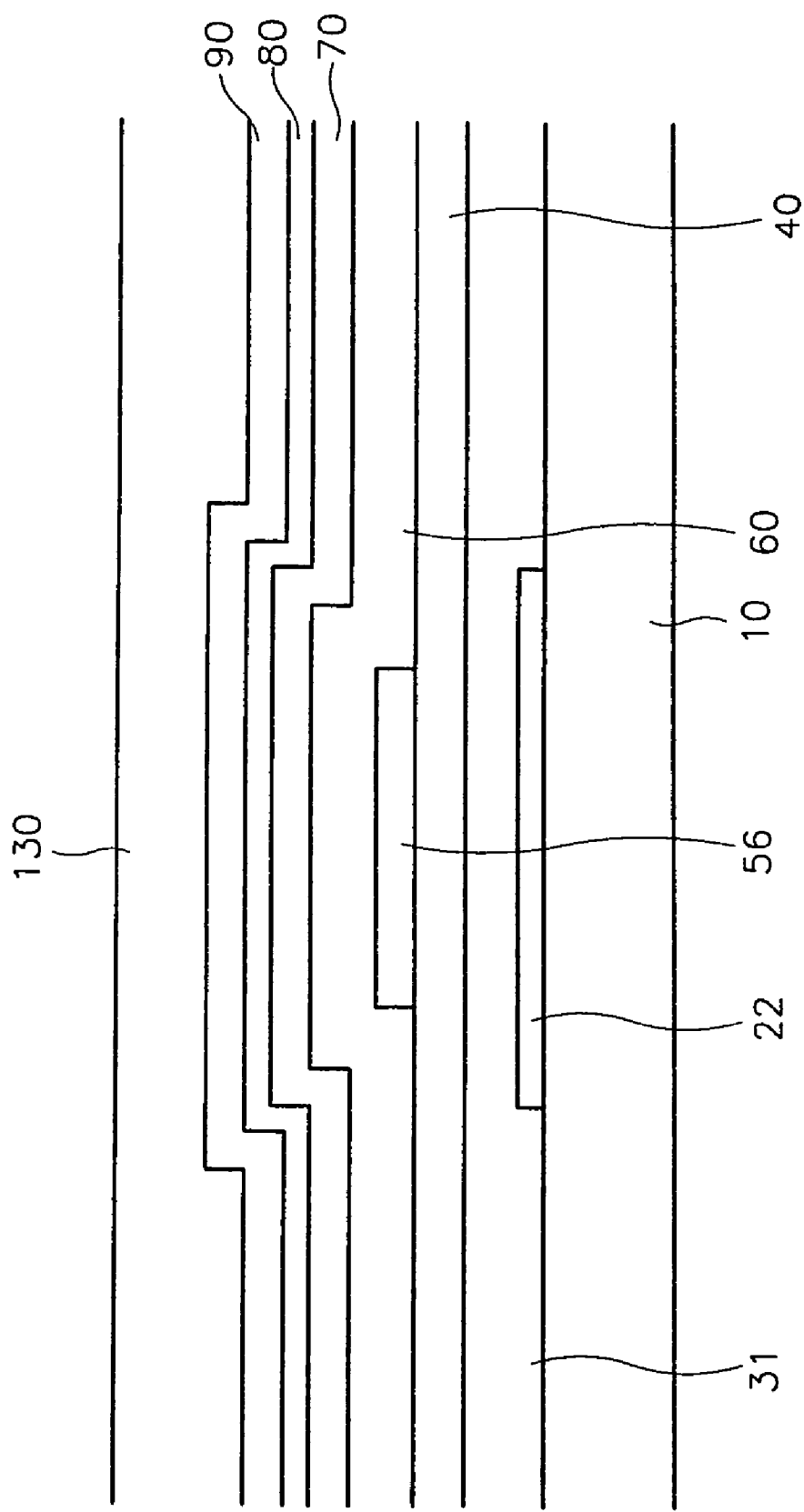
Figure 18A:
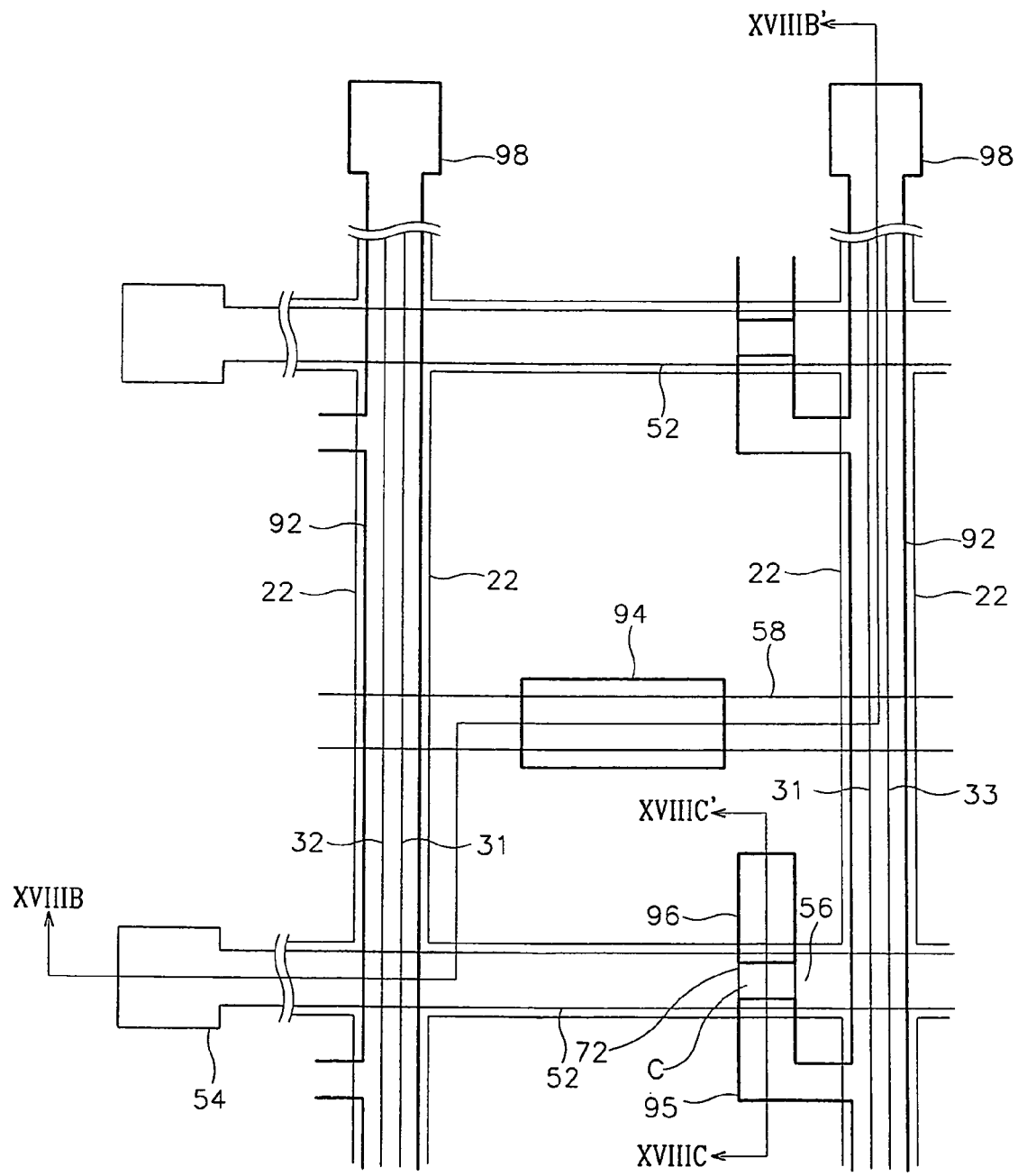
FIG. 18A is a layout view of a TFT array panel in a manufacturing step following FIGS. 17A to 17B.
Figure 18B:
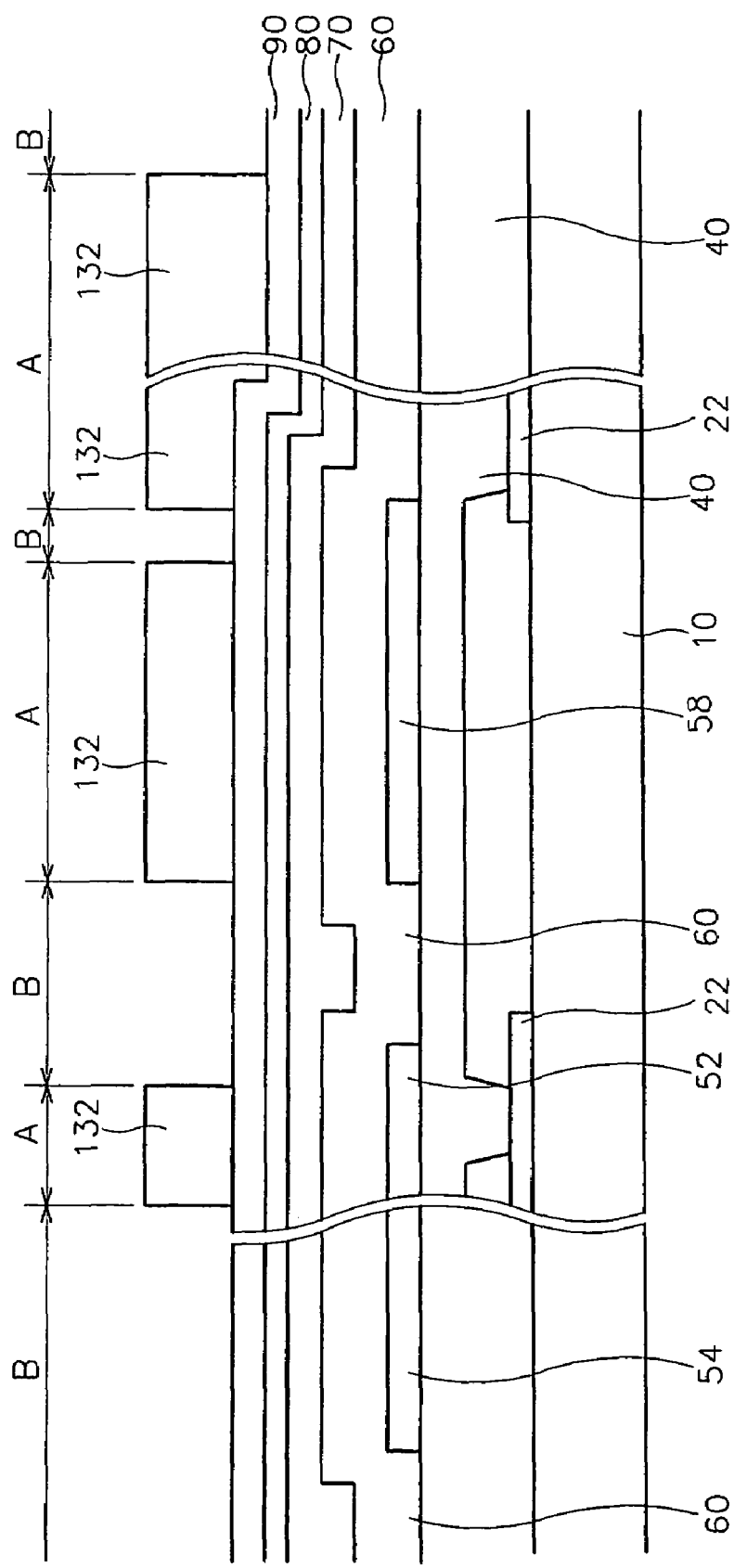
FIGS. 18B and 18C are cross-sectional views respectively taken along lines XVIIB-XVIIB' and XVIIC-XVIIC' of FIG. 18A.
Figure 18C:
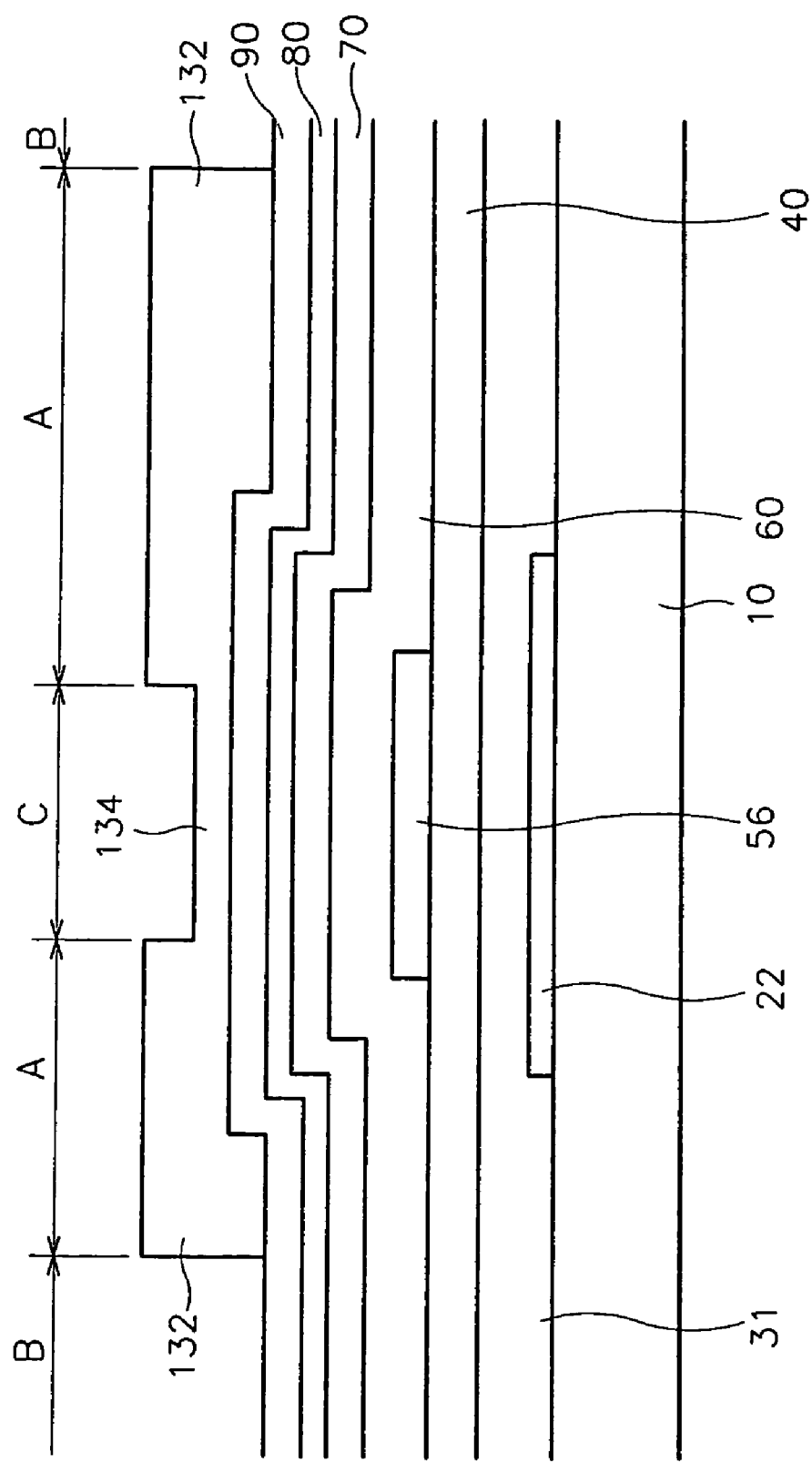

Next, as shown in FIGS. 17A and 17B, a gate insulating layer 60, a semiconductor layer 70, and an ohmic contact layer 80 are sequentially deposited to thicknesses of 1,500 Å to 5,000 Å, 500 Å to 2,000 Å, and 300 Å to 600 Å, respectively, by such methods as chemical vapor deposition (CVD). Then, a conductor layer 90, such as a metal, is deposited to a thickness of 1,500 Å to 3,000 Å by such methods as sputtering and a photoresist layer 130 having a thickness of 1 μm to 2 μm is coated on the conductive layer 90. Thereafter, the photoresist layer 130 is exposed to light through a second mask and developed to form photoresist patterns 132 and 134 as shown in FIGS. 18B and 18C. At this time, the first portion 134 of the photoresist pattern located between a source electrode 95 and a drain electrode 96, i.e., a thin film transistor channel part C as shown in FIG. 18C, is thinner than the second portion 132 of photoresist pattern located over the data wire portion A where a data wire parts 92, 94, 95, 96, and 98 will be formed. Additionally, the third portion, or the remaining portion of the photoresist pattern located at portion B, is thinner than the first portion. The third portion may have a thickness that varies according to the etching method. For example, the third portion has substantially zero thickness when using a wet etch, but the third portion may have a non-zero thickness when using a dry etch. At this time, the thickness ratio between the first portion 134 and the second portion 132 depends on the etch conditions which will be described later. However, it is preferable that the thickness of the first portion 134 is equal to or less than half of that of the second portion 132, or for example, less than 4,000 Å.

There are many methods to change the thickness of the photoresist layer according to position, and it is possible to control the amount of incident light of a portion by forming a pattern such as a slit or a lattice, or by providing a partly-transparent layer on the mask. Such methods are fully described in co-pending application Ser. No. 09/417,045, filed Oct. 12, 1999, and entitled Method For Manufacturing A Thin Film Transistor Array Panel For a Liquid Crystal Display and A Photolithography Method For Fabricating Thin Films, assigned to the same assignee as the present application, the entirety of which is hereby incorporated by reference.

At this time, it is desirable that the size of the slit and the opaque portion between the slits are smaller than the resolution of the exposure device. When a partly-transparent layer is used, to reduce the amount of exposing light, a mask including films having different transmittances, or having a various thickness may be used.

When the photoresist layer is exposed to light through this mask, the polymers of the photoresist layer are disintegrated by the light. The exposure step is finished when the polymers of a portion, which is directly exposed to the light, are completely disintegrated. However, the polymers of the photoresist layer portion, which are exposed through the slit pattern, are not completely disintegrated because the amount of incident light is less than that of the directly exposed portion. The polymers of the photoresist layer portion, which are not exposed to light by the blocking layer, are hardly disintegrated. After developing the photoresist layers, the photoresist layer portion, which is hardly disintegrated, almost remains, and a thinner portion is left under the portion, exposed to a lesser amount of light than the portion receiving a full exposure. However, if the exposure time is too long, all the polymers of the photoresist layer are disintegrated. Therefore, such an over-exposure should be avoided.

The thinner portion 134 may be formed by forming a photoresist layer made of photosensitive and reflowable material, exposing the photoresist layer to light through a mask having respectively substantially transparent portions and substantially opaque portions to form a photoresist pattern having portions of zero and nonzero thicknesseses, and reflowing the photoresist to flow into the zero thickness portions to form a new photoresist pattern.

Referring back to FIG. 18C, the photoresist pattern 134 and the layers thereunder including the conductor layer 90, the ohmic contact layer 80, and the semiconductor layer 70 are then subject to an etching process. When this is done, a data wire and the underlying layers at the data wire part A may be left, as well as only the semiconductor layer on the channel part C. In addition, three layers 90, 80, and 70 in the remaining part B are removed from the gate insulating layer 60.

Figure 19A:
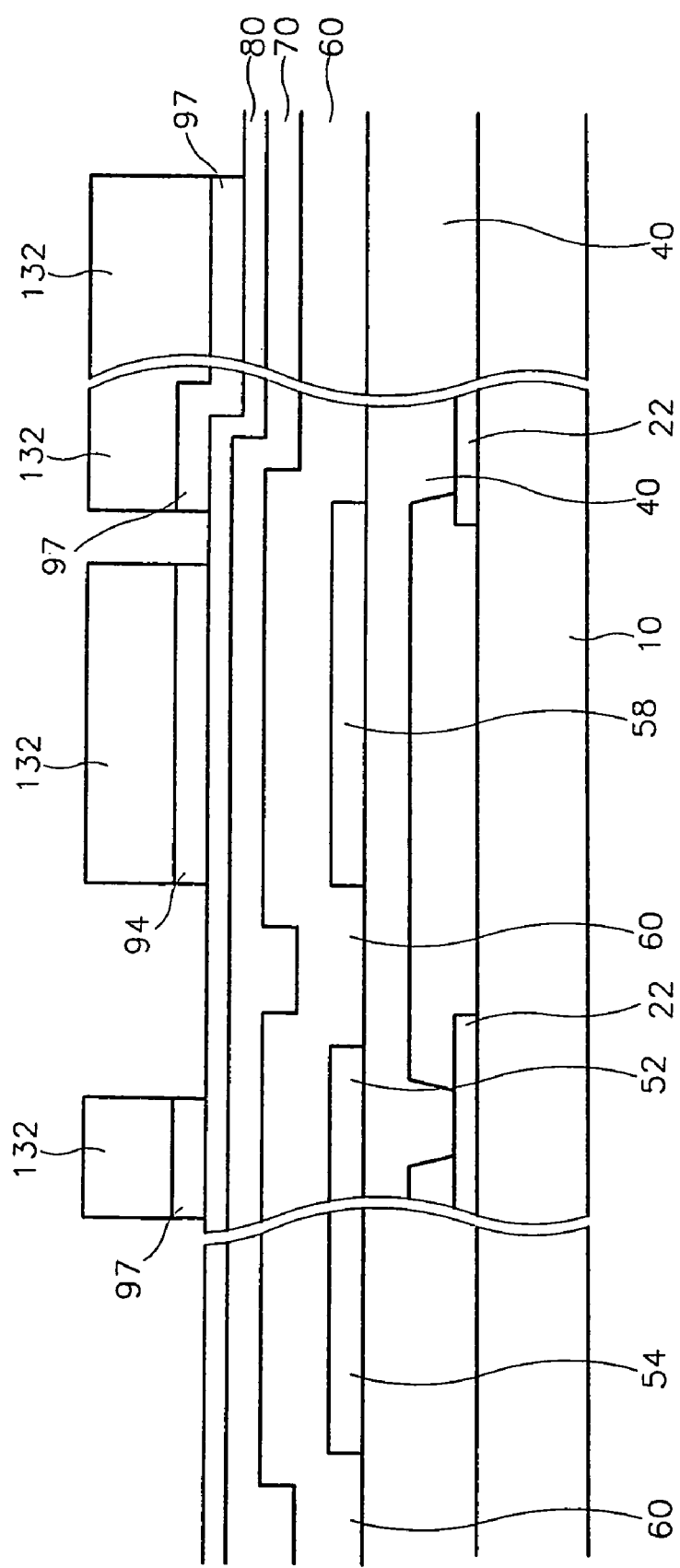
Figure 19B:
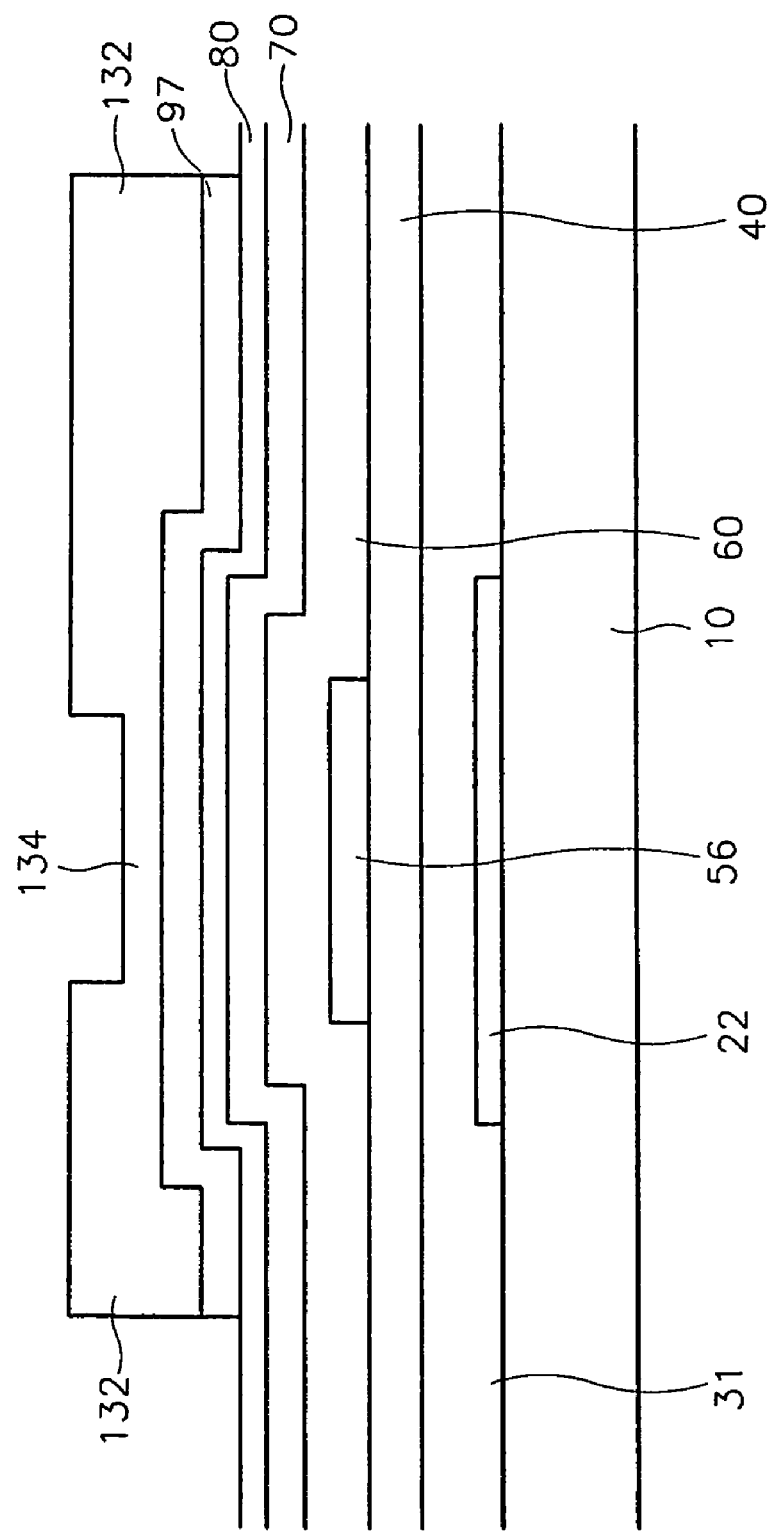

As shown in FIGS. 19A and 19B, the ohmic contact layer 80 of the part B is exposed by removing the conductor layer 90 thereon. At this time, both wet and dry etch can be used, and it is preferable that the etch is performed under a condition such that the conductor layer 90 is etched but the photoresist layers 132 and 134 are not etched. However, since a dry etching method may have a difficulty to achieve this condition, the etching process may be performed under a condition that the photoresist patterns 132 and 134 is also etched. In this case, the first portion 134 may be made thicker than in the wet etch case so that the conductor layer 90 is not exposed.

If the conductor layer 90 is made of Mo or MoW alloy, Al or Al alloy, or Ta, both dry or wet etch methods can be used. However, if the conductor layer 90 is made of Cr, a wet etch is better because Cr is not easily removed by dry etch. CeNHO.sub.3 is available as a wet etchant for etching a Cr conductor layer 90. The mixed gas system systems of CF.sub.4 and HCl or CF.sub.4 and O.sub.2 is available for dry etching a Mo or MoW conductor layer 90, and in this case, the etch rate of the latter system on the photoresist layer is similar to that of the conductor layer 90.

Referring to FIGS. 19A and 19B, as a result, only the portions of the conductor 94 and 97 under the photoresist layers 132 and 134 at the channel part C and the data wire part B for source/drain electrodes and a storage capacitor are left, and the remaining portion of the conductor layer 90 at part B is wholly removed to expose the ohmic contact layer 80 thereunder. At this time, the conductor patterns 97 and 94 have the same layout as the data wire parts 92, 94, 95, 96, and 98 except that the source electrode 95 and the drain electrode 96 are connected to each other. When a dry etch is used, the photoresist layers 132 and 134 are also etched to a certain thickness.

Figure 20A:
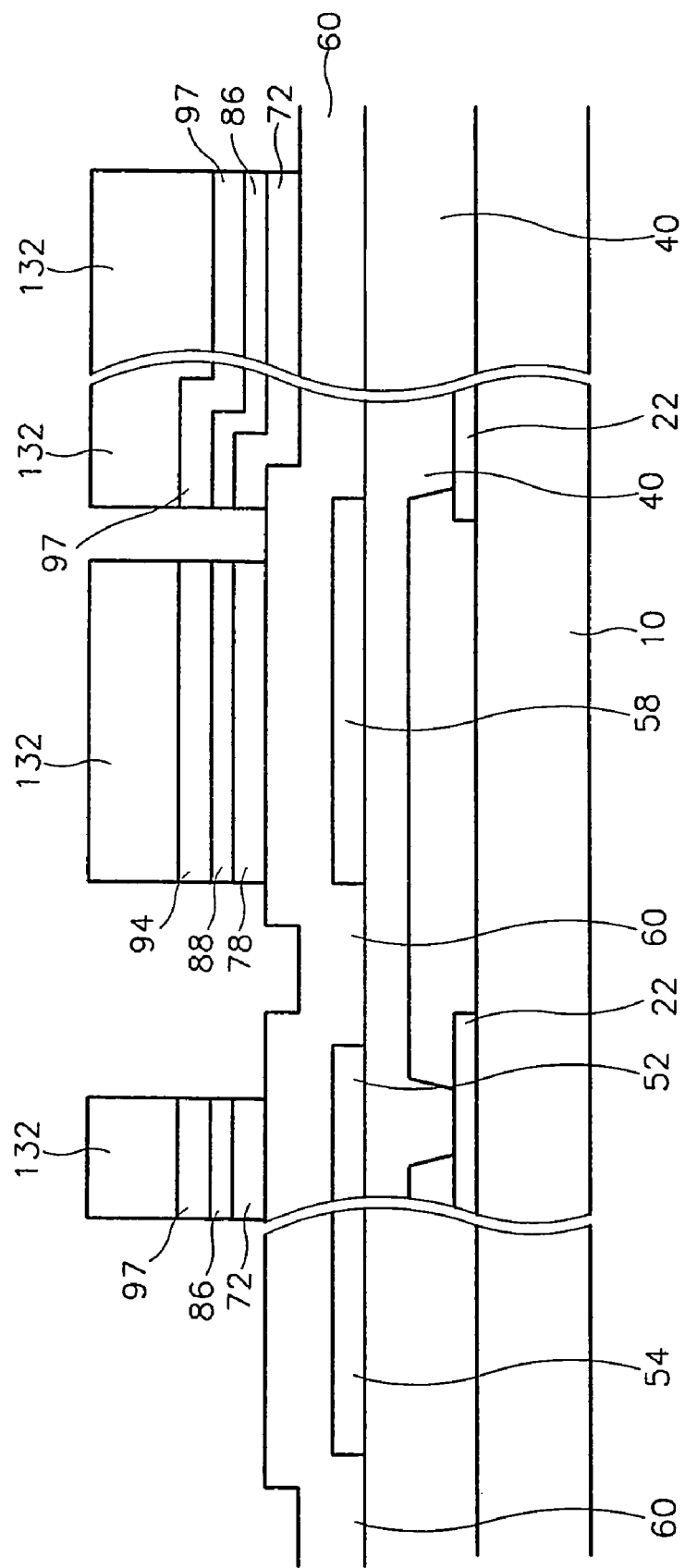

Next, the exposed portions of the ohmic conductor layer 80 at part B, and the semiconductor layer 70 thereunder of FIGS. 20A and 20B are removed by dry etching along with first portion 134 of the photoresist layer. The etch condition may be such that the photoresist patterns 132 and 134, the ohmic contact layer 80 and the semiconductor layer 70 are all etched (the semiconductor layer and the ohmic contact layer have almost the same etch rate), but the gate insulating layer 60 must be not etched. It is preferable that the etch rates of the photoresist patterns 132 and 134 and the semiconductor layer 80 are almost the same. This occurs, for example, with the mixed gas systems of SF.sub.6 and HCl or SF.sub.6 and O.sub.2. At this time, if the etch rates of the photoresist patterns 132 and 134, the semiconductor layer 70 are almost the same, the thickness of the first portion 134 is equal to or less than that of the sum of the semiconductor layer 70, and the ohmic contact layer 80. Then, as shown in FIGS. 20A and 20B, the conductor pattern 97 is exposed by removing the first portion 134 of the channel part C, and the gate insulating layer 60 are exposed by removing the ohmic contact layer 80, and the semiconductor layer 70 of the part B as shown in FIG. 20B. At the same time, the thickness of the second portion 132 over the data wire part A is reduced by etching. Furthermore, the completed semiconductor patterns 72 and 78 are obtained at this step. The reference numerals 86 and 88 respectively represent the ohmic contact layer pattern under the conductor patterns 97 and 94 for the source/drain the electrode and the storage capacitor.

The remaining photoresist layer on the conductor pattern 97 is then removed by ashing or plasma etching.

Figure 21A:
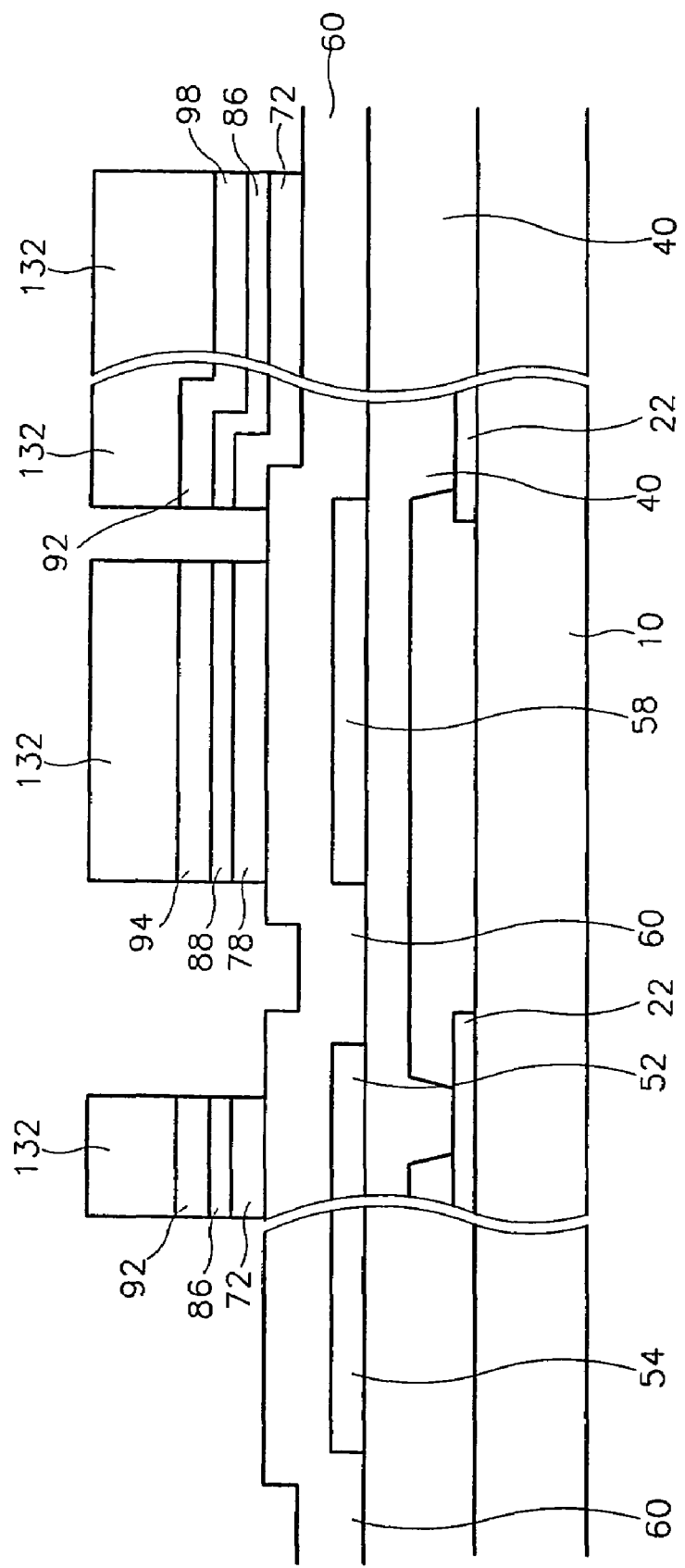
Figure 21B:
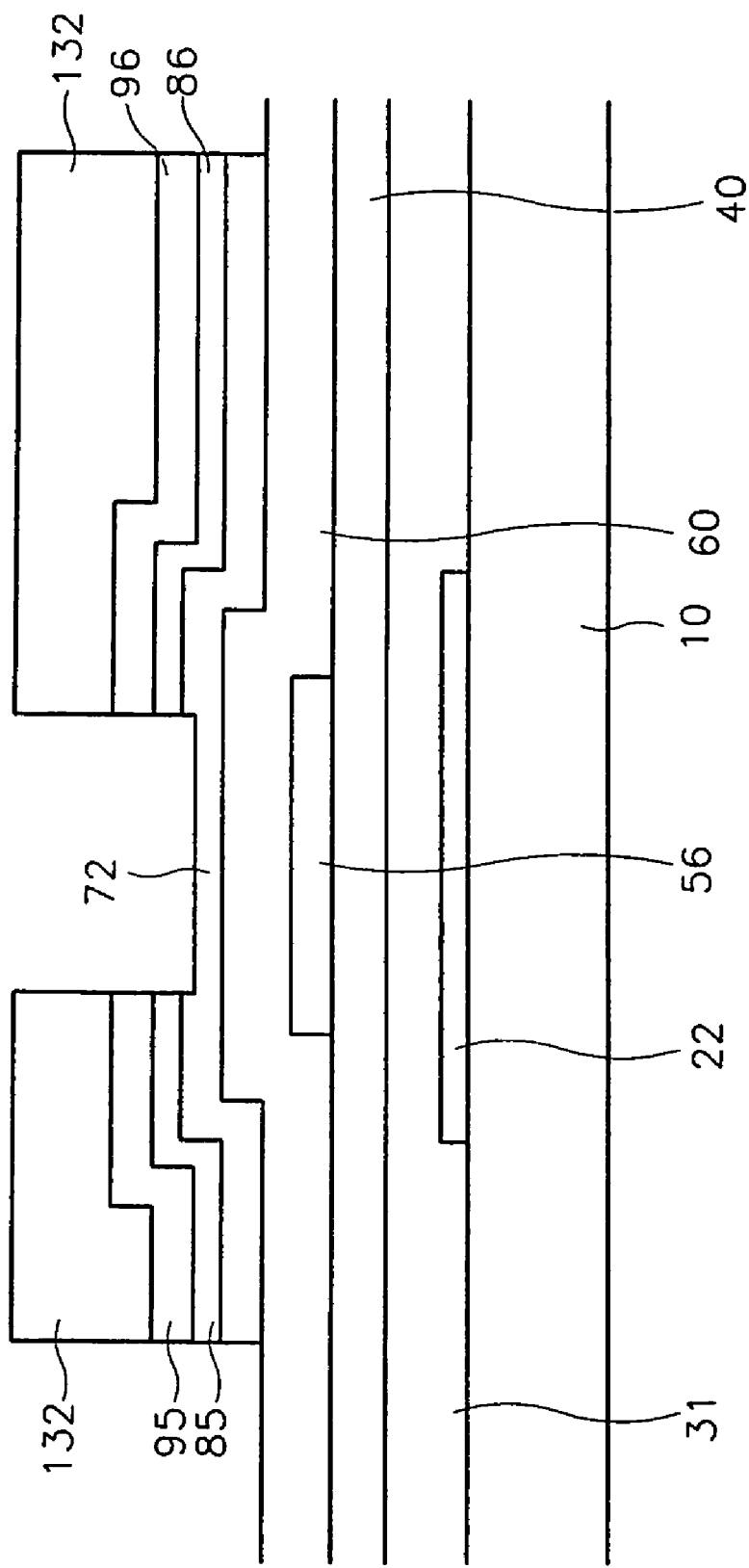

Next, as shown in FIGS. 21A and 21B, the conductor pattern 97 for source/drain electrodes at the channel part C and the ohmic contact layer pattern 87 for source/drain electrodes of FIG. 20B are removed by etching. At this time, it is possible either to etch both the conductor pattern 97 and the ohmic contact layer 87 by a dry etching method, or to etch the conductor pattern 97 by a wet etching method and the ohmic contact layer 87 by a dry etching method. It is preferable in the former case that etch conditions having a large etch selectivity between the conductor pattern 97 and the ohmic contact layer pattern 87 are employed. This is because if the etch selectivity is not large enough, it is hard to detect the end point of the etch and to control the thickness of the semiconductor pattern 72 around the channel part C. This can be achieved by using a mixed gas system of SF.sub.6 and O.sub.2, for example. In the latter case of doing the wet etch and the dry etch sequentially, the lateral sides of the conductor pattern 97 subject to wet etch are also etched although those of the ohmic contact layer pattern 87, which is dry etched, are hardly etched at all. Thereby, the profile of these two patterns 97 and 87 makes a stepped shape. The mixed gas systems of CF.sub.4 and O.sub.2, or CF.sub.4 and HCl are examples of an etch gas system for etching the ohmic contact layer pattern 87 and the semiconductor pattern 72. The semiconductor pattern 72 may also be formed to have a uniform thickness by etching with the mixed gas system of CF.sub.4 and O.sub.2. At this time, as shown in FIG. 21B, the thickness of the semiconductor pattern 72 may be reduced and the second portion 132 of the photoresist pattern is also etched to a certain thickness. The etch conditions may also be set not to etch the gate insulating layer 60, and it is preferable to make the photoresist pattern thick enough not to expose the data wire parts 92, 94, 95, 96, and 98.

As a result, the source electrode 95 and the drain electrode 66 are divided, and data wire parts 92, 94, 95, 96, and 98 and the underlying contact layer pattern 85, 86, and 88 are completed.

Next, the remaining second portion 132 of the photoresist layer on the data wire (Region A of FIG. 18C) is removed. However, this removal of the second portion 132 may be performed after the step of removing the conductor pattern 97 for source/drain electrodes on the channel part C of FIG. 20B and before the step of removing the ohmic contact layer pattern 87 under the conductor pattern 97.

In summary, this process can be done by using both wet etching and dry etching in turn, or by using only dry etching.

In the former case, the conductor layer of the part B is first removed by wet etching, and then the ohmic contact layer and the semiconductor layer thereunder are removed by dry etching. At this time, the photoresist layer of the part C is consumed to a certain thickness, and the part C may or may not have any residual photoresist left, which substantially depends on the initial thickness of the photoresist layer of the part C. When the part C has residual photoresist left, this residual photoresist is removed by ashing. Finally, the conductor layer of the part C is wet etched to separate the source electrode and the drain electrode, and the ohmic contact layer of the part C is removed by using dry etching.

In the latter case, the conductor layer, the ohmic contact layer, and the semiconductor layer of the part B are removed by dry etching. As in the former case, the part C may or may not have residual photoresist left, and residual photoresist is removed by ashing when part C has any residual photoresist. Finally, the conductor layer of the part C is dry etched to separate the source and the drain electrodes, and the ohmic contact layer of the part C is removed by using dry etching.

Also, if the data wire is etched, the semiconductor pattern, the contact layer pattern, and the data wire may be completed in the same step at once. That is to say, it is desirable that the photoresist pattern 134 and the contact layer 80 thereunder of the part C are dry etched, and the portion of the photoresist pattern 132 of the part A is dry etched during the dry etching of the conductor layer, the ohmic contact layer, and the semiconductor layer of the part B.

Since the latter process uses only one type of etching method, it is simpler, although it is harder to achieve proper etching conditions. On the other hand, the former process has the advantage of easily achieving proper etching condition, although it is more complicated.

Figure 22A:
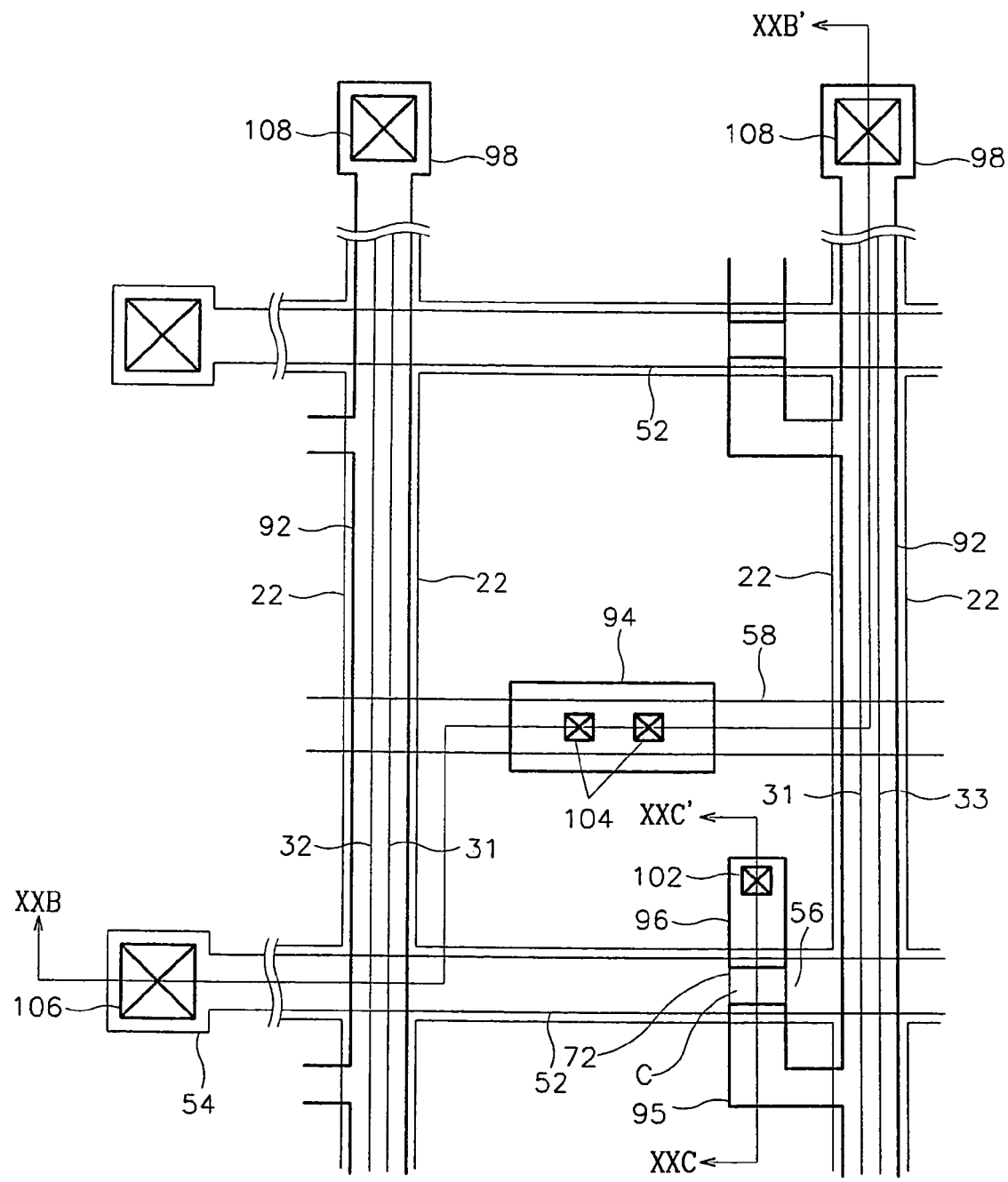
FIG. 22A is a layout view of a TFT array panel in a manufacturing step following FIGS. 21A to 21B.
Figure 22B:
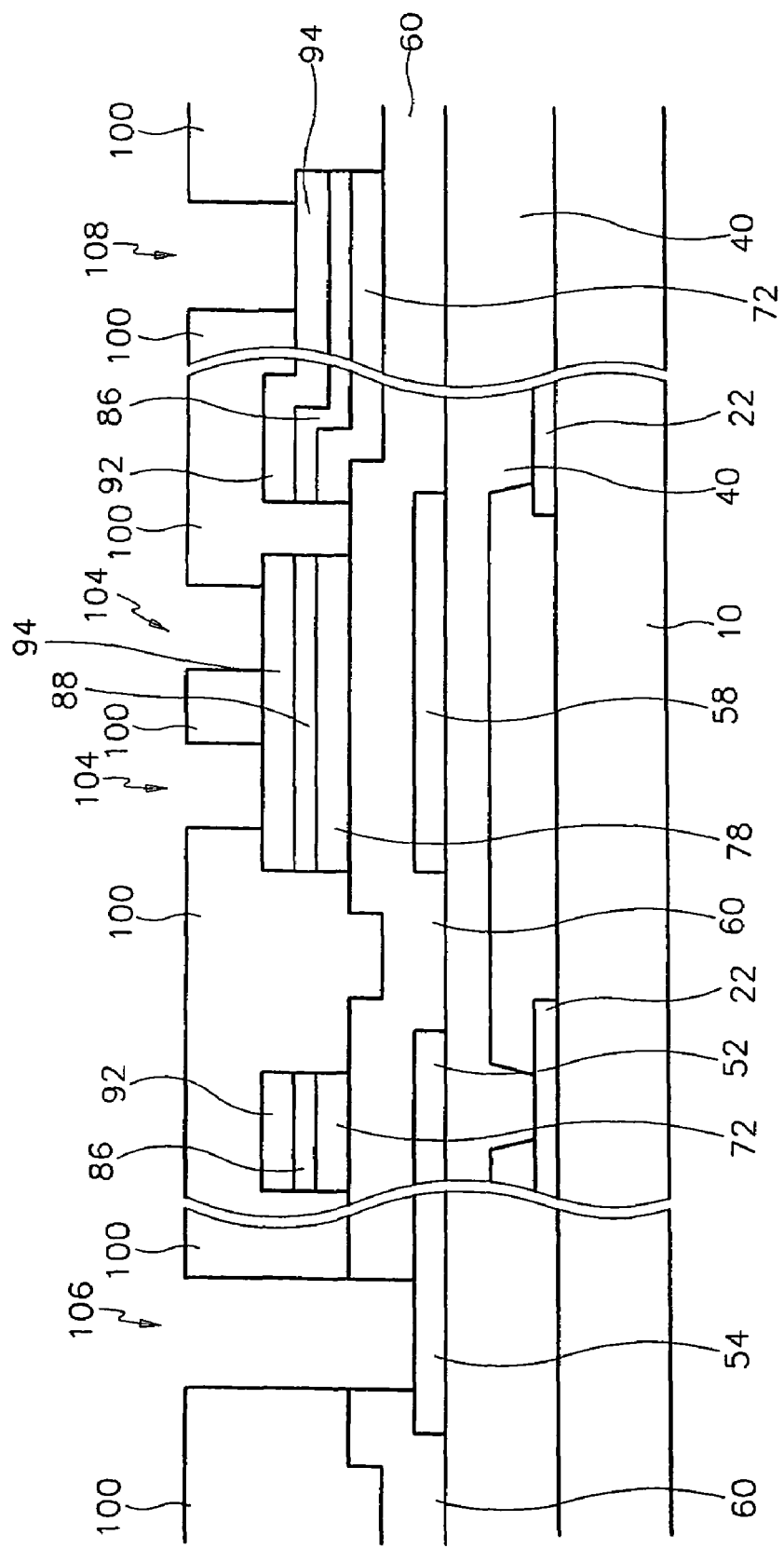

After forming data wire parts 92, 94, 95, 96, and 98 by the above steps, a passivation layer 100 is formed by such methods as chemical vapor deposition (CVD), as shown in FIGS. 22A and 22B. At this time, it is also preferable that the passivation layer 100 made of inorganic material such as silicon-nitride, or organic material is deposited, or is coated to a thickness of over 3,000 Å.

Next, the passivation layer 100 is patterned along the gate insulating layer 60 through photolithography processes using a mask to form contact holes 102, 106, 108 and 104 exposing respectively the drain electrode 96, the gate pad 54, the data pad 98, and the conductor pattern 94 for the storage capacitor, as shown in FIGS. 22A to 22C.

Next, as shown in FIGS. 12 to 14, an ITO layer is deposited having a thickness of 400 Å to 500 Å, and etched by using a mask to form a pixel electrode 112 connected to the drain electrode 96 and the conductor pattern 94, a redundant gate pad 116 connected to the gate pad 54, and a redundant data pad 118 connected to the data pad 98.

In the second embodiment having the same effects as that of the first embodiment, by forming the data wire parts 92, 94, 95, 96, and 98, the ohmic contact layer pattern 85, 86, and 88, and the semiconductor patterns 72 and 78 through one photolithography process, the manufacturing method of the thin film transistor array panel may be also simplified.

Secondly, in another method for manufacturing thin film transistor panels according to the present invention, color filters are formed before forming a thin film transistor, and a data line is used as a black matrix by forming the data line under color filters to obtain a high aperture ratio, an improved process yield and a low parasitic capacitance at the same time. Also, contact holes are formed along with a semiconductor pattern by using a photoresist pattern having diverse thickness depending on positions as an etch mask to simplify a manufacturing process.

Figure 23:
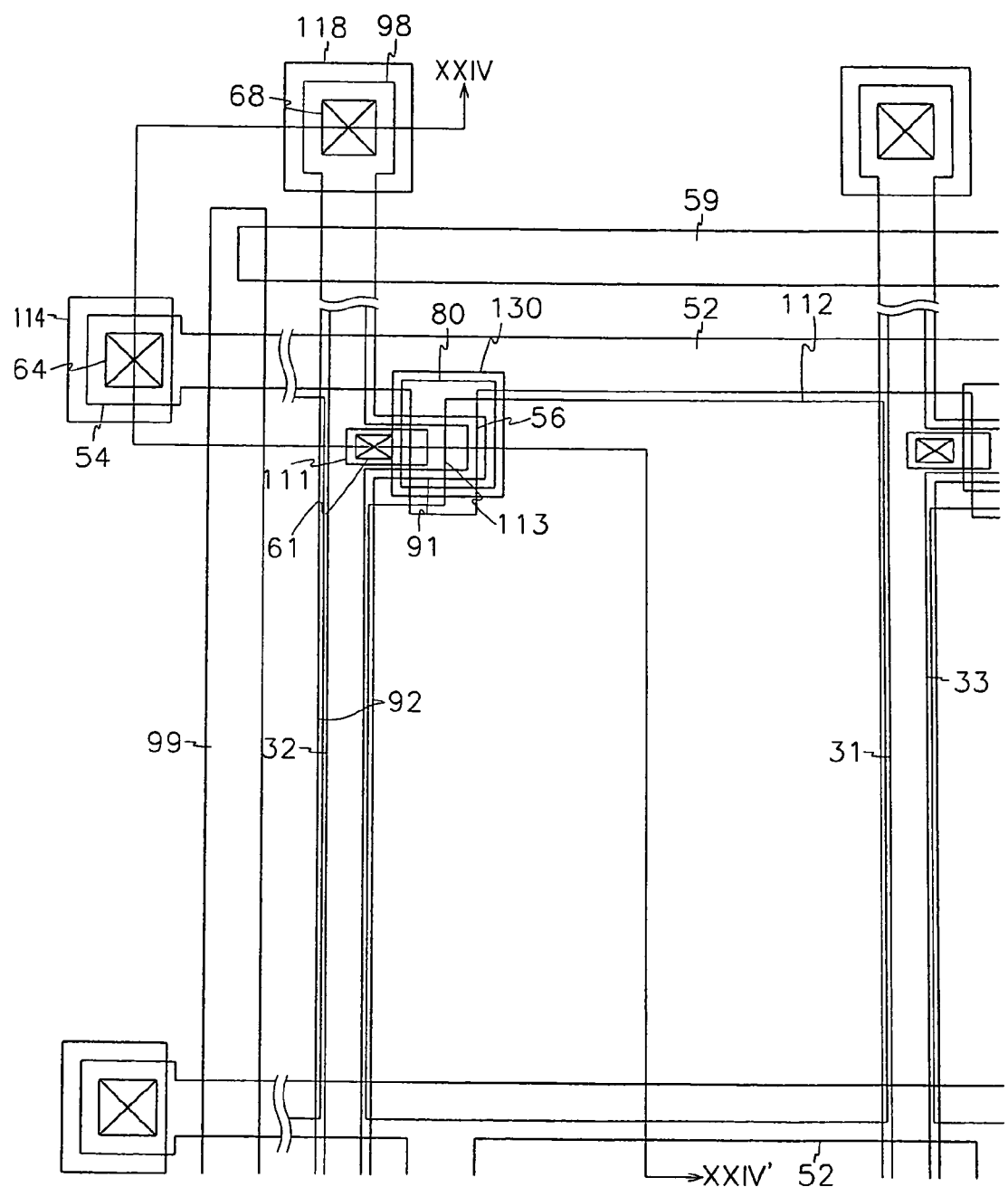
FIG. 23 is a layout view of a TFT array panel for an LCD according to a third example of the present invention.
Figure 24:
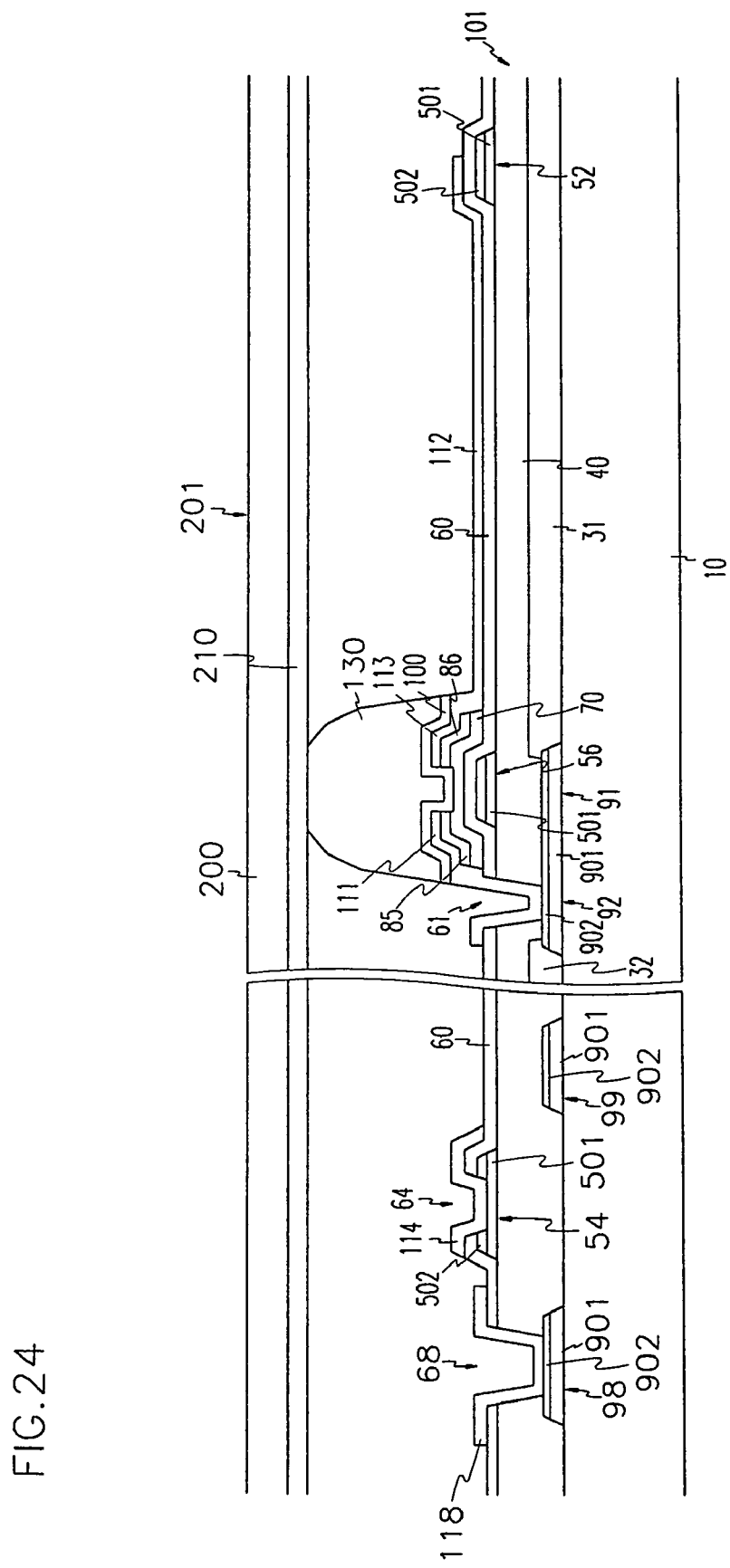
FIG. 24 is a cross-sectional view taken along the line XXIV-XXIV' of FIG. 23.

FIG. 23 is a layout view of a TFT array panel for an LCD according to the third embodiment of the present invention, and FIG. 24 is cross-sectional view taken along the line XXIV-XXIV' of the FIG. 23. Here, a lower and an upper insulating substrates 101 and 201 are together shown in FIG. 24.

Data wires comprising a lower layer 901 including aluminum, aluminum alloy, copper or copper alloy, and an upper layer 902 of chromium, molybdenum, molybdenum alloy, chromium nitride or molybdenum nitride is formed on a lower insulating substrate 10. Data wire parts including a data line 92 extending in the vertical direction on FIG. 23, a data pad 98 connected to an end of data line 92 and transmitting image signals from an external circuit to the data line 92 and a light blocking layer 91 that blocks light reaching a semiconductor layer 70 of thin film transistor from the bottom of the substrate 10, and is connected to the data line 92. Here, the light blocking layer 91 may be used as a black matrix blocking the leakage light, and may be separated from the data line 92. On the other hand, a vertical portion 99 of the black matrix that blocks light leakage at the edge of the display area is formed of the same layer as the data wire 91, 92 and 98.

Here, the data wire parts 91, 92, and 98 has a double-layered structure, but may have a single-layered structure including a conductive material such as aluminum, aluminum alloy, copper, copper alloy, molybdenum, molybdenum tungsten alloy, chromium, tantalum. Also, when considering a pixel wire 111, 112, 113 made of indium tin oxide, the data wire parts 91, 92 and 98 includes the lower layer 901 having a low resistivity such as copper, aluminum and aluminum alloy, and the upper layer 902 having good contacting properties such as chromium, but it is preferable the data wire 91, 92 and 98 may have a single-layered structure of aluminum or aluminum alloy in case of forming the pixel wire of indium zinc oxide.

Color filters 31, 32 and 33 of red, green and blue, the edges of which overlap the data wire 91 and 92, are formed in the pixels on the lower insulating substrate 10. Here, the color filters 31, 32 and 33 may be overlapped to each other on the data wire 91 and 92, and it is desirable that color filters 31, 32 and 33 are made of material that maintains the color property withstanding the temperature range over 350.degree. C. of manufacturing process of thin film transistor.

An organic insulating layer 40 covering the data wire 91, 92 and 98, and color filters 31, 32 and 33, and made of material having a good heat-resistivity in the range of over 300.degree. C. and low dielectric constant below 3.0 such as bisbenzocyclobutene (BCB) and perfluorocyclobutene (PFCB) is formed.

A gate wire of metal or conductive material such as aluminum (Al) and aluminum alloy, molybdenum (Mo) or molybdenum-tungsten (MoW) alloy, chromium (Cr), tantalum (Ta), and copper or copper alloy is formed on the organic insulating layer 40. The gate wire includes a plurality of gate lines (scanning signal lines) 52 extending in the horizontal direction, a gate pad 54 to transmits scanning signal to a gate line 52 from external circuits, and a plurality of gate electrodes 56 of TFTs that are portions of the gate lines 52. The gate lines 52 provides storage capacitance along with a pixel electrode 112 that will be described later. A storage wire may be provided if the storage capacitance between the pixel electrode 112 and the gate line 52 is not enough. On the other hand, a horizontal portion 59 of the block matrix to block light leakage at the edge of the display area is formed on the same layer as the gate wire 52, 54 and 56.

The gate wire 52, 54 and 56 may have a single-layered structure having a low resistivity such as aluminum-based material, copper-based material or silver-based material as well as a multiple-layered structure. When the gate wire parts 52, 54 and 56 form a multiple-layered structure, it is preferable that one layer is made of a material having a low resistivity and another layer is made of a material having good contacting properties with other materials. Double layers of Cr/Al (or Al alloy) and Cu/Cr are examples of such Also, to improve contacting properties, an additional layer of chromium nitride or molybdenum nitride may be added. As shown in FIG. 24, the gate wire 52, 54 and 56 includes a low layer 501 of chromium and an upper layer 502 of Al—Nd.

A gate insulating layer pattern 60 of silicon-nitride (SiNx) is formed on the organic insulating layer 40 and covers the gate wire 52, 54 and 56.

A semiconductor layer 70 made of semiconductor such as hydrogenated amorphous silicon is formed in an island shape on the gate insulating layer 60 of the gate electrode 56.

An ohmic contact layer of 85 and 86, which is divided with respect to the gate electrode 56, is formed on the semiconductor layer 70. The ohmic contact layer of 85 and 88 may have doped microcrystallized amorphous silicon, silicide of metal or doped microcrystallized amorphous silicon.

A source ITO electrode 111 and a drain ITO electrode 113 made of indium tin oxide are formed on the ohmic contact layer patterns 85 and 86. The source ITO electrode 111 is connected to the data line 92 through contact hole 61 of the organic insulating layer 40 and the gate insulating layer 60, and the drain ITO electrode 113 is connected to a pixel electrode that receive an image signal from the thin film transistor and generate an electric field with a common electrode of an upper panel. The pixel electrode 112 is connected to the drain ITO electrode 113 both physically and electrically, and receives the image signal from the drain ITO electrode.

A redundant gate pad 114 and a redundant data pad 118 respectively connected to the gate pad 54 and the data pad 98 through the contact holes 64 and 68 are formed on the gate pad 54 and the data pad 98. Here, the redundant gate pad 114 is directly in contact with the lower layer 501 of chromium of the gate pad 54, and the redundant data pad 118 is directly in contact with the upper layer 902 of chromium of the data pad 98. In case of including the gate pad 54 and the data pad 98 having an additional layer of chromium nitride of molybdenum nitride, it is desirable that the redundant gate pad 114 and the redundant data pad 118 is respectively in contact with the additional layer of chromium nitride of molybdenum nitride. These redundant pads 114 and 118 are optional as they protect the pads 54 and 98 from corrosion due to external air and supplement the adhesiveness between an external circuit and the pads 54 and 98. Even though the aperture ratio is increased when the pixel electrode 112 overlaps the gate lines 52 or the adjacent data lines 98, these lines are not necessarily required to overlap the pixel electrode.

Here, the ohmic contact layer of 85 and 86 reduces the contact resistance between the semiconductor layer 70 and the ITO source and drain electrodes 111 and 113, and may include doped microcrystallized amorphous silicon, silicide of metal such as chromium, molybdenum and nickel. Metal for silicide may be remained on the ohmic contact layer of 85 and 86.

A passivation layer 100 to protect the thin film transistor is formed on the source and the drain ITO electrodes 111 and 113, and a colored organic layer 130 including photosensitive resist having good absorption properties for light is formed thereon. The colored organic layer 130 blocks the light incident to the semiconductor layer 70 of the thin film transistor, and may be used as a spacer that maintains the interval between the lower substrate 10 and the upper substrate 200 by controlling the height of the colored organic layer 130. The colored organic layer 130 and the passivation layer 100 may block the light leakage at the neighborhood of the gate wire and the data wire by forming the colored organic layer 130 and the passivation layer 100 following the shapes of the gate line 52 and the data line 92.

On the other hand, in an upper panel 201, a common electrode 210 which generate an electric field with the pixel electrode 112 of the lower panel 101, and is made of transparent material such as ITO and IZO is formed on an upper substrate 200.

Here, the organic layer 130 replaces a spacer maintaining the uniform interval between the upper substrate 200 and the lower substrate 10.

In the third embodiment according to the present invention, by forming the vertical and the horizontal portions 59 and 99 of a black matrix of the same layer as the gate line 52 and the data line 92, and using the gate line 52 and the data line 92 as a black matrix, aperture ratio is increased, because it is not necessary to consider the alignment between the lower substrate and the upper substrate.

Furthermore, because the gate insulating layer 60 and the passivation layer 100 having a low dielectric constant are between the data line 92 and the pixel electrode 112, the coupling capacitance may be minimized therebetween. Accordingly, the characteristics of the liquid crystal display as well as the aperture ratio is improved, because it is not necessary to keep the interval between the data line 92 and the pixel electrode 112.

Furthermore, because the gate insulating layer 60 is only formed between the pixel electrode 112 and the gate line 52, accordingly storage capacitance may be enough obtained therebetween.

Furthermore, by blocking the light incident from the lower direction of the substrate 10 through the blocking light layer 91, the size of the gate electrode 56 may be optimized and parasitic capacitance between the gate electrode 56, and the source and drain ITO electrodes 111 and 113 may be minimized, and the deviation of them is minimized. Accordingly, display quality defects such as stitch and flicker, and the leakage current may be minimized. Also, the organic insulating layer 40 formed between the gate line 52 and the data line 62 may decrease the short circuit between them. And the minimized thickness of the gate insulating layer 60 may increase the quality of thin film transistor.

A method for manufacturing a thin film transistor array panel according to an embodiment of the present invention will now be described with reference to the FIGS. 25A to 32C and FIGS. 23 to 24

Figure 25A:
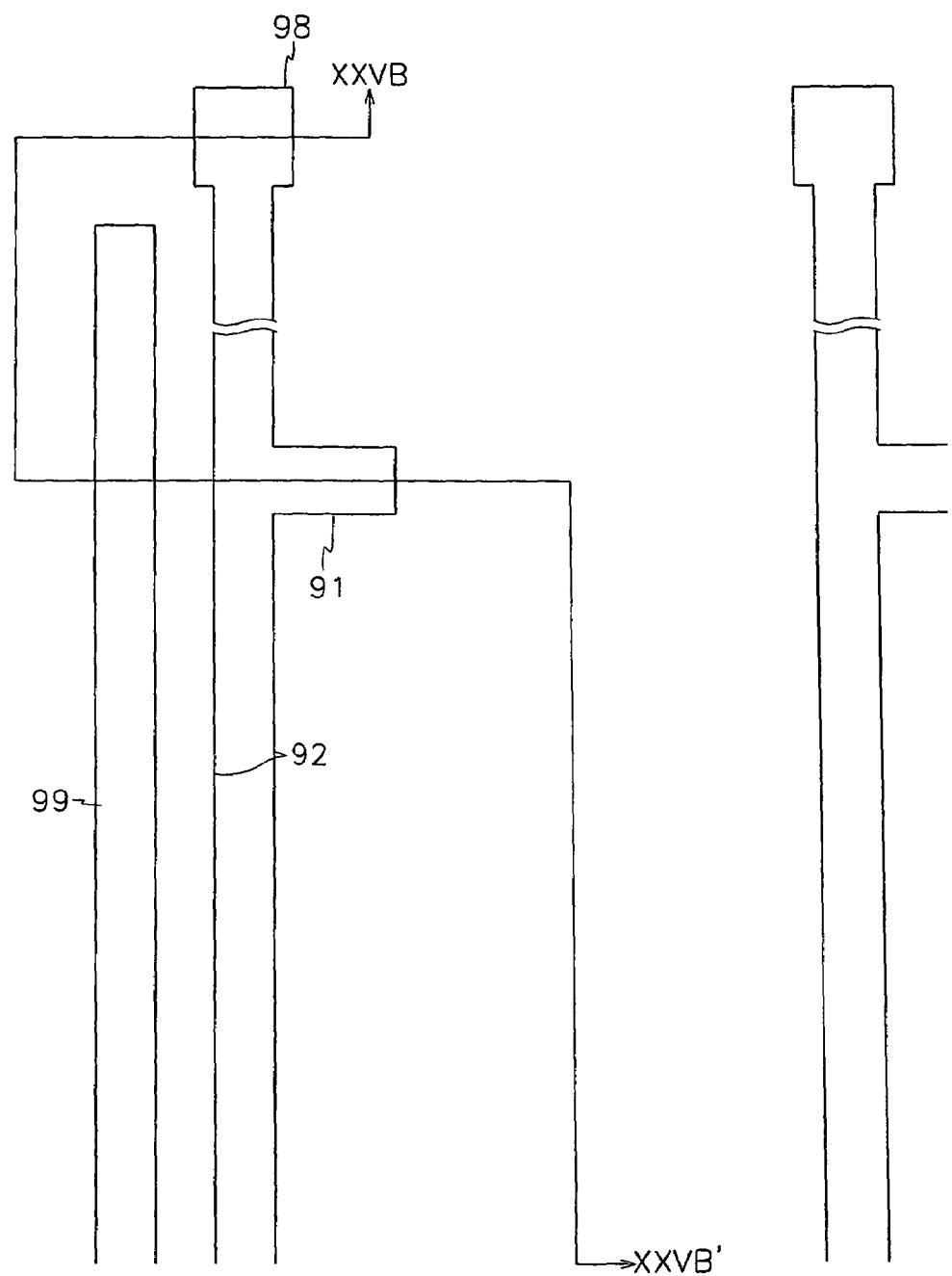
FIG. 25A is a layout view of a TFT array panel in the first manufacturing step according to the third example of the present invention.
Figure 25B:
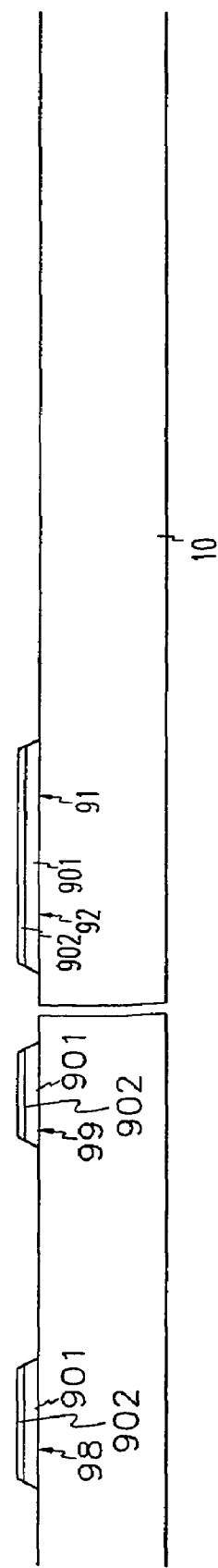
FIG. 25B is a cross-sectional view taken along the line XXVB-XXVB' of FIG. 25A.

As shown in FIGS. 25A and 25B, a lower layer 901 made of a conductive material having a low resistivity such as aluminum, aluminum alloy, copper and copper alloy, and an upper layer 902 made of another conductive material having good contacting properties such as chromium, molybdenum, titanium, molybdenum nitride and chromium nitride (particularly with ITO) are deposited on a low substrate 10 by such methods as sputtering, and patterned to a data wire parts including a data line 92, a data pad 98 and a light blocking layer 91, and a vertical portion 99 of a black matrix are formed by dry or wet etching using a first mask. At this time, the light blocking layer 91 may be formed in diverse shapes to block light leakage between pixels, which will be described later in detail referring to appropriate drawings.

Here, when considering a pixel wire 111, 112, 113 made of indium tin oxide, which will be formed later, the data wire parts 91, 92, and 98 have a double-layered structure including the lower layer 901 and the upper layer 902, but may have a single-layered structure including a conductive material such as aluminum, aluminum alloy, copper, copper alloy, molybdenum, molybdenum tungsten alloy, chromium, tantalum in case of forming a pixel wire 111, 112, 113 made of indium zinc oxide. Also, in case of forming the pixel wire 111, 112, 113 made of indium tin oxide, or indium zinc oxide, the data wire parts 91, 92 and 98 may have a single-layered structure made of a conductive material such as copper, copper alloy to simplify the manufacturing process.

Figure 26A:
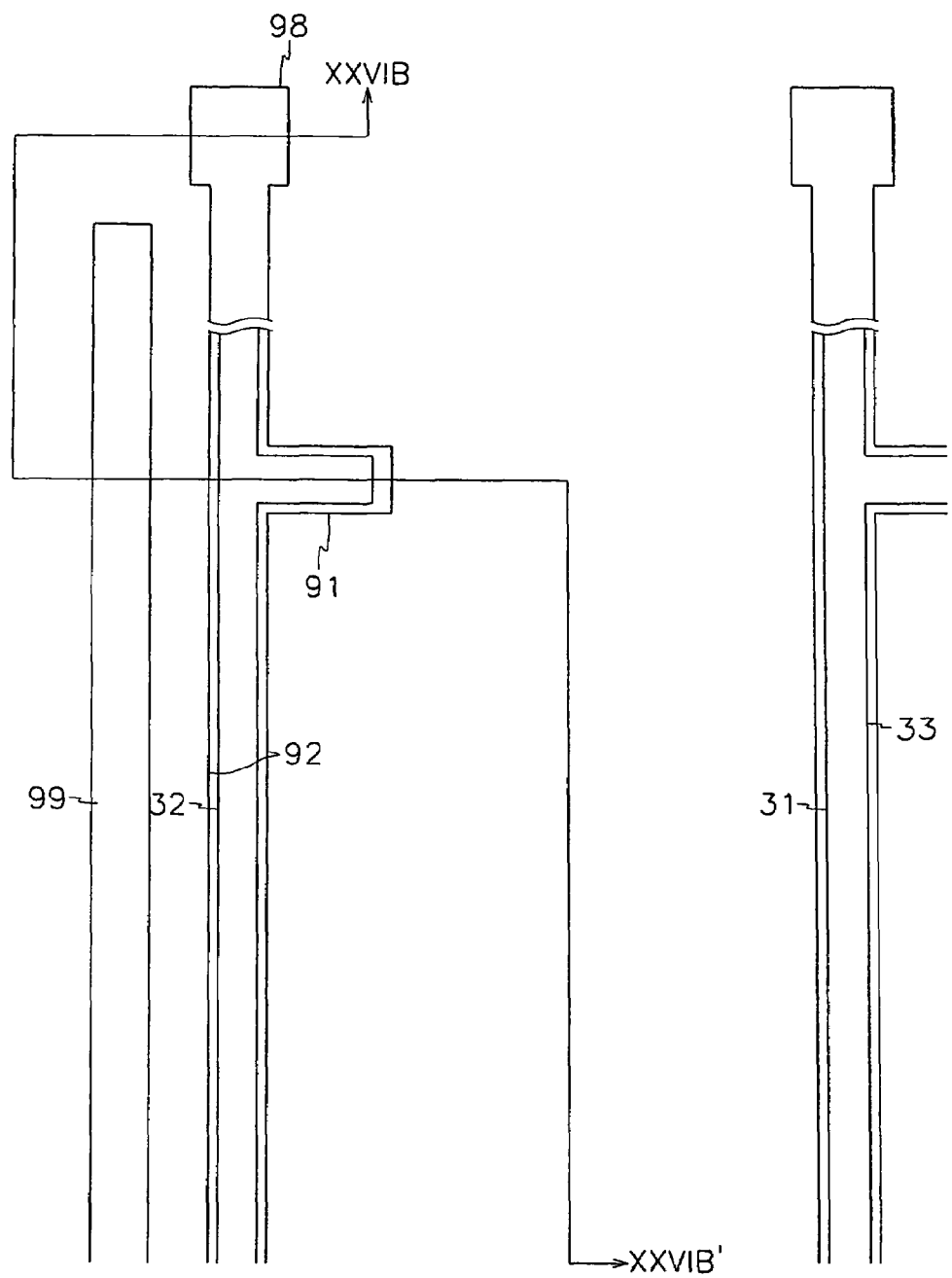
FIG. 26A is a layout view of a TFT array panel in a manufacturing step following FIG. 25A.
Figure 26B:
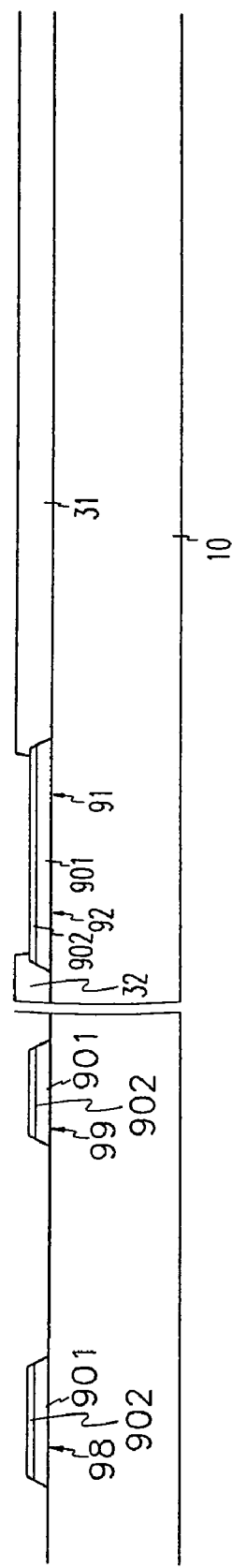
FIG. 26B is a cross-sectional view taken along the line XXVIB-XXVIB' of FIG. 26A.

Next, as shown in FIGS. 26A and 26B, red, green and blue resins having a photosensitive properties are sequentially coated and patterned by a photolithography process using a mask to form red, green and blue color filters 31, 32 and 33. At this time, it is desirable that the resins have heat-resistivity enough to withstand the range of over 350° C. As shown in the drawings, it is desirable that the edges of color filters 31, 32 and 33 overlap the data wire 91 and 92.

Figure 27A:
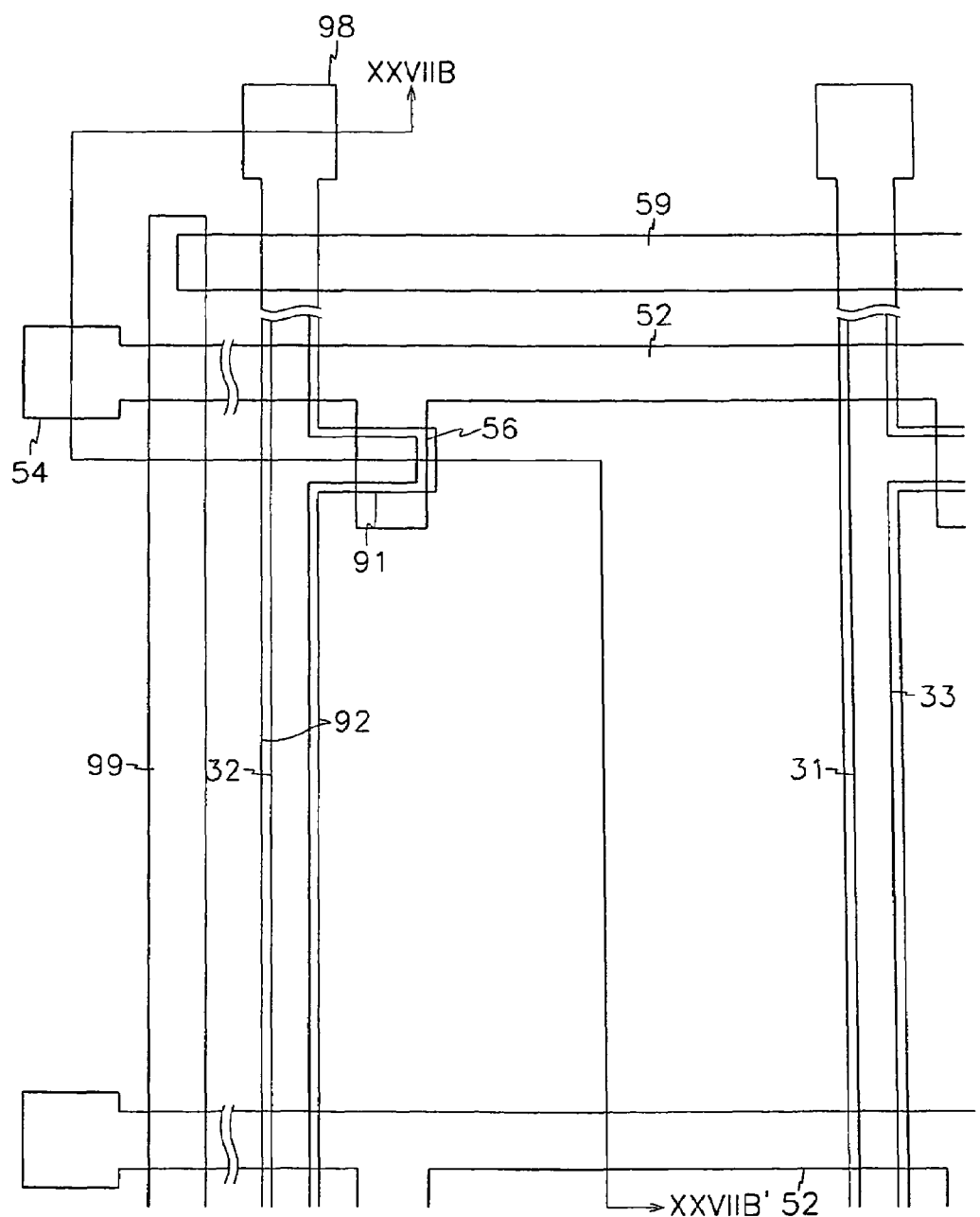
FIG. 27A is a layout view of a TFT array panel in a manufacturing step following FIG. 26A.
Figure 27B:
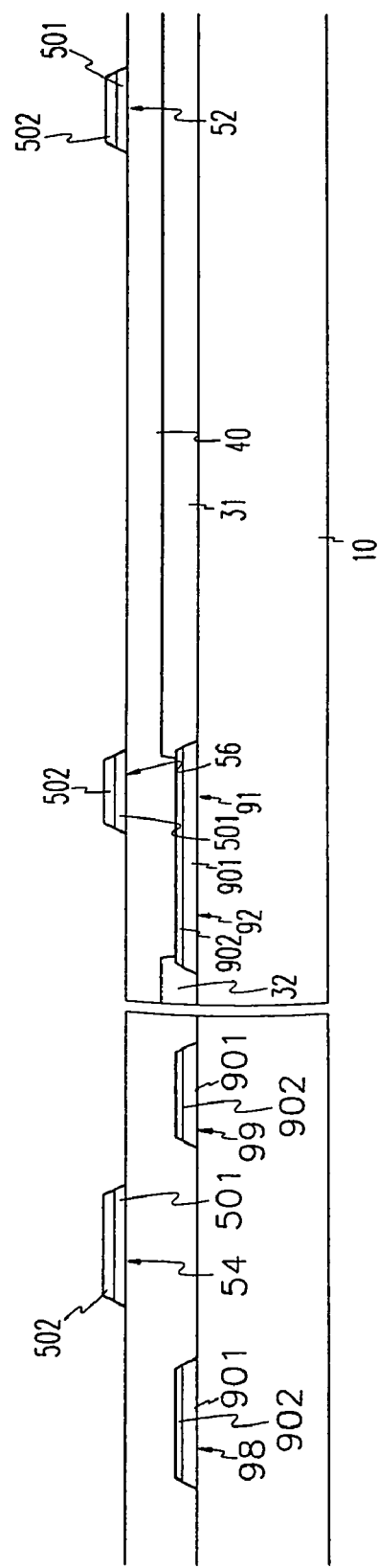
FIG. 27B is a cross-sectional view taken along the line XXVIIB-XXVIIB' of FIG. 27A.

Next, as shown in FIGS. 27A and 27B, an organic insulating layer 40 made of an organic material having a heat-resistivity over 350.degree. C. and good planarization properties, such as bisbenzocyclobutene (BCB) and perfluorocyclobutene (PFCB) is deposited on the substrate 10.

Next, a lower layer 501 of conductive material having good contacting properties (particularly with ITO) such as chromium, molybdenum, titanium, molybdenum nitride and chromium nitride, and an upper layer 502 of another conductive material having a low resistivity such as aluminum or aluminum alloy, copper or copper alloy, and silver-based material is deposited on a substrate 10 by such methods as sputtering, and patterned to form a gate wire including a gate line 52, a gate pad 54, and a gate electrode 56 by wet or dry etching through photolithography process.

Here, as above described, when considering a pixel wire 111, 112 and 113 made of indium tin oxide, the gate wire 52, 54 and 56 have double-layered structure including the low layer 501 and the upper layer 502. But, the gate wire 52, 54 and 56 may have a single-layered structure made of conductive material having a low resistivity such as aluminum and aluminum alloy, when forming the pixel wire 111, 112 and 113 of indium zinc oxide.

Figure 28A:
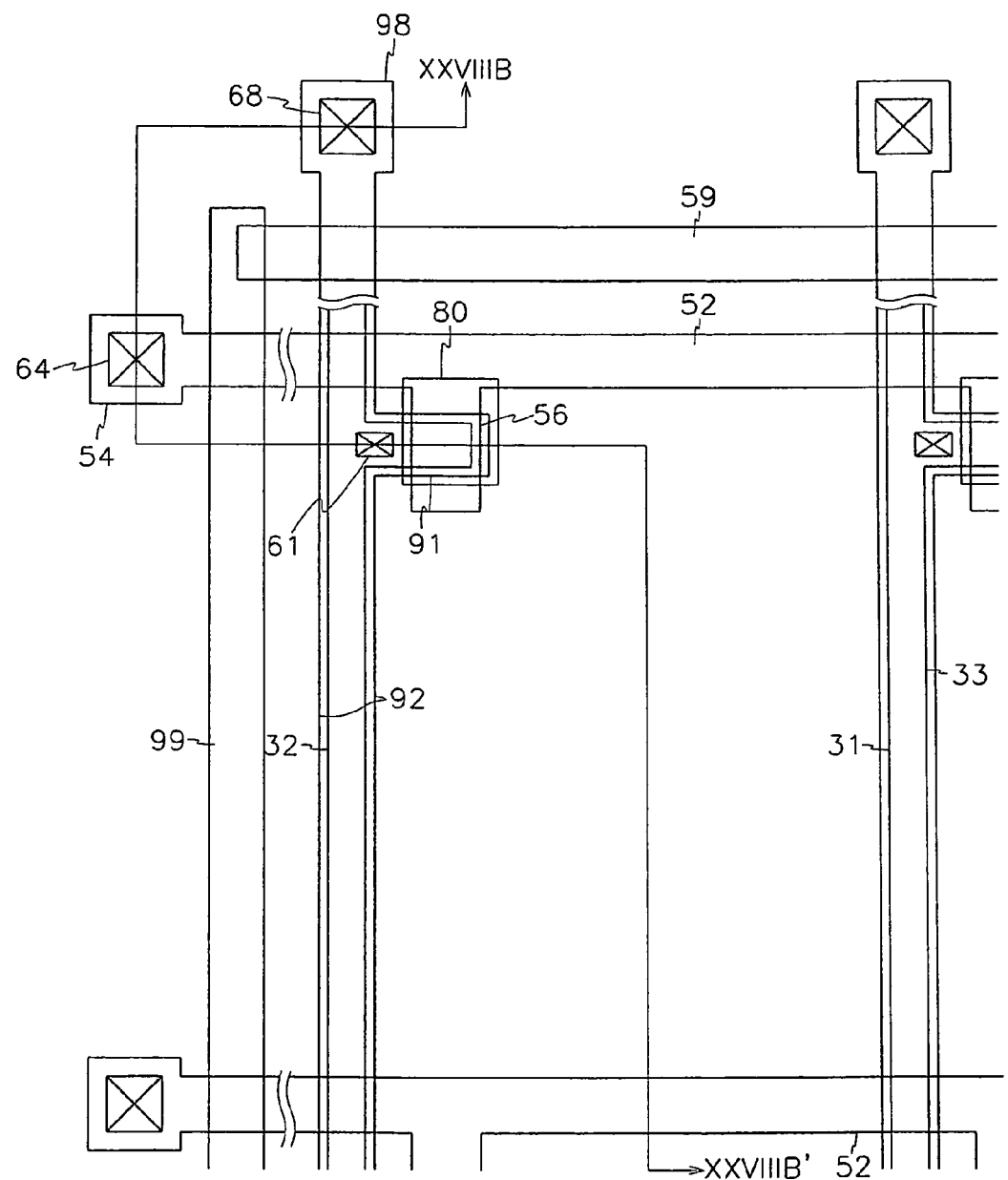
FIG. 28A is a layout view of a TFT array panel in a manufacturing step following FIG. 27A.
Figure 28B:
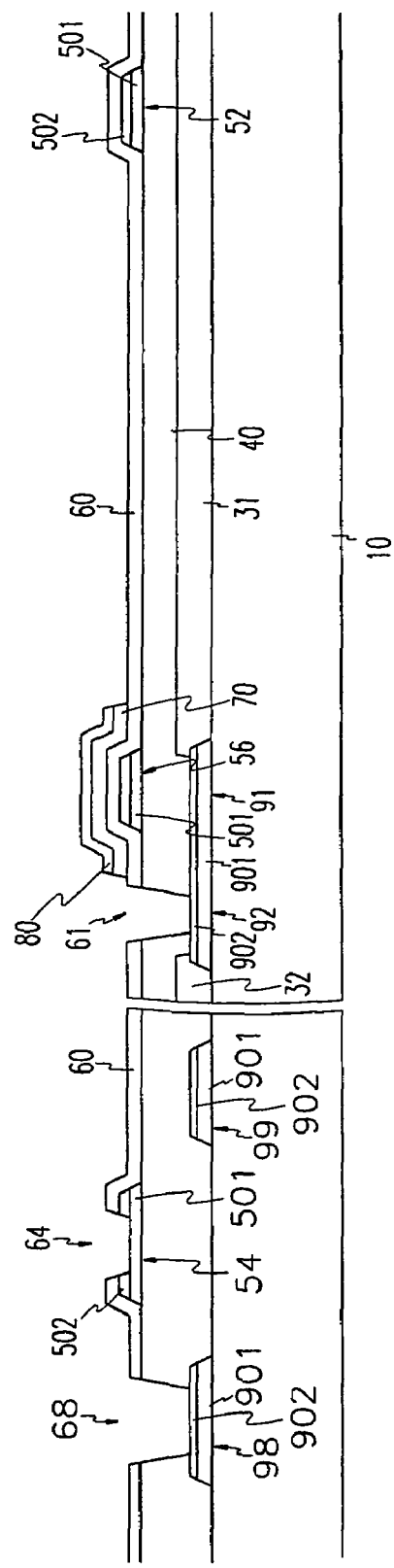
FIG. 28B is a cross-sectional view taken along the line XXVIIIB-XXVIIIB' of FIG. 28A.

Next, as shown in FIGS. 28A and 28B, a gate insulating layer 60, a amorphous silicon semiconductor layer 70, and a doped amorphous silicon ohmic contact layer 80 are sequentially layered by such methods as chemical vapor deposition (CVD), and patterned along with the organic insulating layer 40 to form the semiconductor layer 70 and ohmic contact layer 80, which are both island shaped, and the organic insulating layer 40 having contact holes 61, 64 and 68 exposing the data line 92, the gate pad 54 and the data pad 98, respectively. At this time, the portions of the semiconductor layer 70 and ohmic contact layer 80 must be removed on the portions except for the gate electrode 56, the gate insulating layer 60 along with them must be removed on the portion of the gate pad 54 to form contact hole 64, and the organic insulating layer 40 along with them must be removed on the portions of the data line 92 and the data pad 98 to form contact holes 61 and 68. To obtain this etch step through photolithography process using one mask, it is desirable that a photoresist pattern having different thickness according to different positions as an etch mask, will be described with referring to FIG. 29.

Figure 29:
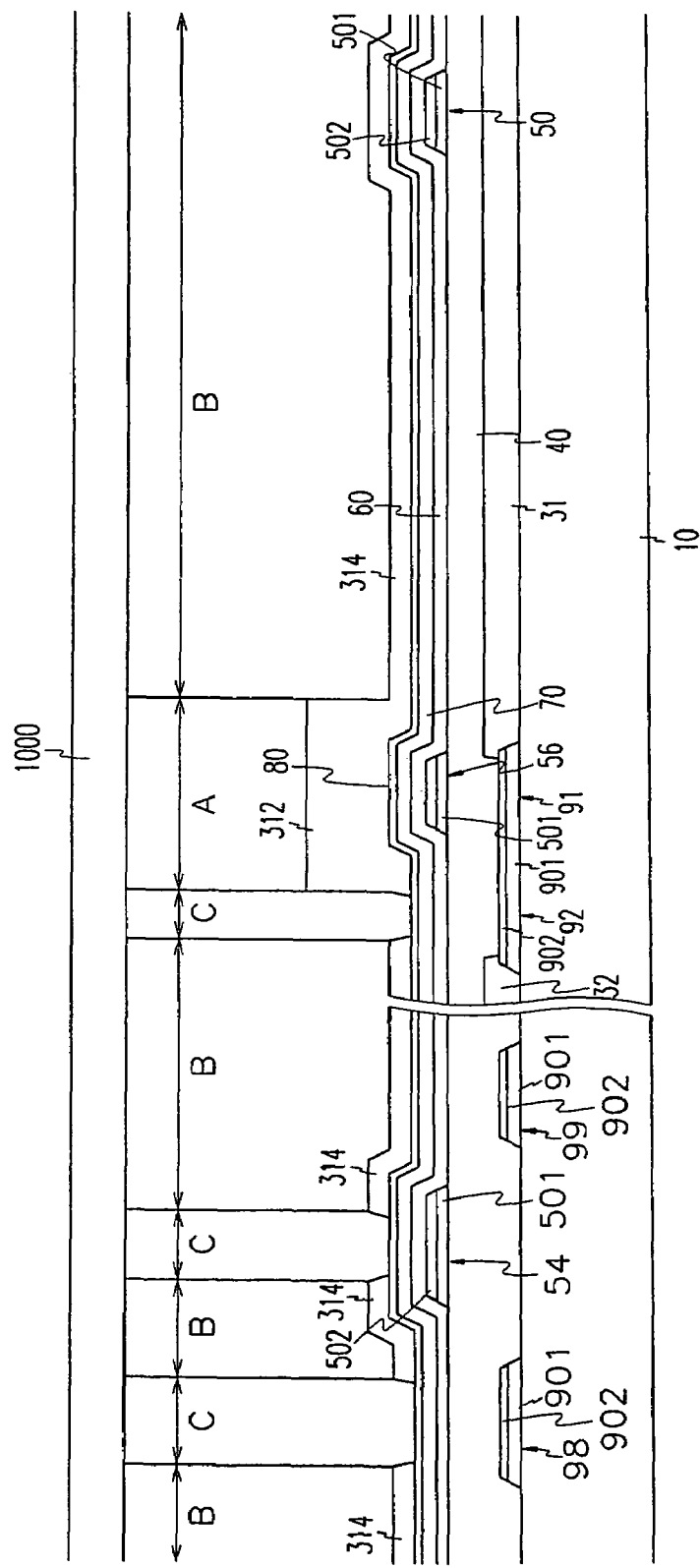
FIG. 29 is a cross-sectional view taken along the line XXVIIIB-XXVIIIB' of FIG. 28A in a manufacturing step following FIG. 27B.

As shown in FIG. 29 a photoresist layer having a thickness of 1 μm to 2 μm is coated on the ohmic contact layer 80.

Thereafter, the photoresist layer is exposed to light through a second mask and developed to form photoresist patterns 312 and 314 as shown in FIG. 29. At this time, the first portion 312 of the photoresist pattern located on the gate electrode 56 is thicker than the second portion 314 of photoresist pattern located over the other portion. Additionally, the third portion corresponding to the portion on the data line 92, the data pad 98 and the gate pad 54, which is located at portion C, is thinner than the second portion. The third portion may have a thickness that depends on the etching method. For example, the third portion has substantially zero thickness when using a wet etch, but the third portion may have a non-zero thickness when using a dry etch At this time, the thickness ratio between the second portion 314 and the first portion 312 depends on the etch conditions which will be described later. However, it is preferable that the thickness of the second portion 314 is equal to or less than half of that of the first portion 312, or for example, less than 4,000 Å. More preferably, the thicknesses of the second and first portions are respectively less than 4,000 Å.

There are many methods to control the thickness of the photoresist layer according to positions by using the second mask 1,000 having different transmittance depending on positions, like the second example.

Referring back to FIG. 29, the photoresist pattern 314 and the layers thereunder including the ohmic contact layer 80, the semiconductor layer 70, the gate insulating layer 60 and the organic insulating layer 40 are next subject to an etching process. Firstly, the ohmic contact layer 80, the semiconductor layer 70, and the gate insulating layer 60 are etched by using the photoresist pattern 312 and 314 as an etch mask to form contact hole 64 exposing the gate pad 54, and to expose the organic insulating layer 40 corresponding the portion C. Then, the exposed organic insulating layer 40 is etched at the portion C by using the photoresist pattern 312 and 314 as an etch mask to form contact holes 61 and 68, and the second portion 314 of the photoresist pattern is completely removed. Here, ashing or plasma etching step may be added to remove the remaining photoresist residue on the portion C. Plasma gas or microwaves are used in the ashing step, and oxygen is an example of one of the compositions mainly used.

Thereafter, contact holes 61, 64 and 68 are completed, and the ohmic contact layer 80, and the semiconductor layer 70 of the portions A and B, and the first portion 312 of the photoresist pattern remains.

Next, the ohmic contact layer 80 and the semiconductor layer 70 of the portion B are removed by using the first portion 312 of the photoresist pattern as an etch mask to form the ohmic contact layer 80, and the semiconductor layer 70 with an island shape on the gate insulating layer 60 of the gate electrode 56. At this time, it is desirable that the ohmic contact layer 80, and the semiconductor layer are etched by a dry etching method under the condition of a large etch selectivity rate over 10:1 between the gate insulating layer 60 and the semiconductor layer 70.

Finally, the first portion 314 of the photoresist pattern is removed.

At this time, a silicide layer may be added on the ohmic contact layer 80 by depositing a metal for silicide such as chromium and molybdenum, annealing the metal layer, and removing the metal layer, and it is desirable that the upper layer 502 of the gate pad 54, which is exposed through contact hole 64 and is made of aluminum, is removed by using aluminum etch step on the whole surface.

Figure 30:
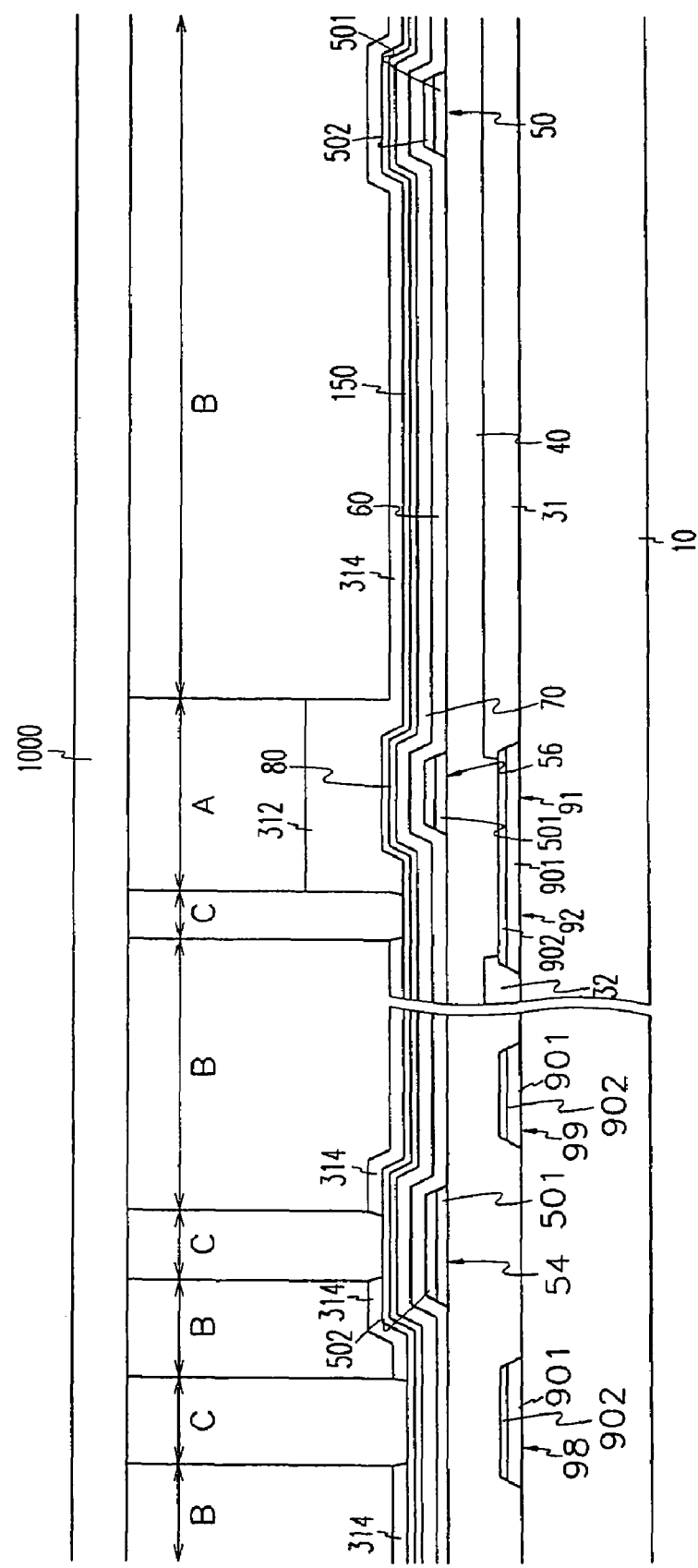
FIGS. 30 and 31 are a cross-sectional views of a TFT array panel in the fourth manufacturing step according to another embodiment of the present invention.
Figure 31:
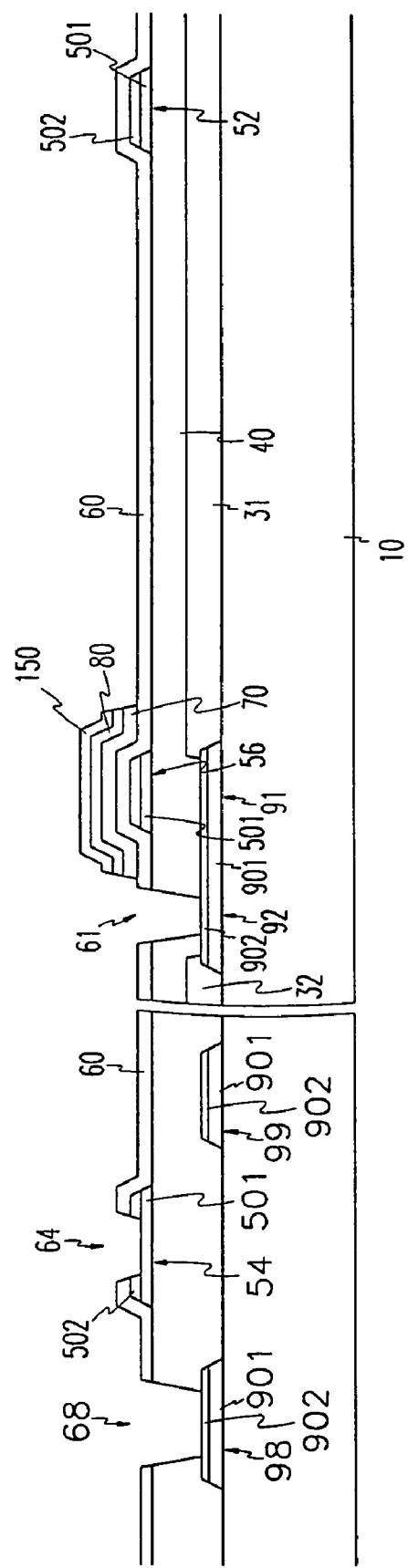

Differently, as shown in FIG. 30, a metal layer 150 for silicide such as chromium and molybdenum is sequentially deposited along with the layers 60, 70 and 80, and patterned to the same shape as the semiconductor layer 70 and the ohmic contact layer 80, as shown in FIG. 31. Next, an annealing step is executed to form a metal silicide between the metal layer 150 and the ohmic contact layer 80, and then the metal layer 150 may be removed or not. At this time, it is desirable that the metal layer 150 made of chromium is with the thickness of less than 500 Å. The reason is that the metal layer 150 of chromium with the thickness of less than 500 Å may be dry-etched along with the three layers 60, 70 and 80 to simplify the manufacturing process. Of course, in this case, it is desirable that the lower layer 501 of the gate pad 54 is exposed through contact hole 61 to obtain the contacting reliability with an ITO layer in pad portions.

On the other hand, another metal layer made of conductive material to reduce contact resistance between a source and a drain ITO electrodes 111 and 113, and the ohmic contact layer 80 may be used in place of the silicide metal layer 150, and it is desirable that such a metal layer is dry-etched.

Figure 32A:
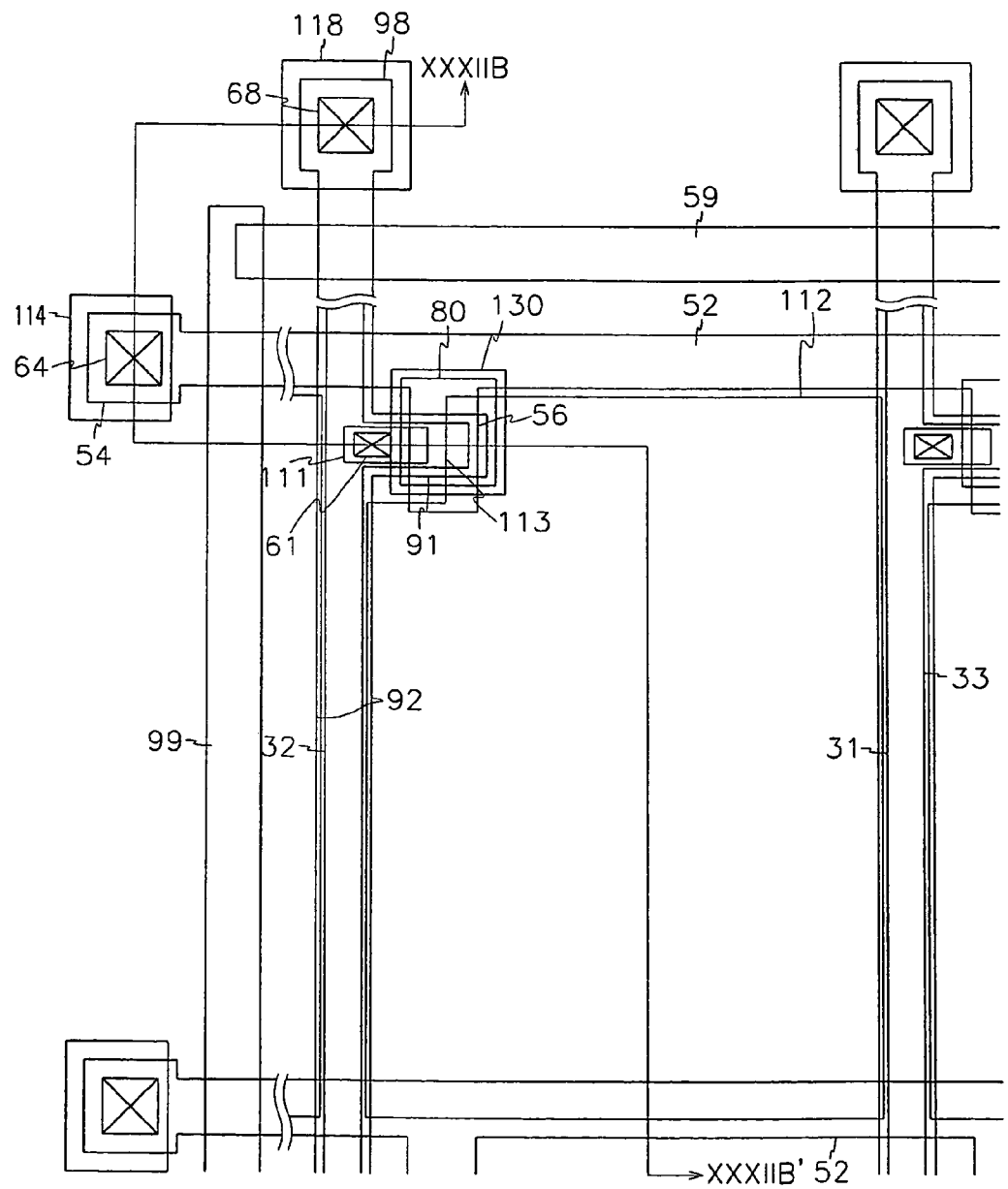
FIG. 32A is a layout view of a TFT array panel in the fifth manufacturing step according to the third example of the present invention.
Figure 32B:
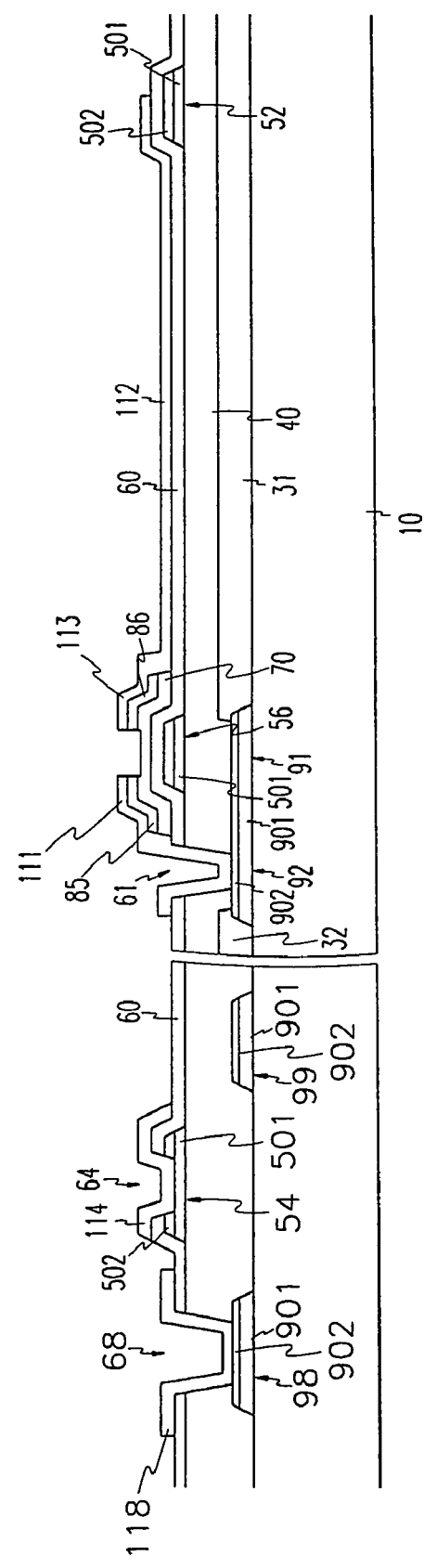
FIG. 32B is a cross-sectional view taken along the line XXXIIB-XXXIIB' of FIG. 32A.

Next, as shown in FIGS. 32A to 32B, an ITO layer is deposited to a thickness of 400 Å to 500 Å, and etched by using a sixth mask to form a pixel electrode 112, a source ITO electrode 111, a drain ITO electrode 113, a redundant gate pad 114, and a redundant data pad 118. Indium tin oxide may be used in place of indium zinc oxide.

Then, the ohmic contact layer 80 is etched by using the source and drain ITO electrodes 111 and 113 as a mask and a plasma dry etch to divide the ohmic contact layer 80 with the center of the gate electrode 56, and to expose the central portion of the amorphous silicon layer 70 between the ohmic contact layers 85 and 86. Oxygen plasma may be executed to obtain the stabilization of the surface of the amorphous silicon layer 70. As shown in FIG. 31, when the silicide metal layer 150 remains, the silicide metal layer 150 between the source ITO electrode 111 and the drain ITO electrode 113 must be removed along with the ohmic contact layer 80 to expose the semiconductor layer 70 between the source ITO electrode 111 and the drain ITO electrode 113. Then, the portion of the silicide metal layer (not shown) remains between the ohmic contact layers 85 and 86, and the source and the drain ITO electrodes 111, 113.

Finally, as shown in FIGS. 23 and 24, an insulating material such as silicon nitride and silicon oxide, and a photosensitive resist having good light absorption properties such black resin are deposited on a passivation layer 100 and a colored organic layer 130. Next, the colored organic layer 130 is exposed by light and developed through photolithography process using the fifth mask, and the passivation layer 100 is patterned by using the developed organic 130 as an etch mask. Here, the colored organic layer 130 blocks the light incident to the semiconductor layer 70 of the thin film transistor, and may be formed in various shapes to block the light leakage around the neighborhood of the gate wire and the data wire, which will be described referring to appropriate drawings. Furthermore, the colored organic layer 130 may be used as a spacer maintaining the interval between the lower substrate 10 and the upper substrate 200 by regulating the height of the colored organic layer 130.

On the other hand, to complete an upper panel 201, a common electrode 210 that generates an electric field with the pixel electrode 112 of the lower panel 101 and is made of transparent material such as ITO and IZO, is formed on an upper insulating substrate 200.

The third embodiment according to the present invention may increase the aperture ratio, by forming the vertical and the horizontal portions 59 and 99 of a black matrix with the same layer as the gate line 52 and the data line 92, and using the gate line 52 and the data line 92 as the black matrix, because it is not necessary to consider the alignment between the lower substrate and the upper substrate.

Furthermore, because the gate insulating layer 60 and the passivation layer 100 having a low dielectric constant are between the data line 92 and the pixel electrode 112, the coupling capacitance may be minimized therebetween. Accordingly, the characteristics of the liquid crystal display as well as the aperture ratio is improved, because it is not necessary to grant the interval between the data line 92 and the pixel electrode 112.

Furthermore, the gate insulating layer 60 formed only between the pixel electrode 112 and the gate line 52 may obtain enough storage capacitance therebetween.

Furthermore, by blocking the light incident from the lower direction of the substrate 10 through the blocking light layer 91, the size of the gate electrode 56 may be optimized and parasitic capacitance between the gate electrode 56, and the source and drain ITO electrodes 111 and 113 may be minimized, and the deviation of them is minimized. Accordingly, display quality defects such as stitch and flicker, and the leakage current may be minimized. Also, the organic insulating layer 40 formed between the gate line 52 and the data line 62 decreases the short circuit between then And the minimized thickness of the gate insulating layer 60 may improve the quality of thin film transistor.

In the method for manufacturing the thin film transistor according to the third embodiment, by forming the color filters 31, 32, 33 of low cost before forming the thin film transistor of high cost, the inferiorities generated among the manufacturing process of the color filters does not affect the final process yield, accordingly manufacturing cost may be minimized. Also, because the color filters and the thin film transistor are formed through different manufacturing process system, the process efficiency may be maximized. That is to say, after completing the substrate having color filters covered by the organic insulating layer 40 through an outside supplier, and the thin film transistor array panel may be manufactured through photolithography process using four masks in an additional manufacturing process system.

Furthermore, the wire 52 and 92 of aluminum, aluminum alloy, silver or silver alloy may improve the characteristics of display devices in large scale LCDs.

Furthermore, by using the colored organic layer 130 as a black matrix blocking the light incident to the semiconductor layer 70 of the thin film transistor and as a spacer maintaining the interval between the two substrates 101 and 102, the step of dispensing spacers to maintain the interval between the two substrates 101 and 102 may be omitted in this manufacturing method. This manufacturing method may be adapted to manufacture a liquid crystal display having an interval between the two substrate 101 and 102 less than 3 μm.

Furthermore, by forming only a common electrode on the upper substrate 200, the thickness of the upper substrate may be minimized. And no restrictions for material of the upper substrate may minimize the manufacturing cost. The thin film transistor array panel according to the present invention is easily adapted to a liquid crystal display of patterned vertical align type (PVA) having a common electrode including a plurality of opening portions Furthermore, by completing the thin film transistor panel according to the present invention using five masks, the manufacturing method may be simplified, minimizing the cost.

In the meantime, this manufacturing method may be adapted to manufacturing a TFT array panel including a plurality of common electrode arranged parallel to a plurality of pixel electrode to thereby control orientation directions of the liquid crystal molecules aligned over the substrate parallel thereto.

Next, a TFT array panel having a different structure of the blocking light layer 91 and the colored organic layer 130 to block the light leakage between the pixels will be described referring to FIG. 33.

Figure 33:
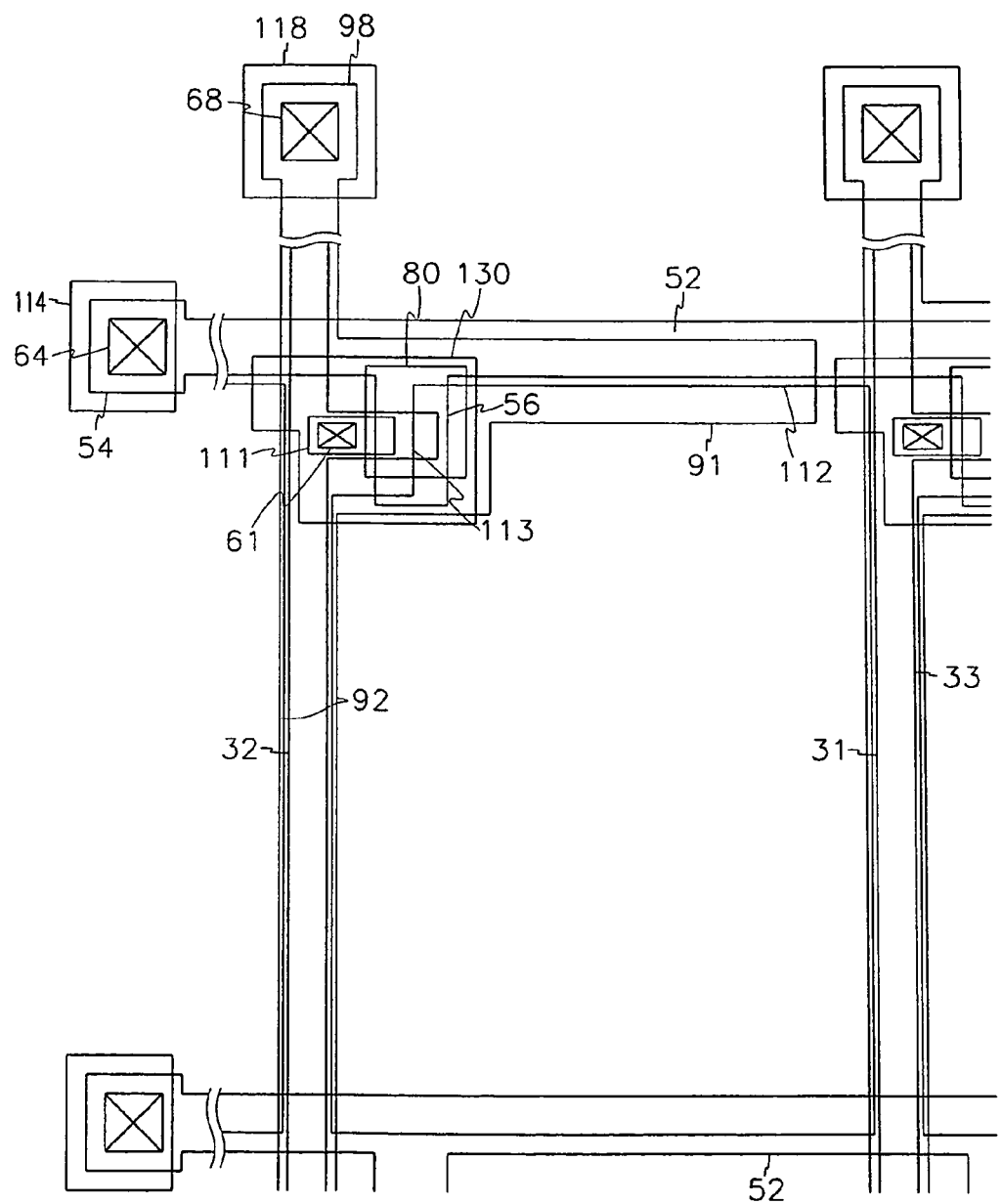
FIG. 33 is a layout view of a TFT array panel for an LCD according to a fourth example of the present invention.

FIG. 33 is a layout view of a TFT array panel for an LCD according to the fourth example of the present invention.

As shown in FIG. 33, most of the structure according to the fourth example of the present invention is the same as that according to the third example.

However, a blocking light layer 91 is extended in horizontal direction to overlap a gate line 52 to block the light leakage between the pixels. Also, a colored organic layer 130 is extended in horizontal direction to be overlap the blocking light layer 91 to block light leakage between overlap the blocking light layer 91 and a data line 92, and completely covers the thin film transistor to block light leakage around the thin film transistor.

As above described, this structure may block the light leakage between the pixels.

In the third embodiment, the semiconductor layer 70 of an island shape and contact holes 61, 64 and 68 are formed through one photolithography process, but contact holes and a semiconductor layer may be formed through different photolithography process, will be described in detail referring to appropriate drawings.

Figure 34:
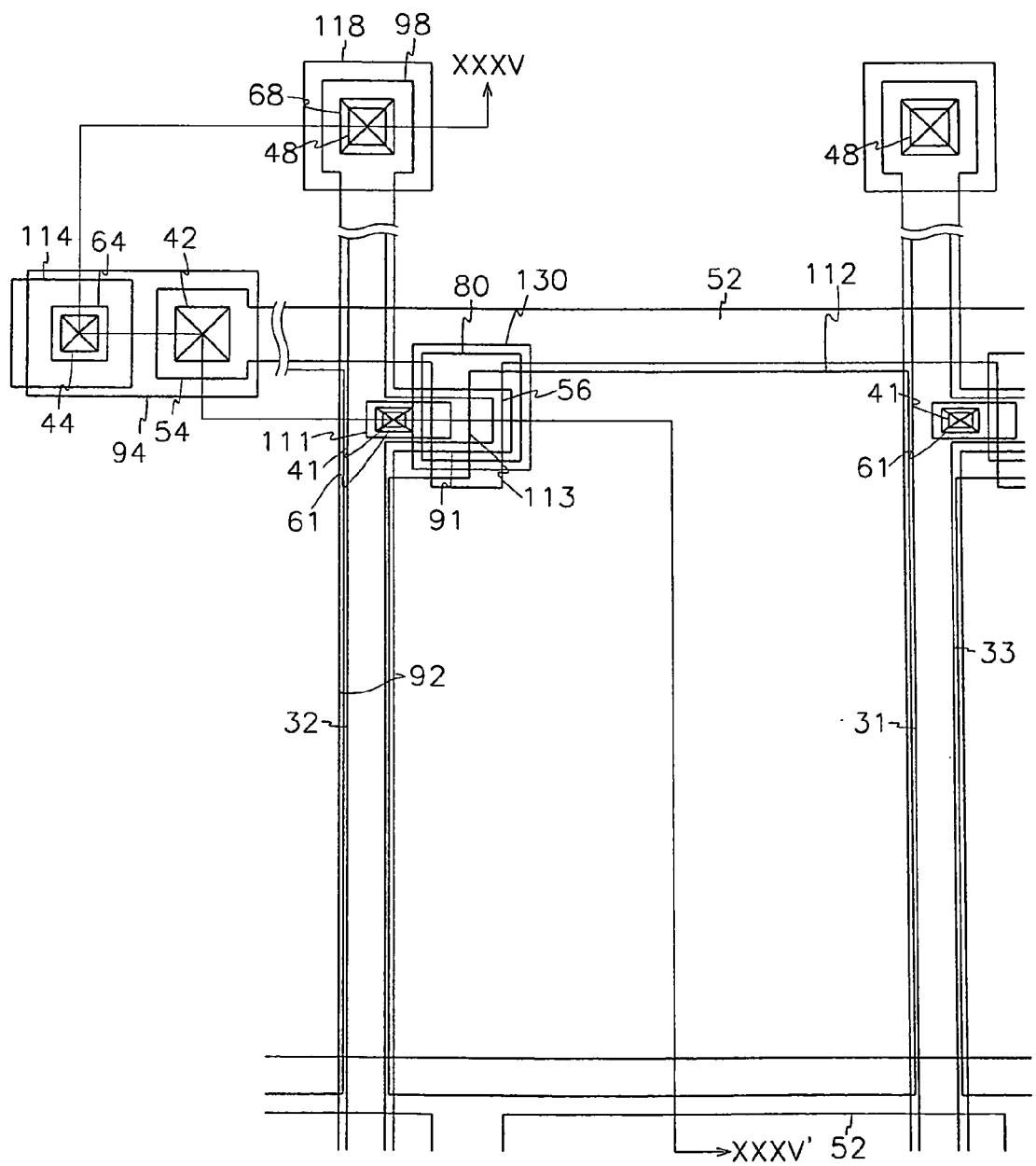
FIG. 34 is a layout view of a TFT array panel for an LCD according to a fifth example of the present invention.
Figure 35:
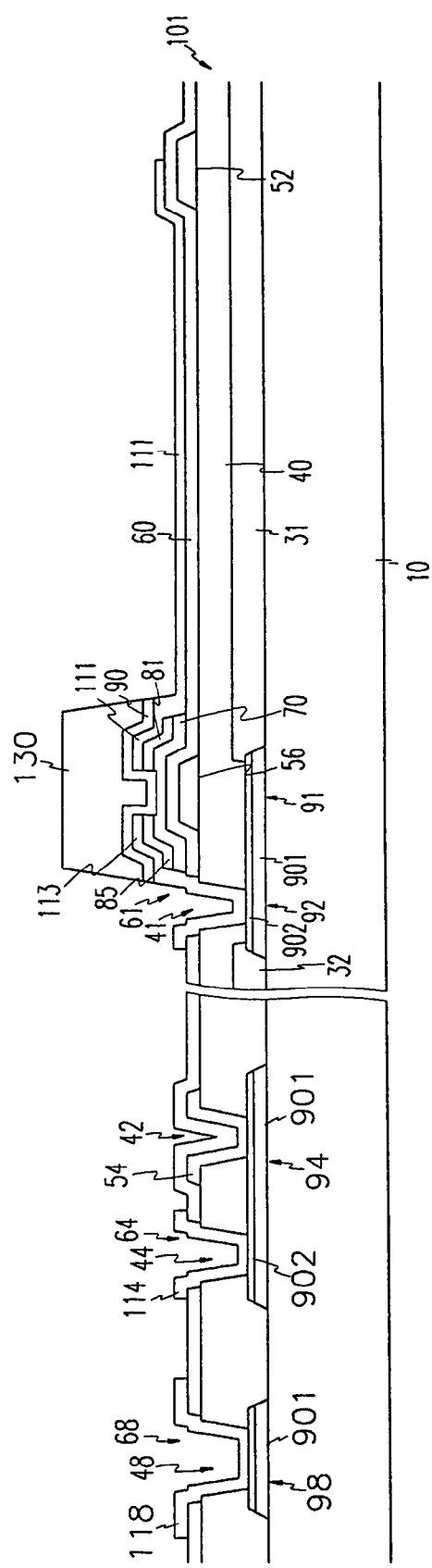
FIG. 35 is a cross-sectional view taken along the line XXXV-XXXV' of FIG. 34.

FIG. 34 is a layout view of a TFT array panel for an LCD according to the fifth example of the present invention, and FIG. 35 is cross-sectional view taken along the line XXXV-XXXV' of FIG. 34. In FIG. 35, an upper panel 201 opposing a lower panel 101 is omitted, because the upper panel 201 is the same structure as that of the third example.

As shown in FIGS. 34 and 35, most of the structure according to the fifth embodiment is similar to that of the third example.

However, a first redundant gate pad 94 including a lower layer 901 and an upper layer 902 is formed of the same layer as the data wire 91, 92 and 98, and an organic insulating layer has contact holes 41, 42, 44 and 48 respectively exposing a data line 92, the first redundant gate pad 94 and the data pad 98. Also, gate wires 52, 54 and 56 having a single-layered structure made of aluminum, aluminum alloy, copper or copper alloy is formed on the organic insulating layer 40. Here, the gate pad 54 is connected to the first redundant gate pad 94. A gate insulating layer 60 has contact holes 61, 64, 68 respectively exposing the data line 92, the first redundant gate pad 94 and the data pad 98, and a source ITO electrode 111 and a second redundant gate pad 114, which are respectively connected to the data line 92 and the first redundant gate pad 94 through 41 and 61, and 44 and 64, are formed on the gate insulating layer 60. Here, the second redundant gate pad 114 is electrically connected to the gate pad 54 via the first redundant gate pad 94.

A method for manufacturing a thin film transistor array panel according to a fifth example of the present invention will now be described with reference to the FIGS. 36A to 40C and FIGS. 34 to 35.

Figure 36A:
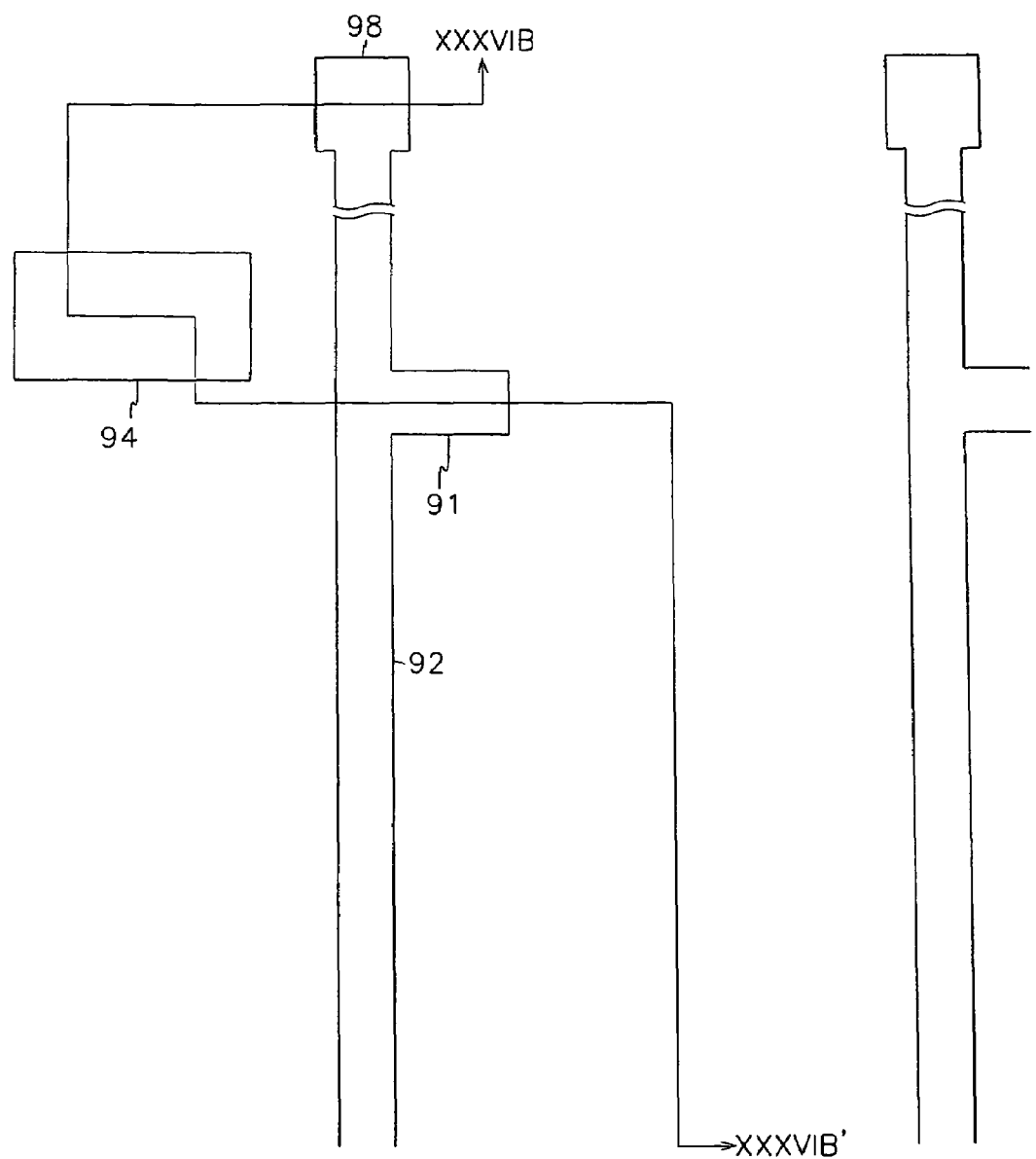
FIG. 36A is a layout view of a TFT array panel in the first manufacturing step according to the fifth example of the present invention.

As shown in FIGS. 36A and 36B, like the third embodiment, a data wire parts including a data line 92, a data pad 98 and a blocking light layer 91, and having a lower layer 901 and an upper layer 902, and a first redundant gate pad 94 is formed on a lower insulating substrate 10.

Figure 37A:
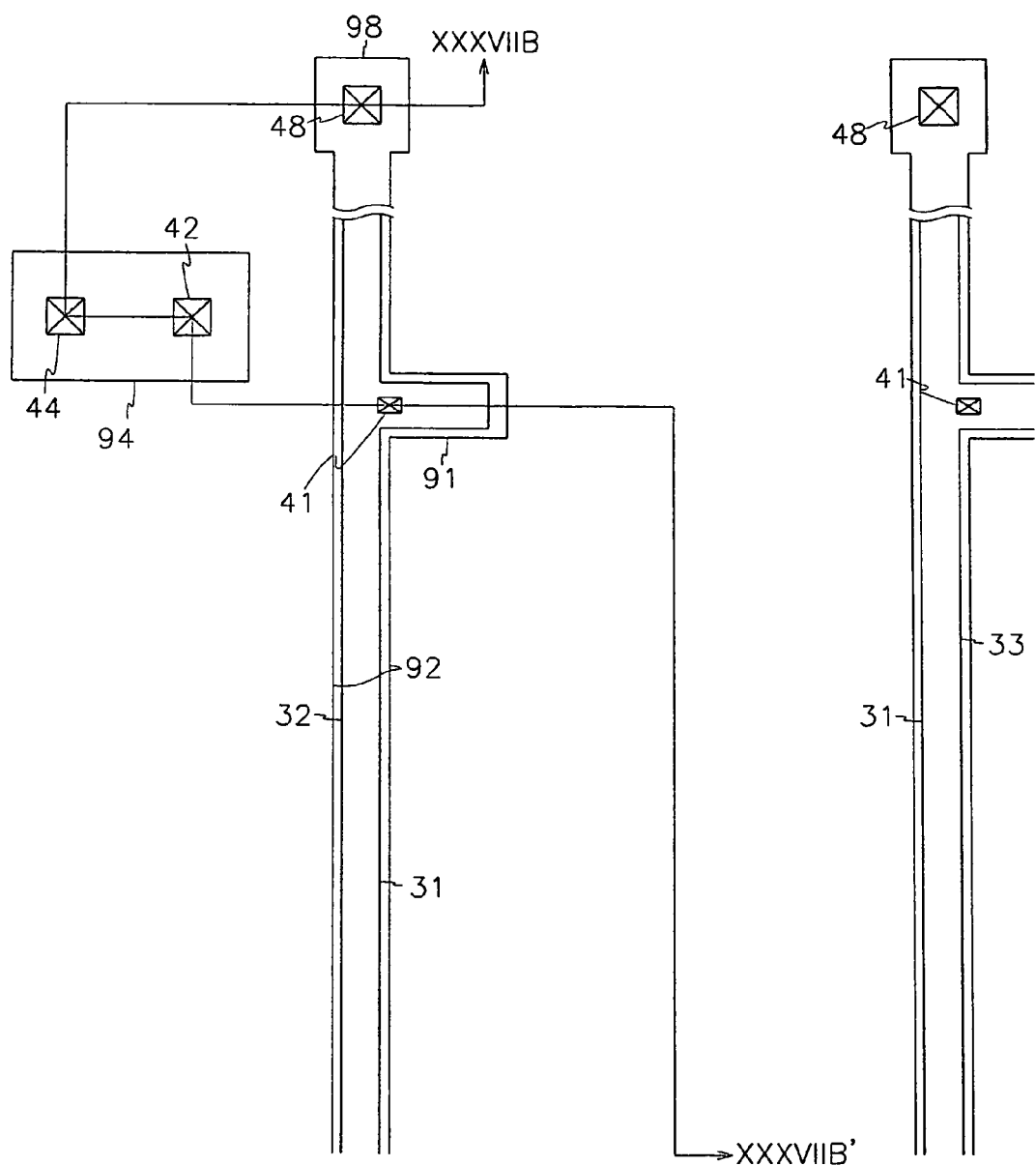
FIG. 37A is a layout view of a TFT array panel in a manufacturing step following FIG. 36A.
Figure 37B:
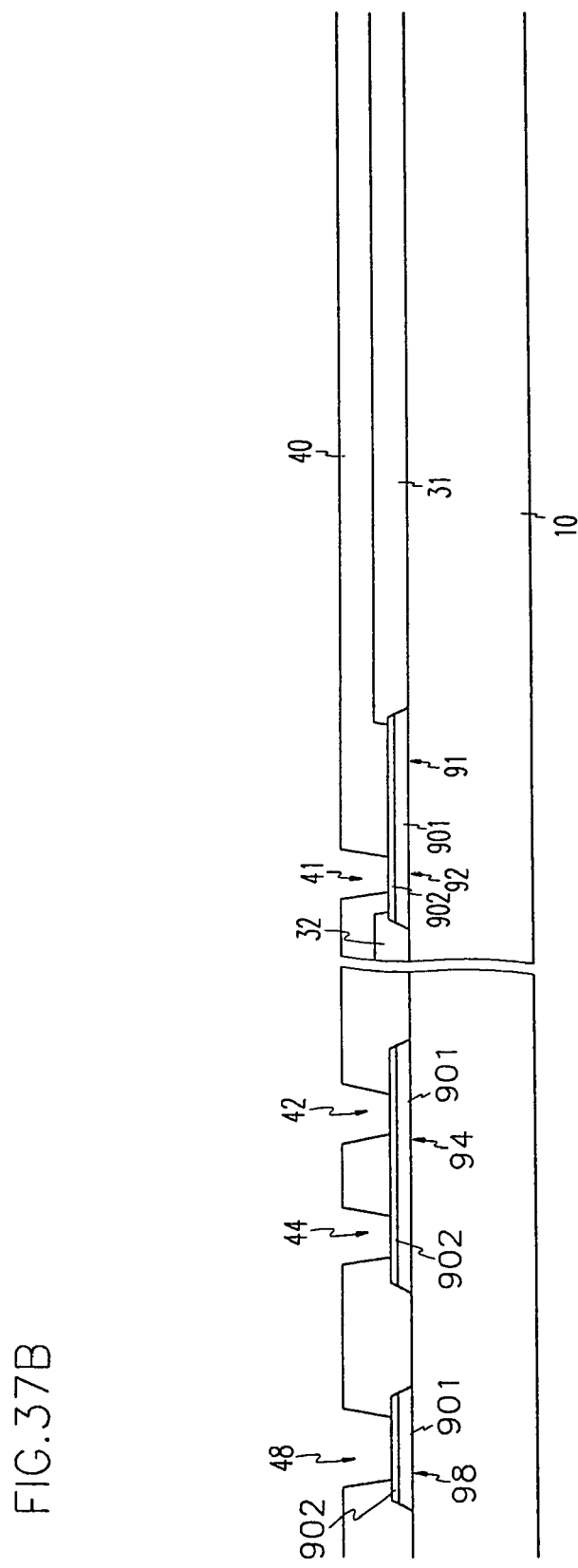
FIG. 37B is a cross-sectional view taken along the line XXXVIIB-XXXVIIB' of FIG. 37A.

Next, as shown in FIGS. 37A and 37B, red, blue and green color filters 31, 32 and 33 made of photosensitive material of red, blue and green resin are sequentially formed by laser transcription, screen-printing, or offset printing without using a mask. Next, an organic insulating layer 40 having a heat-resistivity, low dielectric ratio, and good planarization properties is deposited on the substrate 10 and patterned to form contact holes 41, 42, 44 and 48 exposing the data line 92, the first redundant gate pad 94 and the data pad 98 by dry etching through photolithography process.

Figure 38A:
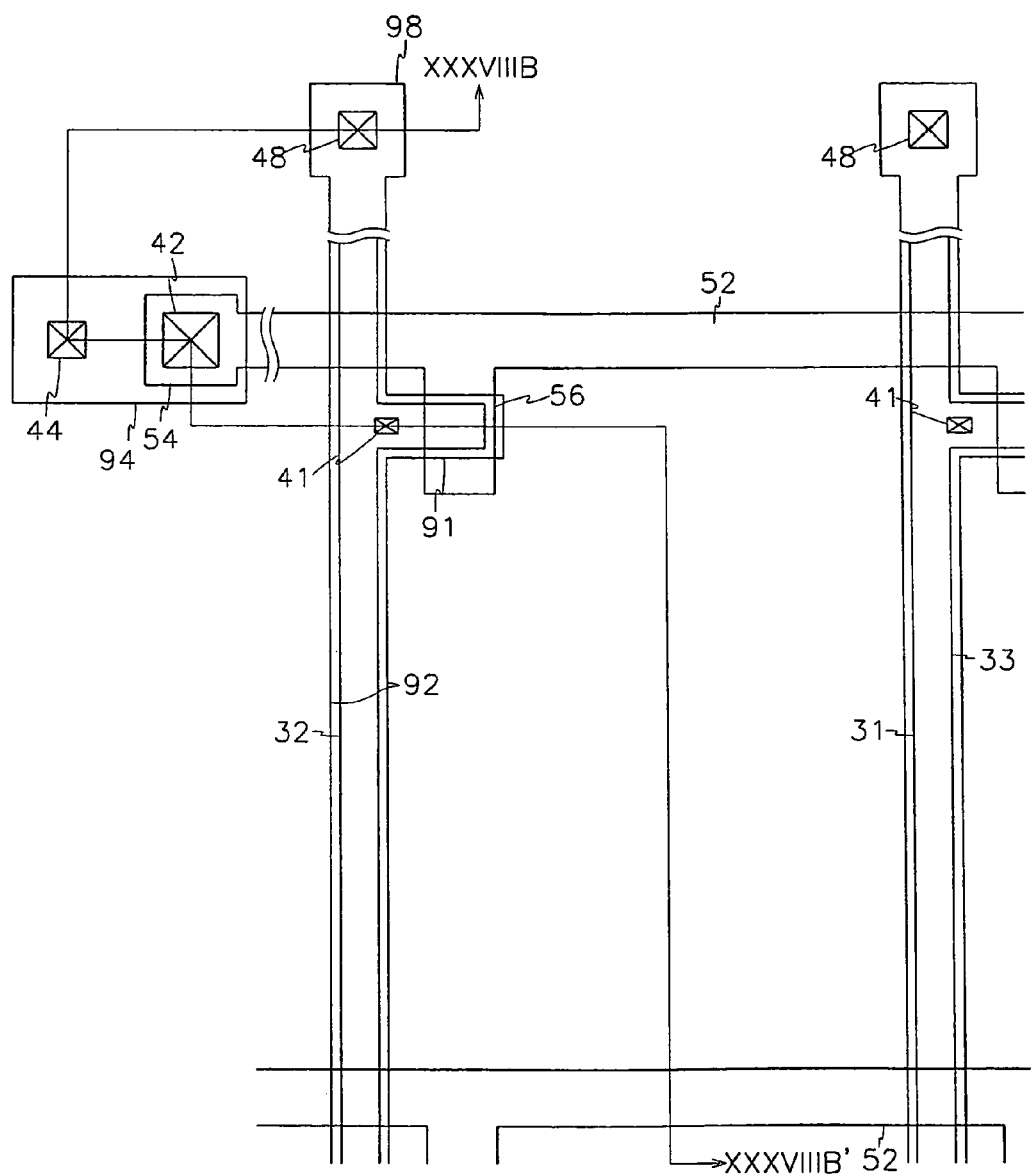
FIG. 38A is a layout view of a TFT array panel in a manufacturing step following FIG. 37A.
Figure 38B:
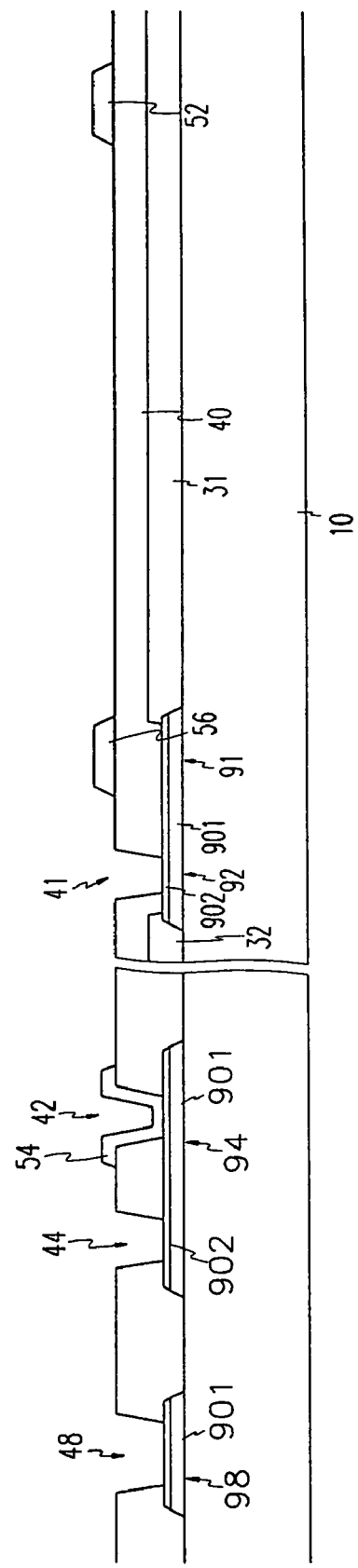
FIG. 38B is a cross-sectional view taken along the line XXXVIIIB-XXXVIIIB' of FIG. 38A.

Next, as shown in FIGS. 38A and 38B, a conductive layer having low resistivity such as aluminum, aluminum alloy, copper and copper alloy, and having a single-layered structure is deposited on a substrate 10 by a method such as sputtering, and patterned to form a gate wire parts 52, 54 and 56 through a photolithography process using a mask. At this time, the gate pad 54 is connected to the first redundant gate pad 94 through contact hole 42.

Figure 39A:
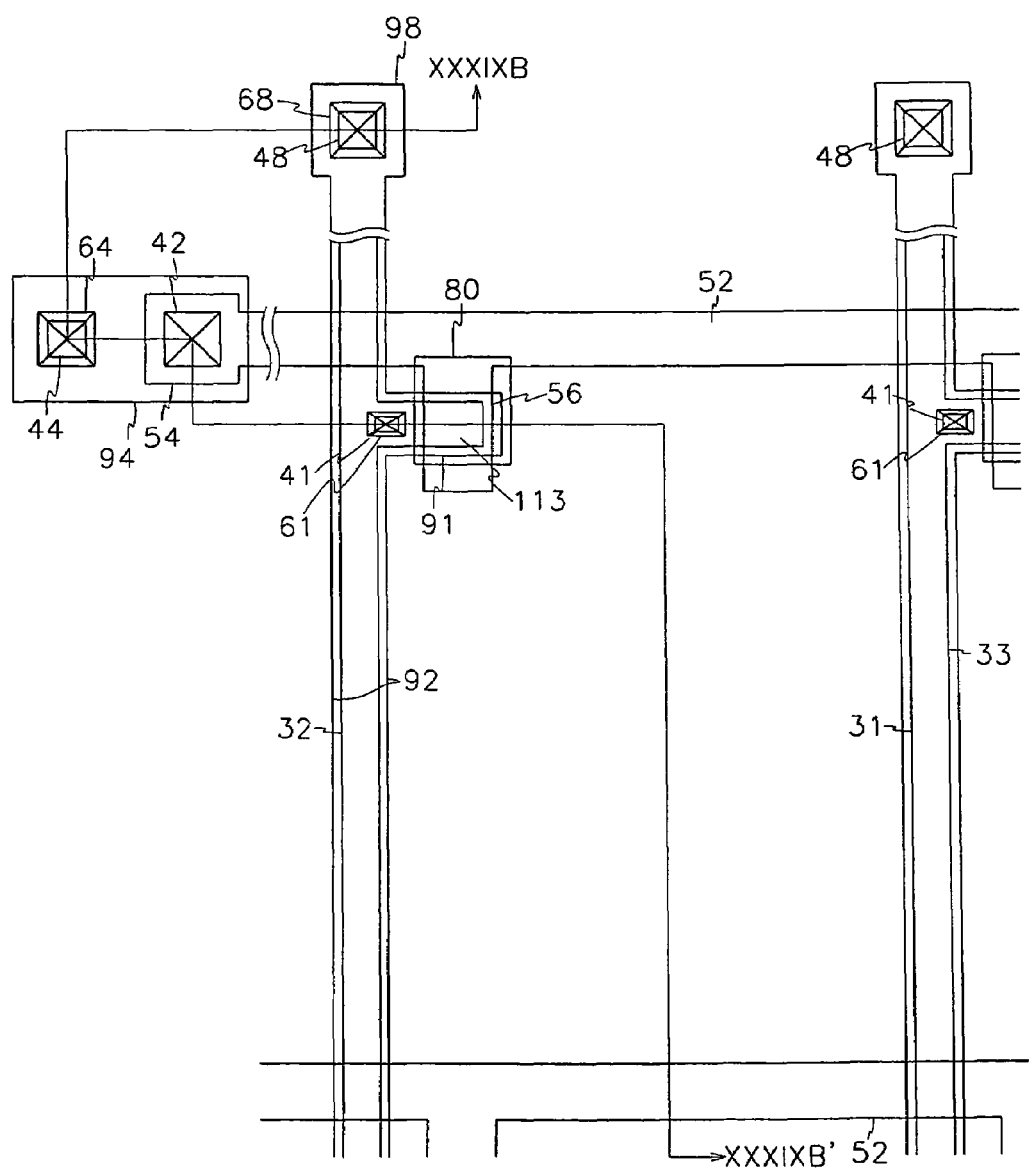
FIG. 39A is a layout view of a TFT array panel in a manufacturing step following FIG. 38A.
Figure 39B:
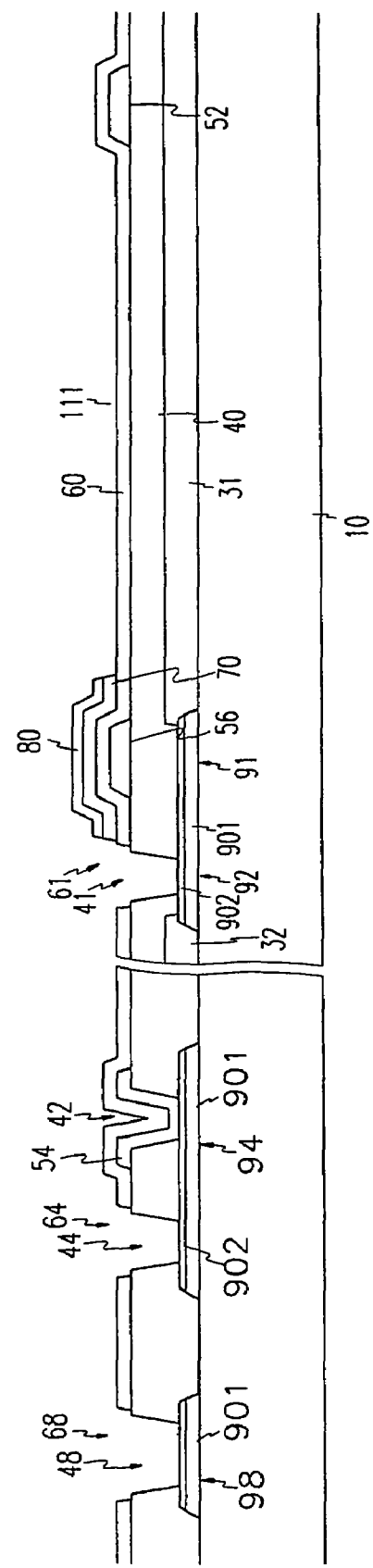
FIG. 39B is a cross-sectional view taken along the line XXIXB-XXIXB' of FIG. 39A.

Next, as shown in FIGS. 39A and 39B, a gate insulating layer 60, a semiconductor layer 70, and an ohmic contact layer 80 are sequentially deposited by such methods as chemical vapor deposition (CVD), and patterned through a photolithography process using a mask to form the semiconductor layer 70 and the ohmic contact layer 80 of an island shape, the organic insulating layer 40 having contact holes 41, 44 and 48, and the gate insulating layer having contact holes 61, 64 and 68. Also, at this time, the portions of the semiconductor layer 70 and ohmic contact layer 80 must be removed on the remaining portion expect for the portion on the gate electrode 56. The gate insulating layer 60 along with them must be removed on the portion of the first redundant gate pad 94, the data line 92 and the data pad 98 to form contact holes 64, 61 and 68. To obtain this etch step through a photolithography process using one mask, it is desirable that a photoresist pattern having different thickness depending on different positions as an etch mask, like the third embodiment.

Figure 40A:
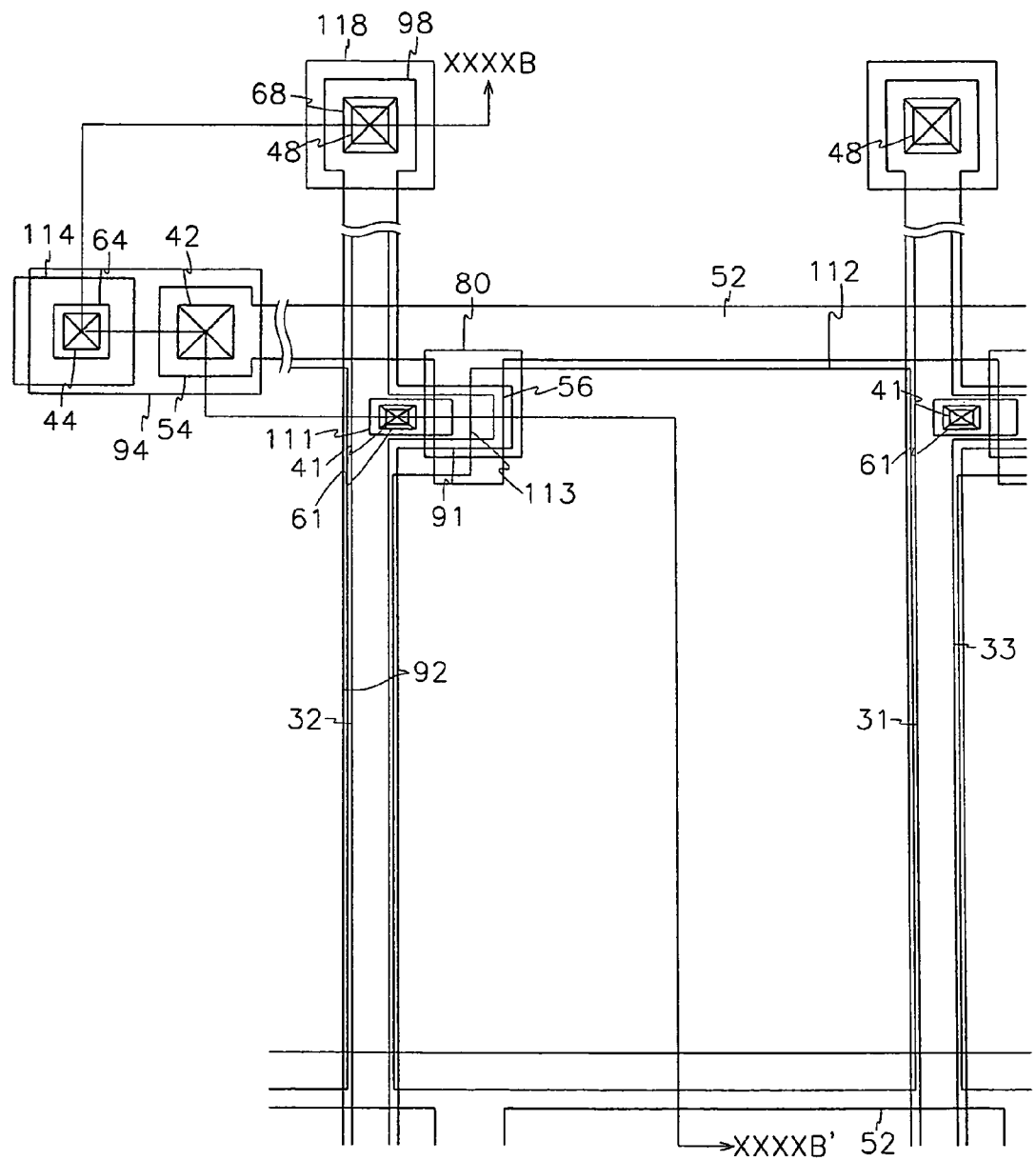
FIG. 40A is a layout view of a TFT array panel in the fifth manufacturing step according to the fifth example of the present invention.
Figure 40B:
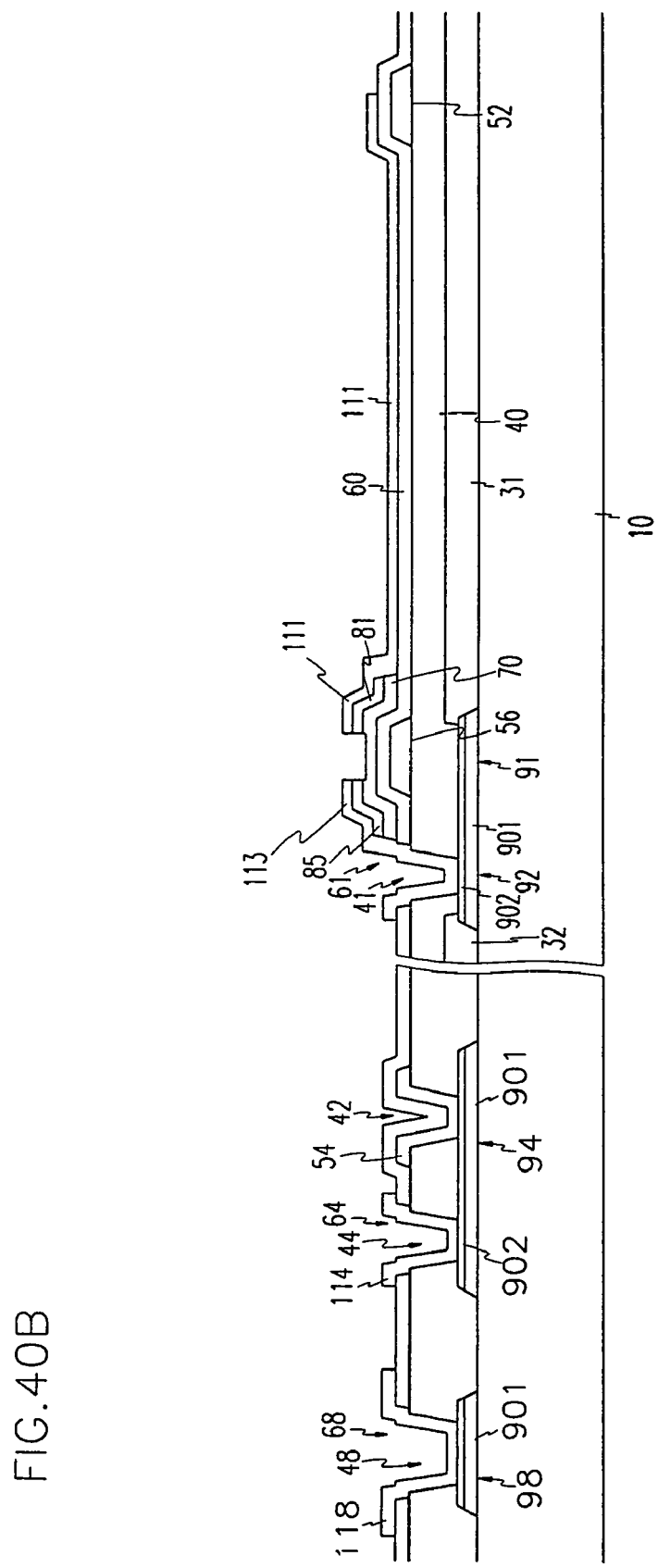
FIG. 40B is a cross-sectional view taken along the line XXXXIB-XXXXIB' of FIG. 40A.

Next, as shown in FIGS. 40A to 40B, an ITO layer is deposited to a thickness of 400 Å to 500 Å, and etched using a fourth mask to form a pixel electrode 112, a source ITO electrode 111, a drain ITO electrode 113, a second redundant gate pad 114, and a redundant data pad 118.

Then, the ohmic contact layer 80 is etched by using the source and drain ITO electrodes 111 and 113 as a mask and a plasma dry etch to divide the ohmic contact layer 80 around the center of the gate electrode 56, and to expose the central portion of the amorphous silicon layer 70 between the ohmic contact layers 85 and 86.

Finally, as shown in FIGS. 34 and 35, an insulating material such as silicon nitride and silicon oxide, and a photoresist layer having good light absorption properties such as black resin are deposited on a passivation layer 100 and a colored organic layer 130. Next, the colored organic layer 130 is exposed to light and developed through a photolithography process using a fifth mask, and the passivation layer 100 is patterned by using the developed organic layer 130 as an etch mask. Here, the colored organic layer 130 blocks the light incident to the semiconductor layer 70 of the thin film transistor, and may be formed with diverse shapes to block the light leakage at the neighborhood of the gate wire and the data wire, will be described referring to a drawing. Furthermore, the colored organic layer 130 may be used as a spacer maintaining the interval between the lower substrate 10 and the upper substrate 200 by controlling the height of the colored organic layer 130, like the third example.

In the method manufacturing the thin film transistor according to the fifth example, by forming the organic insulating layer 40 before forming the semiconductor layer 70, but the thin film transistor array panel is manufactured through a photolithography process using five masks, the gate wire parts 52, 54 and 56 has a single-layered structure. Accordingly, the manufacturing method may be simpler than the third example.

Furthermore, when forming contact holes 41, 42, 44 and 48 of the organic insulating layer 40 before forming the gate insulating layer 60, the semiconductor layer 70 and the ohmic contact layer 85 and 86, an electrostatic discharge protection wires may be formed of the same layer as the gate wire and the data wire, and the electrostatic discharge protection wire such as 2G-3D and 2G-2D structures may be connected to each other without additional steps. 2G-2D and 2G-3D structures mean that the electrostatic discharge protection wires includes shorting lines, which are formed of the same layer as the gate wire and the data wire, electrically connecting the gate wires 52, 54 and 56, and the data wires 91, 92 and 98 to each other to discharge static electricity generated during the manufacturing process.

Furthermore, the manufacturing method according to the fifth embodiment may add a microcrystallized amorphous silicon or a silicide metal layer to reduce contact resistance the ohmic contact layers 85 and 86, and the source and drain ITO electrodes 111 and 113, like the third example.

When outsourcing the substrate having color filters covered by the organic insulating layer 40, because the number of masks used to complete the thin film transistor array panel in the remaining manufacturing process are equal, the manufacturing method according to the fourth example may be more advantageous than that according the third example.

On the other hand, in the method for manufacturing a thin film transistor, the gate insulating layer 60 needs to be formed by depositing silicon nitride in the range of over 300° C. to obtain good characteristics of thin film transistor. However, the color filters 31, 32, and 33 can only tolerate the temperature about 250° C. If the gate insulating 60 covering the color filters 31, 32 and 33 is formed in the range of over 300° C., the characteristics of the color filters 31, 32 and 33 are deteriorated. If the gate insulating layer 60 covering the color filters 31, 32 and 33 is formed in the range of less than 250° C., because the density of the gate insulating layer 30 is decreased, the characteristic of thin film transistor is deteriorated due to the declination of the interface characteristics between the gate insulating layer 60 and the semiconductor layer 70 of thin film transistor.

To solve this problem in the present invention, the invention may form a gate insulating layer having double-layered structure including a lower insulating layer fabricated at a low temperature and an upper insulating layer fabricated at a high temperature, or a double-layered semiconductor layer on the insulating layer fabricated at a low temperature.

Firstly, the transmittance of color filters according to the process temperature will be described in detail.

Figure 41:
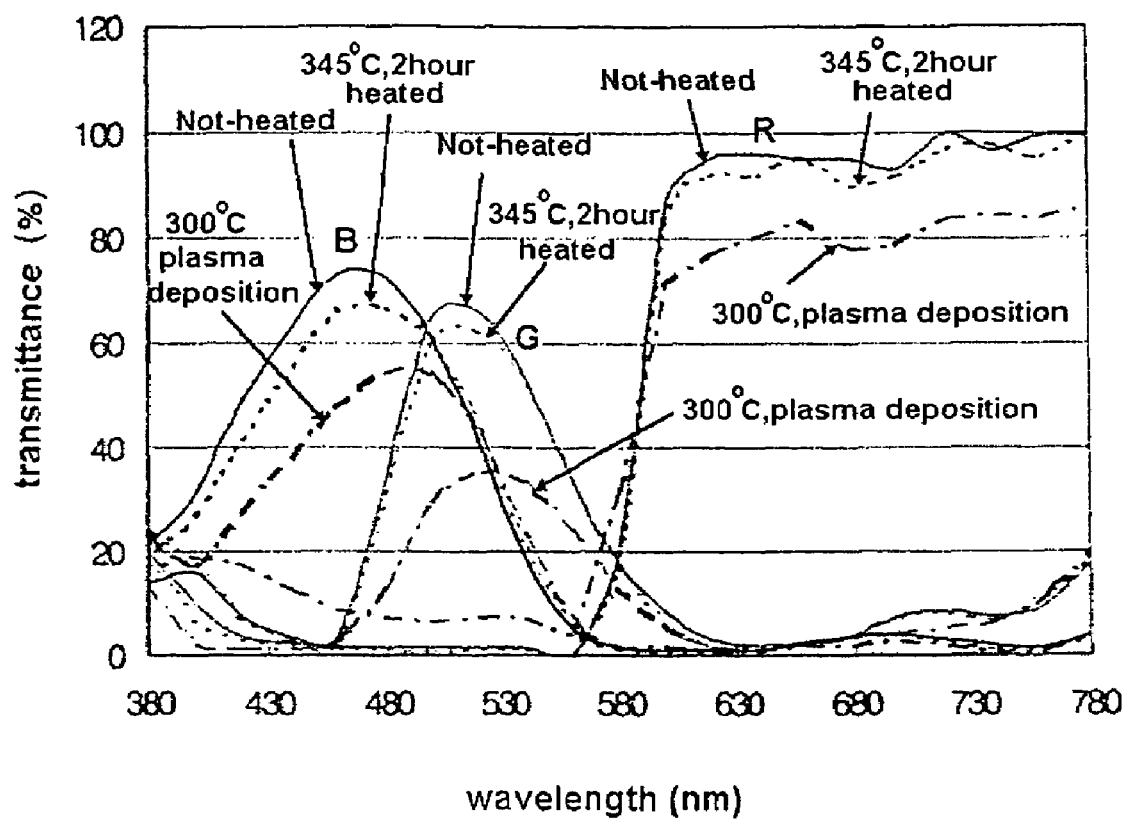
FIG. 41 is a photograph showing a variation of the transmittance percentage depending on the process condition of color filters.

FIG. 41 is a photograph showing a variation of the transmittance percentage depending on the process condition of color filters. Here, solid lines show the transmittances of red, green blue color filters, which are not heated, dot lines show the transmittances of red, green blue color filters, which are heated in the range of about 345° C. during 2 hours and cooled down, and dashed lines show the transmittances of red, green blue color filters after depositing the silicon nitride in the range of about 300° C. during 40 minutes through plasma.

Figure 42A:
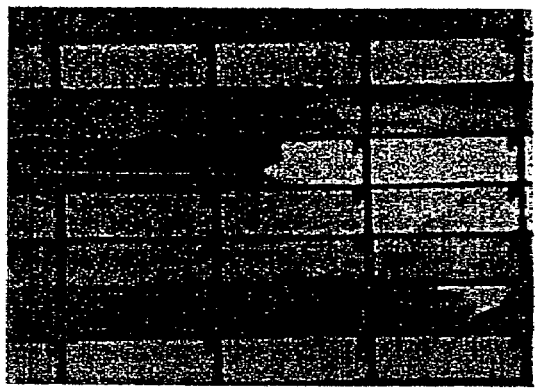
FIGS. 42A and 42B are photographs showing the surfaces of color filters according to whether silicon layer is deposited or not in a method for manufacturing a thin film transistor array panel according to an embodiment of the present invention.
Figure 42B:
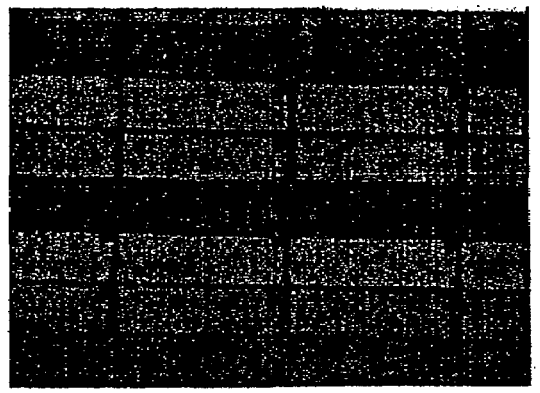

As shown in FIG. 41, the transmittance of light is hardly affected, when red, green blue color filters are heated in the range of about 345° C. during 2 hours and cooled down. However, the transmittances of red, green blue color filters is dramatically deteriorated, when depositing the silicon nitride of a gate insulating layer in the range of about 300° C. during 40 minutes through plasma. At this time, the particles of resin of color filters is observed to sublimate after 10 minutes of plasma deposition FIGS. 42A and 42B are a photograph showing the surfaces of color filters according to whether silicon nitride layer is deposited or not. FIG. 42A is a photograph showing the surfaces of color filters after plasma depositing the silicon nitride for 40 minutes, and FIG. 42B is a photograph showing the surfaces of color filters after simply heating the color filters.

As shown in FIGS. 42A and 42B, the decoloration of the surface of color filters is measured by deterioration of the silicon nitride layer due to sublimation of the particles of resin of color filters when plasma depositing the silicon nitride of a gate insulating layer in the range of about 300° C. during 40. Here, if a thin film having impermeable properties such as the silicon nitride layer is formed on color filters, it is observed that the thin film covering color filters is deteriorated due to the steam pressure.

Next, characteristics of TFT depending on the deposition temperature will be described in detail.

Figure 43:
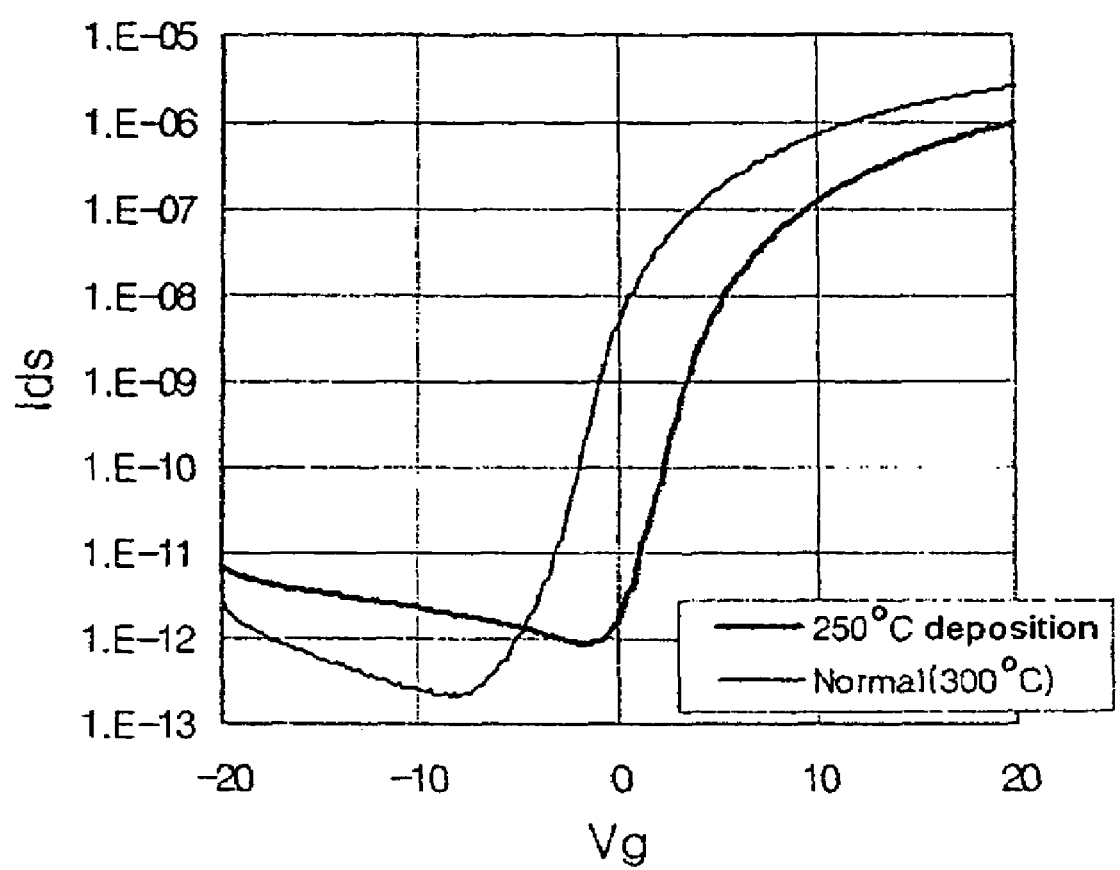
FIG. 43 is a graph showing characteristics of TFT depending on deposition temperature according to an embodiment of the present invention.

FIG. 43 is a graph showing the characteristics of TFT depending on deposition temperature according to an embodiment of the present invention.

As shown in FIG. 43, it is measured that off current of the TFT having a gate insulating layer deposited about 250° C.

increases and threshold voltage of TFT has also changed, when compared with the TFT having a gate insulating layer deposited about 300° C.

To solve this problem, the first method is that a gate insulating layer is formed to have a double-layered structure including a lower insulating layer of low temperature less than 250° C. to prevent damaging the color filters and an upper insulating layer of high temperature about 300° C., which is in contact with a semiconductor layer is formed. This will be described with reference to the drawings. At this time, the upper insulating layer is deposited for less than 5 minutes to prevent the particles of resin of color filters from sublimating.

Figure 44:
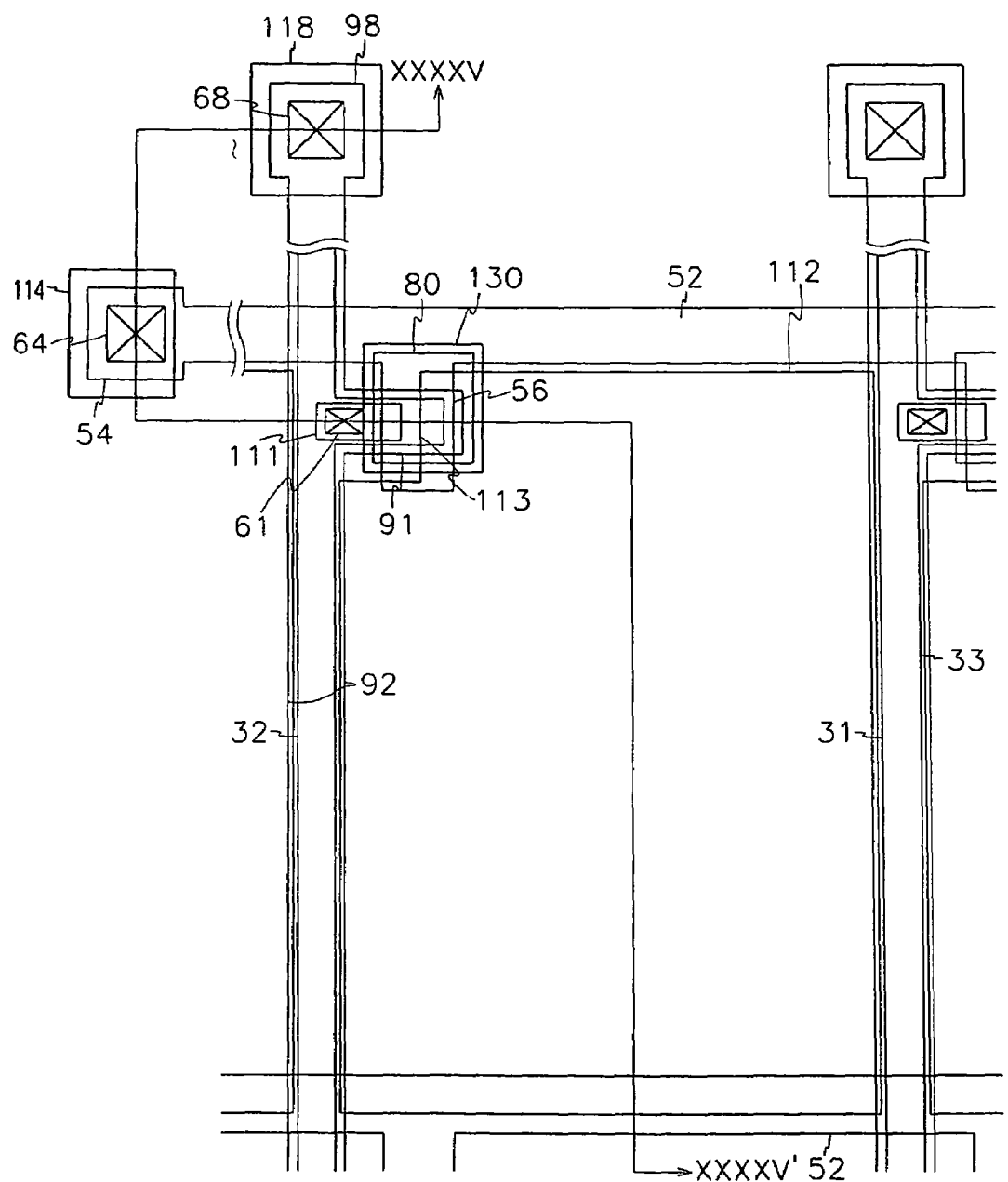
FIG. 44 is a layout view of a TFT array panel for an LCD according to a sixth example of the present invention.
Figure 45:
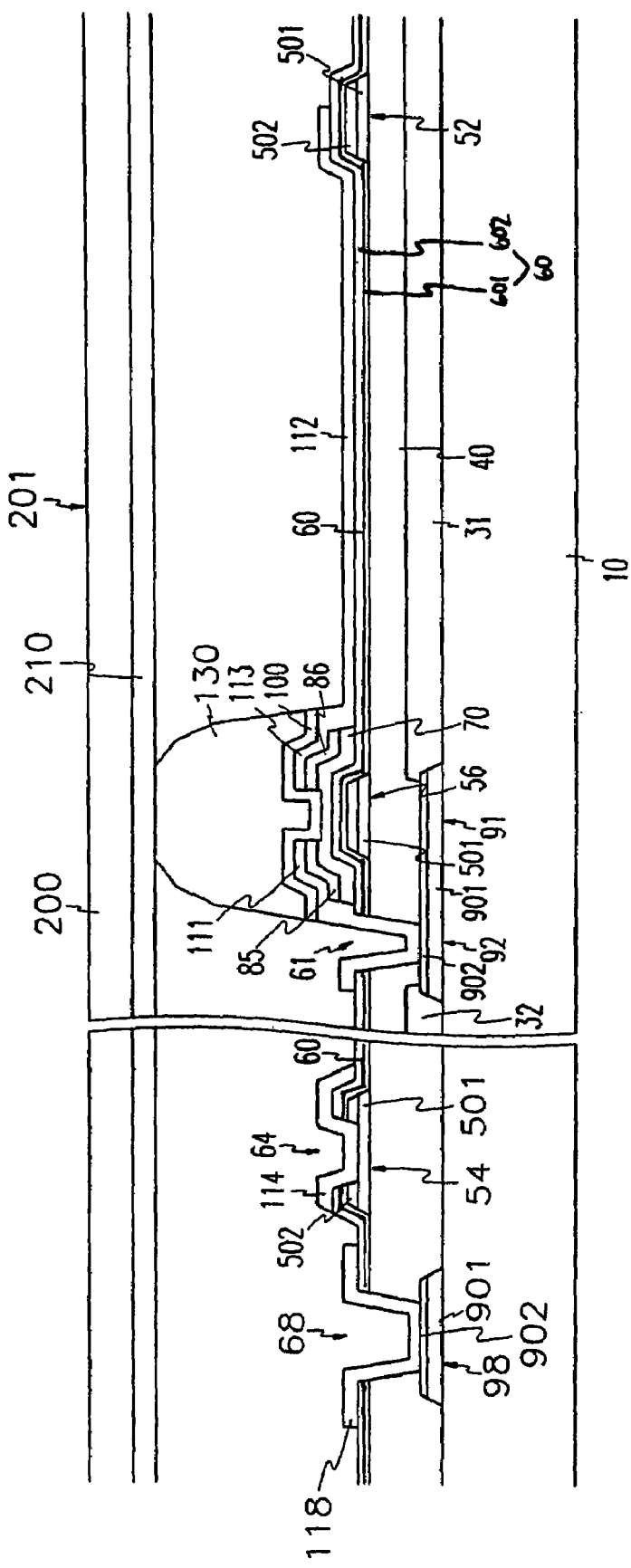
FIG. 45 is cross-sectional view taken along the line XXXXV-XXXXV' of FIG. 44.

FIG. 44 is a layout view of a TFT array panel for an LCD according to the sixth example of the present invention, and FIG. 45 is cross-sectional view taken along the line XXXXV-XXXXV' of FIG. 44.

As shown in FIGS. 44 and 45, most of the thin film transistor array panel according to the sixth example, and the method for manufacturing the same are the same as those according to the third example.

However, a gate insulating layer 60 including a lower insulating layer 601 and an upper insulating layer 602 covering a gate wire 52, 54 and 56, and an organic insulating layer 40 is formed. At this time, it is desirable that the lower insulating layer 601 is made of organic insulating material, amorphous silicon nitride or amorphous silicon oxide, has an enough thickness to obtain insulation characteristic, and is deposited at low temperature of less than 250° C. to prevent color filters damage. Also, it is desirable that the upper insulating layer 602 is deposited to a thickness of 500-1,000 Å at the temperature in the range of over 300° C. for a short period of about 5 minutes before the particles of resin of color filters are sublimated, in order to obtain a good interface that contacts with a semiconductor layer 70.

Here, the lower insulating layer 601 and the upper insulating layer 602 may be deposited in separate processes, and the upper insulating layer 602, the semiconductor layer 70 and an ohmic contact layer 80 may be deposited in a continuous process of in-situ.

The second method to solve above described problems is that a gate insulating layer is formed through a low-temperature deposition, a semiconductor layer including a lower semiconductor layer on the gate insulating layer and an upper semiconductor layer having a lower band gap than that of the lower semiconductor layer, is formed. It will be described in detail with reference to the drawings.

Figure 46:
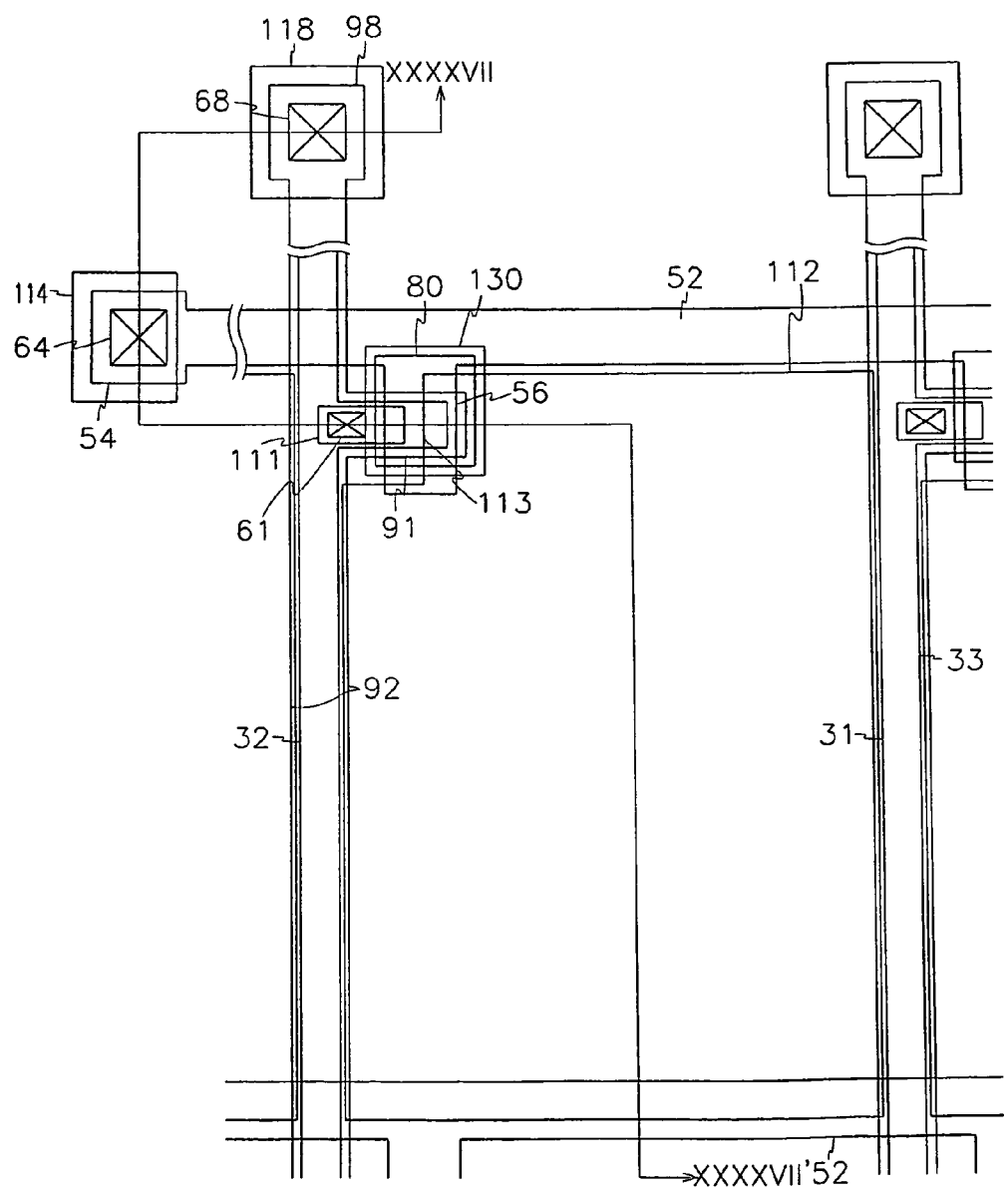
FIG. 46 is a layout view of a TFT array panel for an LCD according to a seventh example of the present invention.

FIG. 46 is a layout view of a TFT array panel for an LCD according to the seventh example of the present invention, and FIG. 47 is a cross-sectional view taken along the line XXXXVII-XXXXVII' of the FIG. 46.

As shown in FIGS. 46 and 47, most of the thin film transistor array panel according to the seventh example, and the method for manufacturing the same are the same as those according to the third example.

However, a gate insulating layer 60 covering a gate wire 52, 54 and 56 and made of insulating material such as organic insulator, amorphous silicon oxide and amorphous silicon nitride is formed through deposition process of low temperature on an organic insulating layer 40. A semiconductor layer 70 of double-layered structure is formed in an island shape on the gate insulating layer 60 of the gate electrode 56. The semiconductor layer 70 includes a lower semiconductor layer 701 made of amorphous silicon on the gate insulating layer 60 and an upper semiconductor layer 702 made of amorphous silicon and having a lower band gap than that of the lower semiconductor layer 701. The band gap of the lower semiconductor layer 701 of a thickness of 50-200 Å is in range of 1.9 to 2.1 eV, and the band gap of the upper semiconductor layer 702 of a thickness of 1,000-2,000 Å is in the range of 1.7 to 1.8 eV in this embodiment.

At this time, the lower and upper semiconductor layers 701 and 702 are formed by using raw gas of $SiH_4$, and additional material such as $CH_4$, $C_2H_2$, and $C_2H_6$ through such methods as chemical vapor deposition (CVD). For example, if $SiH_4$ and $CH_4$ at the rate of 1 to 9 are injected in CVD system, an amorphous silicon layer having a band gap of 2.0-2.3 eV and containing 50 percentage of carbon (C) may be formed. In this way, the band gap of the amorphous silicon layer may be controlled in the range of 1.7-2.5 eV according to the deposition process condition including the amount of carbon compound.

At this time, the gate insulating layer 60 fabricated at a low temperature, the lower semiconductor layer 701, the upper semiconductor layer 702 and a doped amorphous silicon layer 80 may be continuously deposited in the same CVD process system without interrupting the vacuum.

In the seventh example according to the present invention, the band gap difference between the lower semiconductor layer 701 and the upper semiconductor layer 702 makes an offset region. At this time, if TFT is on state, the channel of TFT is formed at the offset region between the lower semiconductor layer 701 and the upper semiconductor layer 702. The same atom structure in the offset region of TFT causes few defects and results in good TFT characteristics.

This present invention may be used in thin film transistor array panel of diverse type as well as this embodiment, because the thin film transistor array panel is manufactured at a low temperature below 300.degree. C. For example, this present invention may be used to manufacture the thin film transistor array panels using a plastic substrate, which is endurable against impacts, and carries low weight.

In embodiments of thin film transistor array panels according to the present invention, by forming an alignment key when forming a black matrix or color filters, plurality of thin films, which are formed later, may be correctly aligned. Also, by forming the color filters or the black matrix before forming the thin film transistor, and an organic insulating layer between a data line and a pixel electrode, an aperture ratio may be improved. The data wires, the ohmic contact layer patterns and the semiconductor patterns are formed through a photolithography process using one mask. Also, by forming a common wire and plurality of pads on the same layer as the black matrix, the delay of common signal may be minimized. And, by forming wires made of conductive material having a low resistivity, the characteristics of display device may be improved in large scale LCDs. Also, because the color filters and the thin film transistor are formed through different manufacturing process system, the process efficiency may be maximized.

Furthermore, by using the wires as a black matrix and by forming together a semiconductor layer and contact holes, the manufacturing cost may be minimized. Also, by ensuring the insulation between the data wire, and the pixel electrode and a gate wires, the parasitic capacitance generated therebetween may be minimized. Also, by forming a light blocking layer on/under the thin film transistor, a light leakage current may be minimized. And the minimized gate electrode size may minimize the parasitic capacitance generated in the TFT, which may improve the characteristics of display device in large scale LCDs. Also, by forming a gate insulating layer or a semiconductor layer having a double-layered structure, good TFT characteristics may be obtained under the low temperature process.

Furthermore, by forming the color filters and the black matrix on the lower substrate, the thickness of an upper substrate may be minimized, and glass substrates may be replaced by plastic substrates. Also by forming the TFT array panel by a low temperature process, the lower substrates may be replaced by a plastic substrate.

In the drawings and specification, there have been disclosed typical preferred embodiments of the present invention and, although specific terms are employed, they are used in a generic and descriptive sense only and not for purposes of limitation, the scope of the invention being set forth in the following claims.

What is claimed is:

1. A thin film transistor array panel for a liquid crystal display comprising:
    a substrate;
    a color filter on the substrate;
    a gate line formed on the substrate;
    a data line formed on the substrate and insulated from the gate line;
    a thin film transistor formed on the substrate and connected to the gate line and the data line;
    a pixel electrode connected to the thin film transistor;
    a black matrix on the substrate;
    a common wire formed with the same layer as the black matrix and comprising a common signal line and a common pad connected to the common signal line,
    wherein the color filter extends along the data line, and wherein the common pad transmits a common signal to the common signal line from an external circuit and the common signal line transmits the common signal to a common electrode opposing the pixel electrode.

2. The thin film transistor array panel of claim 1, wherein the black matrix has an opening on the pixel electrode.

3. The thin film transistor array panel of claim 2, further comprising an align key formed with the same layer as the black matrix or the color filter.

4. The thin film transistor array panel of claim 2, further comprising:
    a gate pad that is connected to a first external circuit, receives a gate signal from the first external circuit, and transmits the gate signal to the gate line; and
    a data pad that is connected to a second external circuit, receives a data signal from the second external circuit, and transmits the data signal to the data line,
    wherein the gate pad or the data pad are formed with the same layer as the black matrix.

5. The thin film transistor array panel of claim 4, further comprising:
    a redundant gate pad made of a same layer as the pixel electrode and connected to the gate pad; and
    a redundant data pad made of a same layer as the pixel electrode and connected to the data pad.

6. The thin film transistor array panel of claim 5, further comprising:
    a first insulator disposed between the black matrix and the gate line and having a contact hole to connect the gate pad to the gate line; and
    a second insulator disposed between the black matrix and the data line and having a contact hole to connect the data pad to the data line.

7. The thin film transistor array panel of claim 2, wherein an edge of the color filter overlaps the black matrix.

8. The thin film transistor array panel of claim 2, further comprising an organic insulating layer disposed on the black matrix and the color filter and under the gate line, the data line, the thin film transistor, and the pixel electrode.

* * * * *